(12) United States Patent
Huang et al.

(10) Patent No.: US 11,222,883 B2
(45) Date of Patent: Jan. 11, 2022

(54) PACKAGE STRUCTURE AND METHOD OF MANUFACTURING THE SAME

(71) Applicant: Taiwan Semiconductor Manufacturing Company, Ltd., Hsinchu (TW)

(72) Inventors: Shih-Ya Huang, Hsinchu (TW); Chung-Hao Tsai, Changhua County (TW); Chen-Hua Yu, Hsinchu (TW); Chuei-Tang Wang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/030,409

(22) Filed: Sep. 24, 2020

(65) Prior Publication Data

US 2021/0013191 A1 Jan. 14, 2021

Related U.S. Application Data

(63) Continuation of application No. 16/218,492, filed on Dec. 13, 2018, now Pat. No. 10,811,404.

(60) Provisional application No. 62/678,274, filed on May 31, 2018.

(51) Int. Cl.
| | |
|---|---|
| *H01L 21/768* | (2006.01) |
| *H01L 27/01* | (2006.01) |
| *H01L 23/498* | (2006.01) |
| *H01L 23/31* | (2006.01) |
| *H01L 23/00* | (2006.01) |
| *H01L 21/56* | (2006.01) |

(52) U.S. Cl.
CPC .......... *H01L 27/01* (2013.01); *H01L 21/565* (2013.01); *H01L 21/76816* (2013.01); *H01L 23/3121* (2013.01); *H01L 23/49827* (2013.01); *H01L 24/09* (2013.01); *H01L 2224/02372* (2013.01)

(58) Field of Classification Search
CPC ......... H01L 27/01; H01L 24/09; H01L 23/31; H01L 23/312; H01L 23/3121; H01L 23/49; H01L 23/498; H01L 23/4982; H01L 23/49827; H01L 21/56; H01L 21/565; H01L 21/76; H01L 21/768; H01L 21/7681; H01L 21/76816; H01L 2224/02372
USPC ....................................................... 257/692
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |

(Continued)

*Primary Examiner* — Monica D Harrison
(74) *Attorney, Agent, or Firm* — JCIPRNET

(57) ABSTRACT

Provided are a package structure and a method of manufacturing the same. The package structure includes a die, a first passive device, a plurality of through insulator vias (TIVs), an encapsulant, and a plurality of conductive connectors. The die has a front side and a backside opposite to each other. The first passive device is disposed aside the die. The TIVs are disposed between the die and the first passive device. The encapsulant laterally encapsulates the TIVs, the first passive device, and the die. The conductive connectors are disposed on the backside of the die, wherein the conductive connectors are electrically connected to the die and the first passive device by a plurality of solders.

20 Claims, 58 Drawing Sheets

(56) References Cited

U.S. PATENT DOCUMENTS

| | | |
|---|---|---|
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,256,192 B2 * | 4/2019 | Yi ........................ H01L 21/486 |

\* cited by examiner

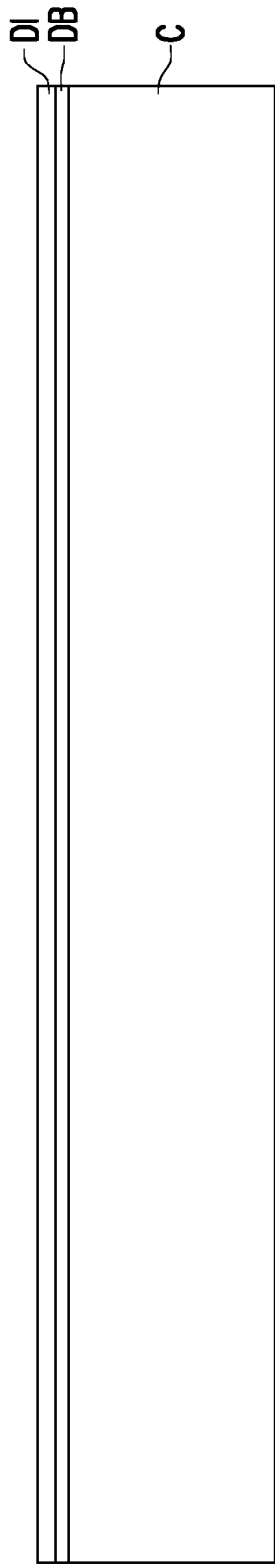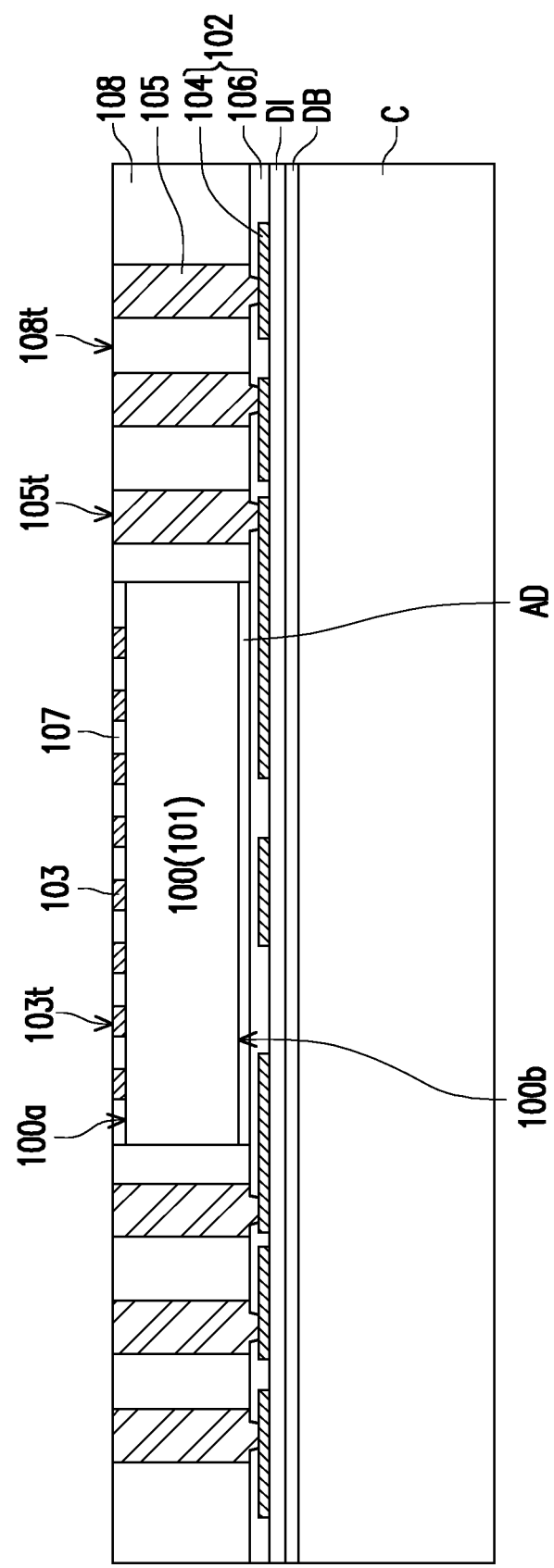

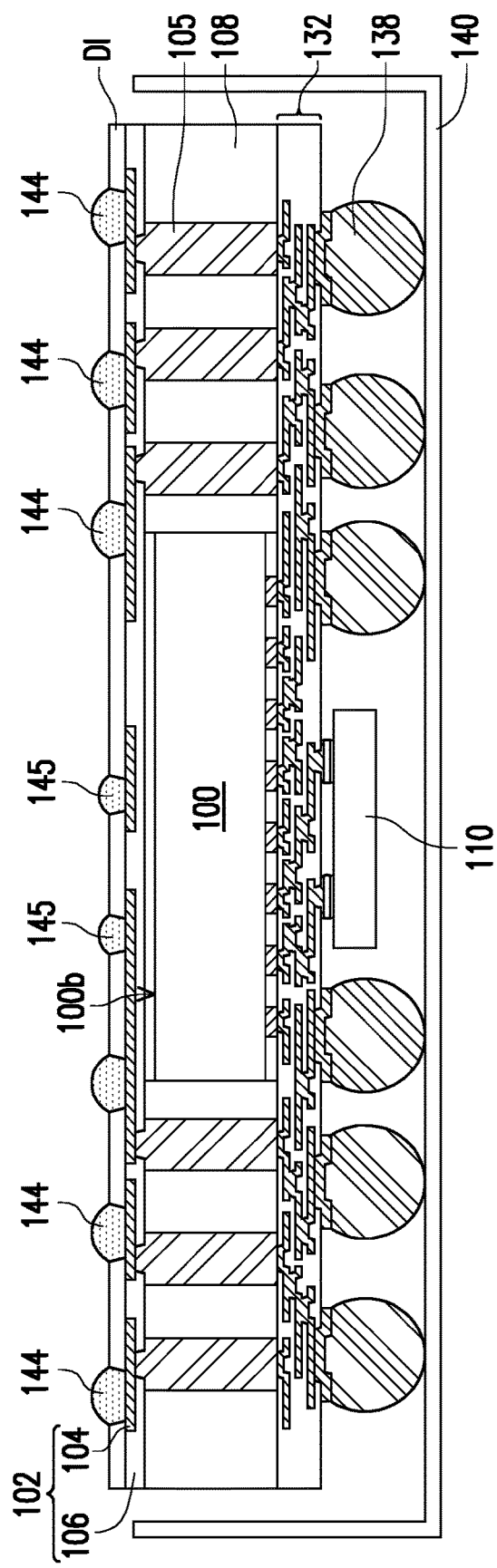
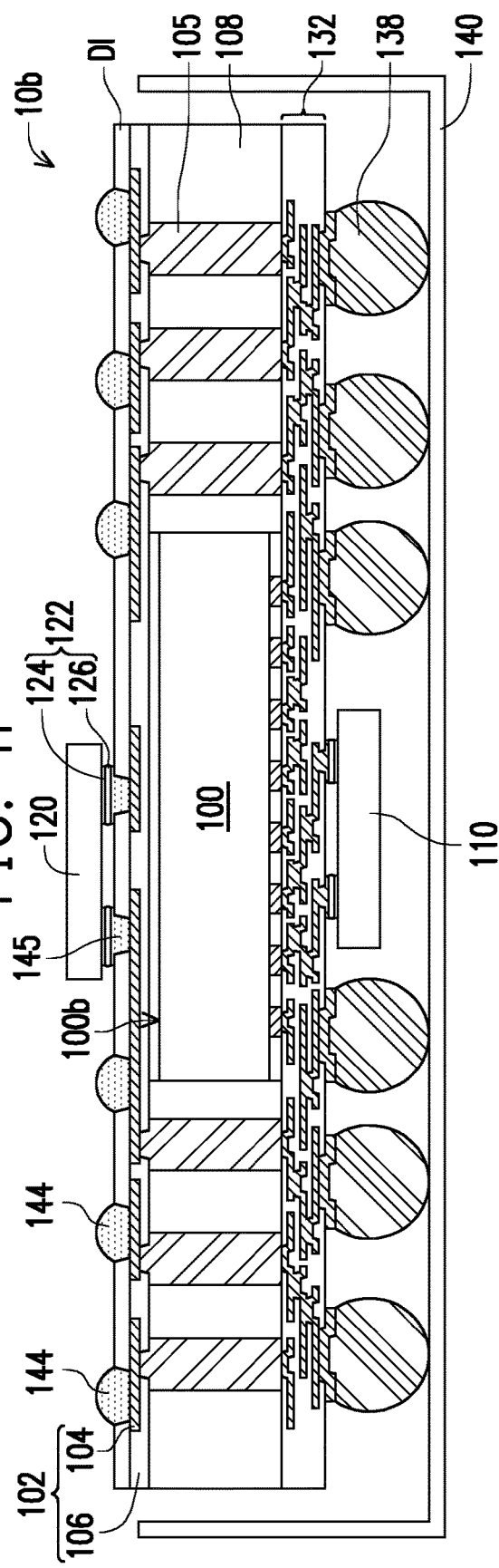
FIG. 1F
FIG. 1G

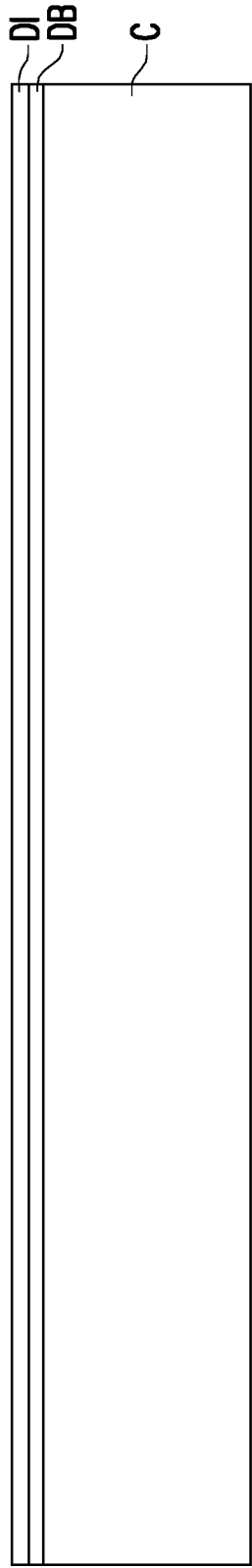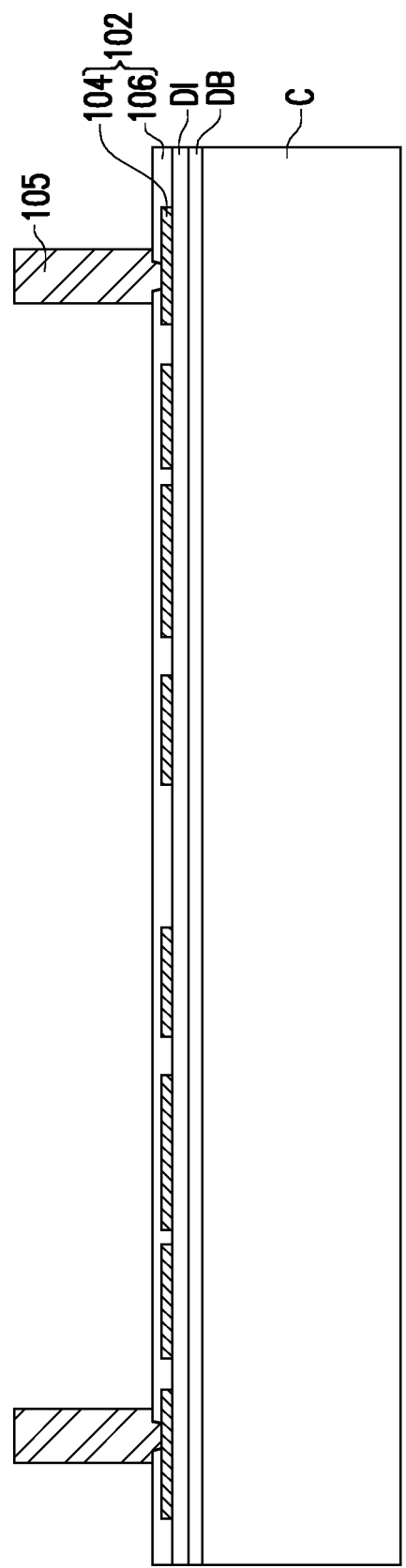

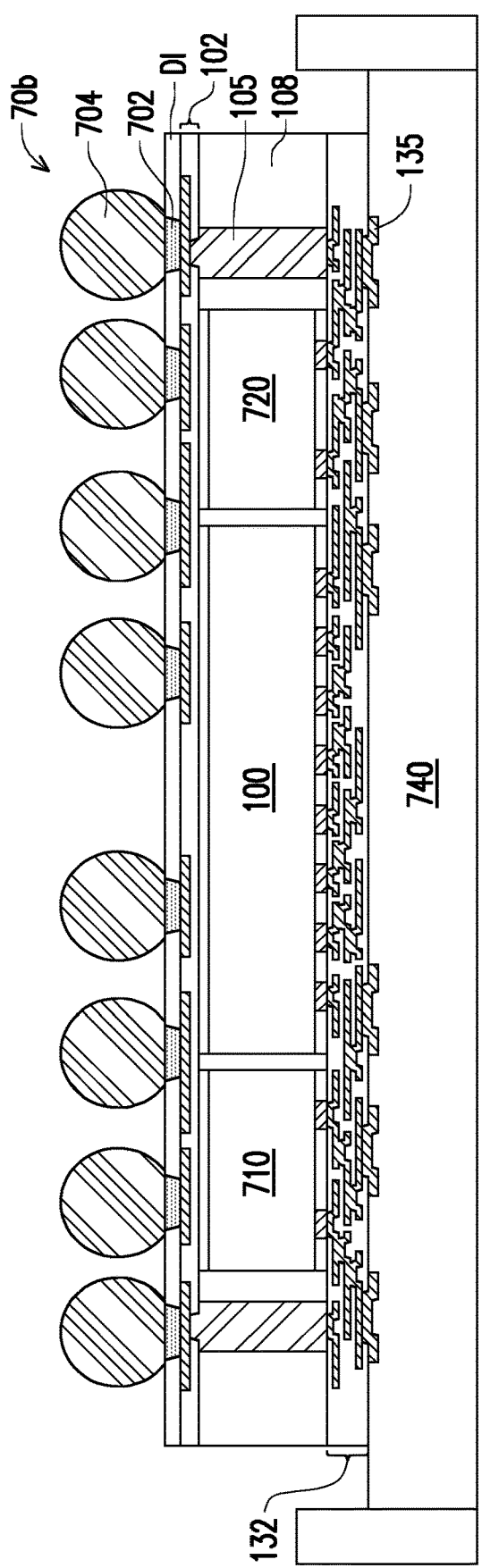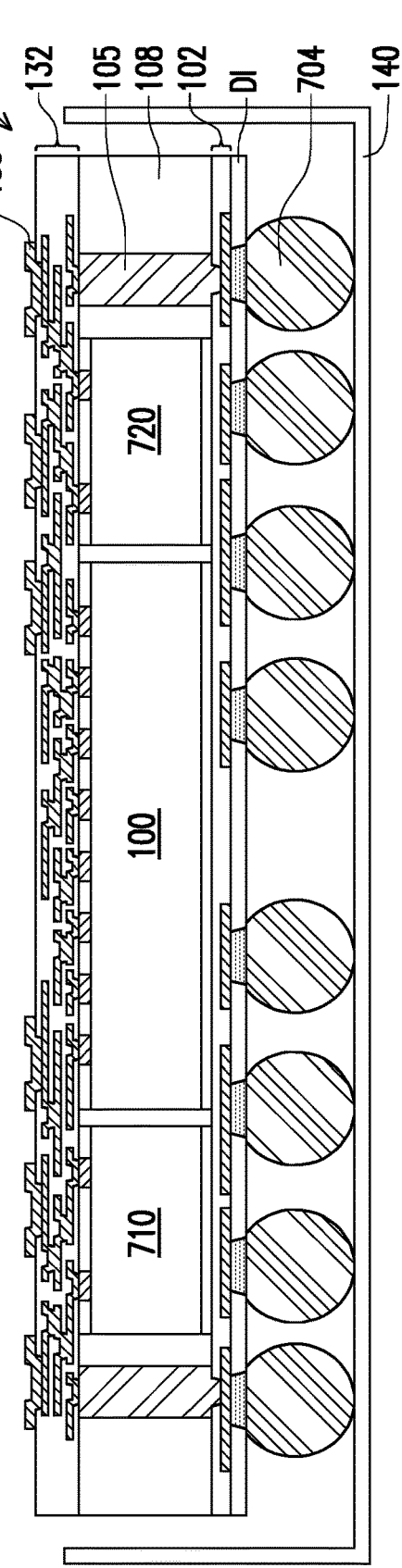
FIG. 7H
FIG. 7I

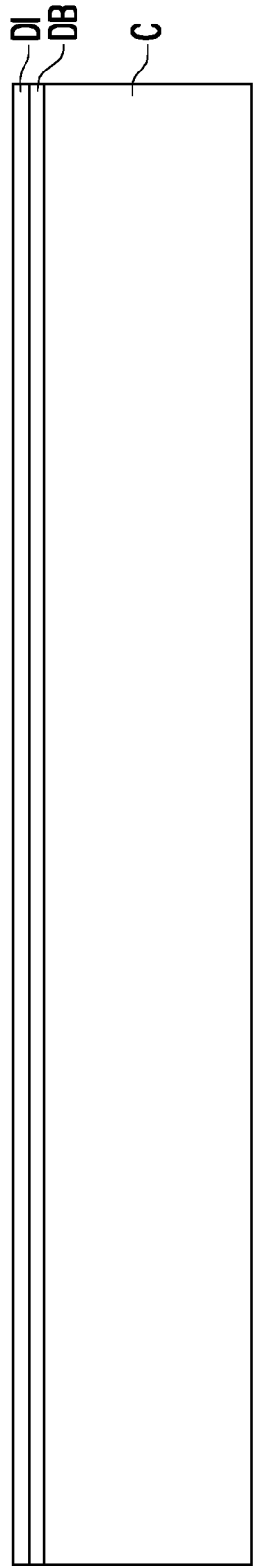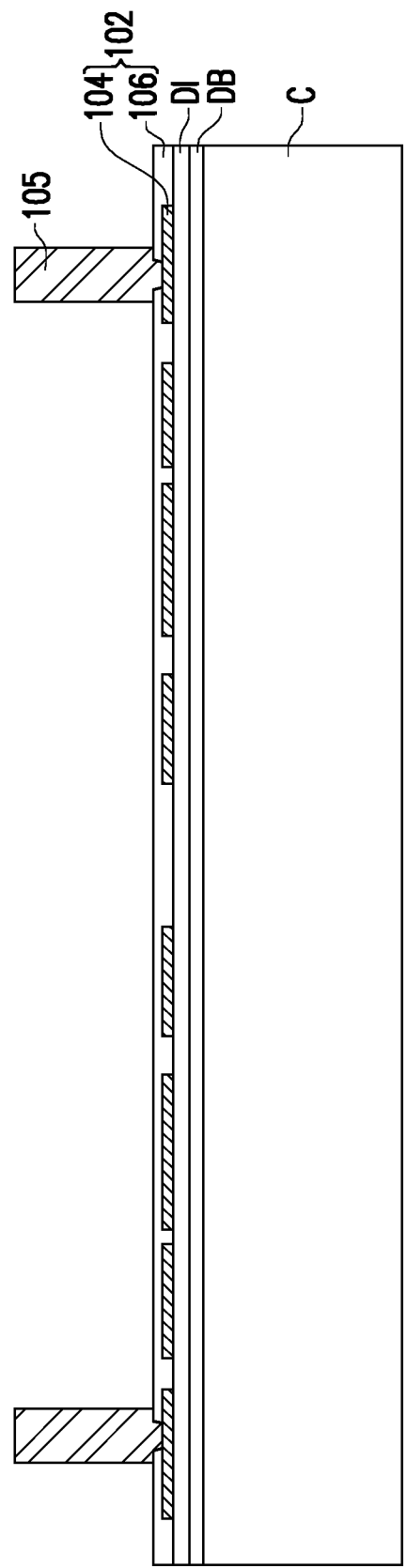
FIG. 8A
FIG. 8B

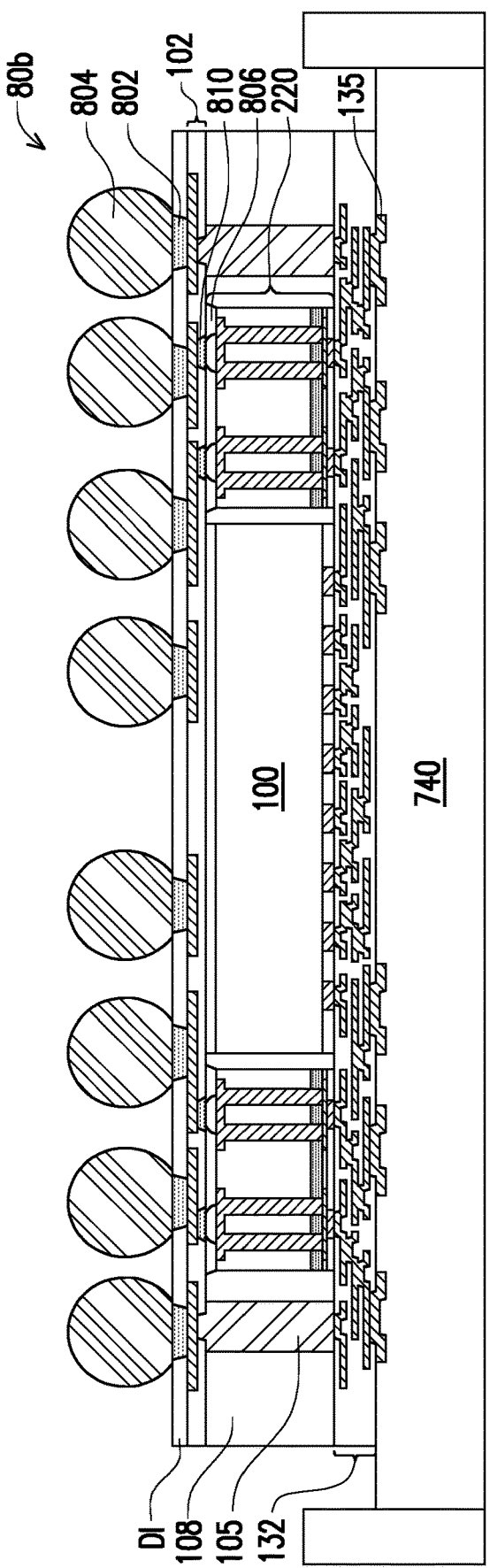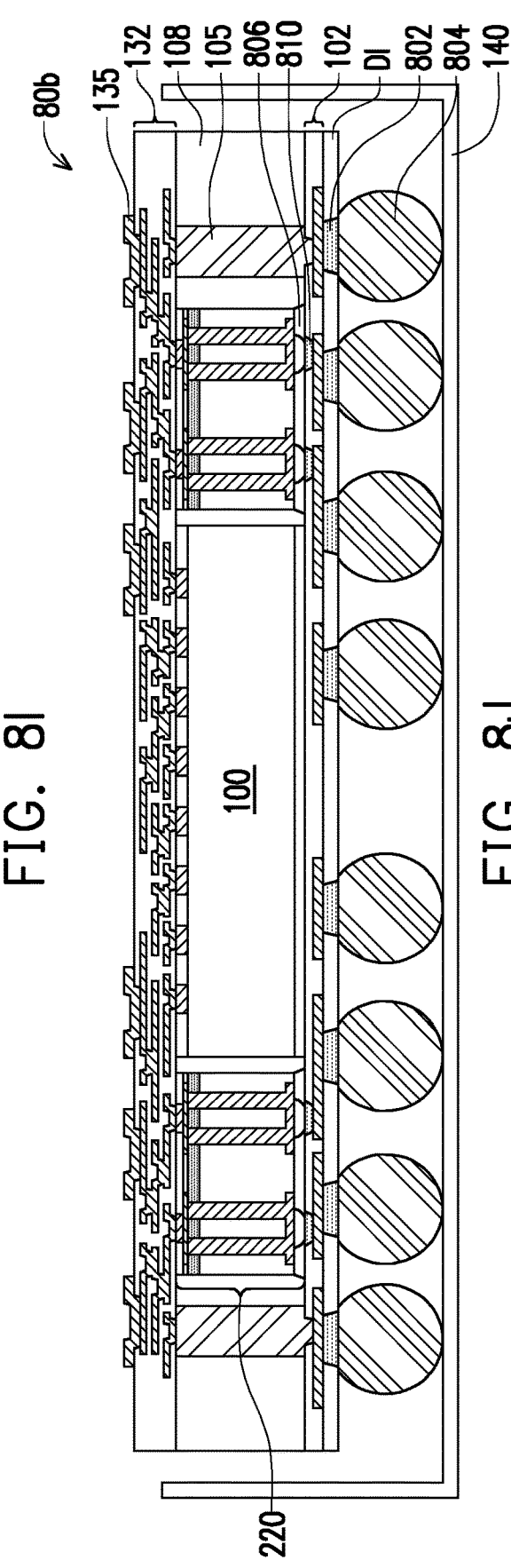

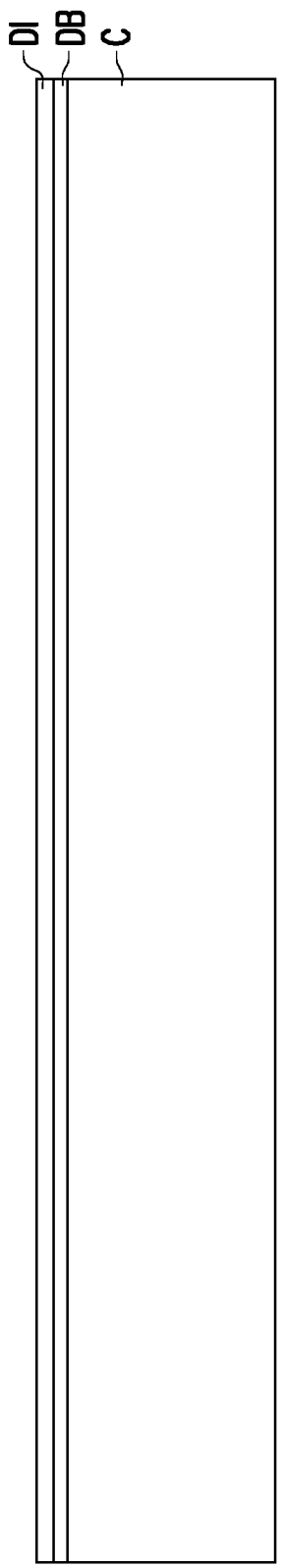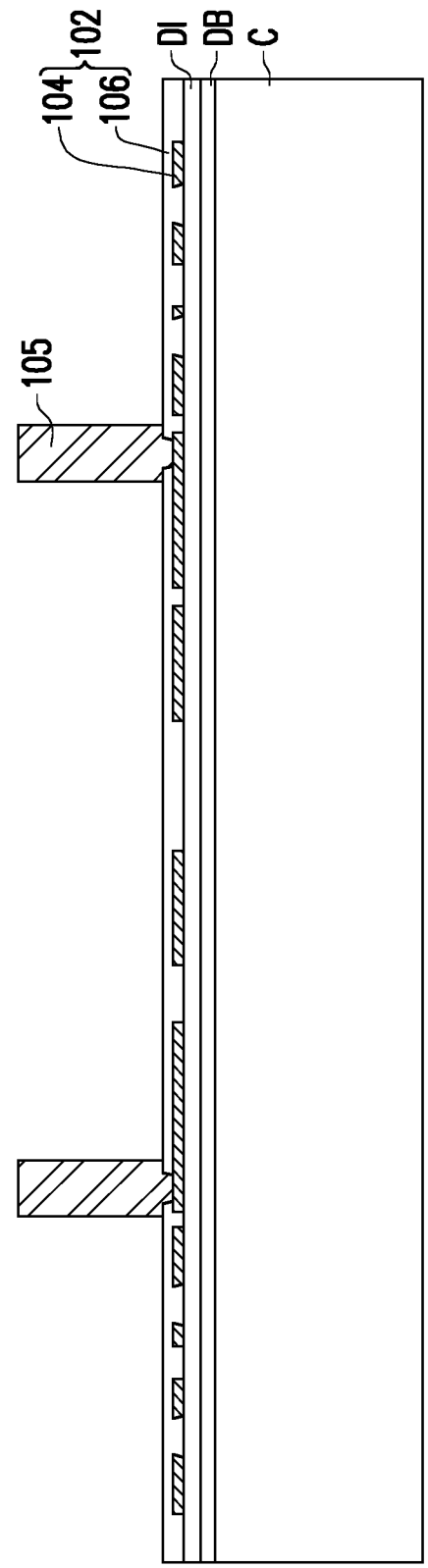

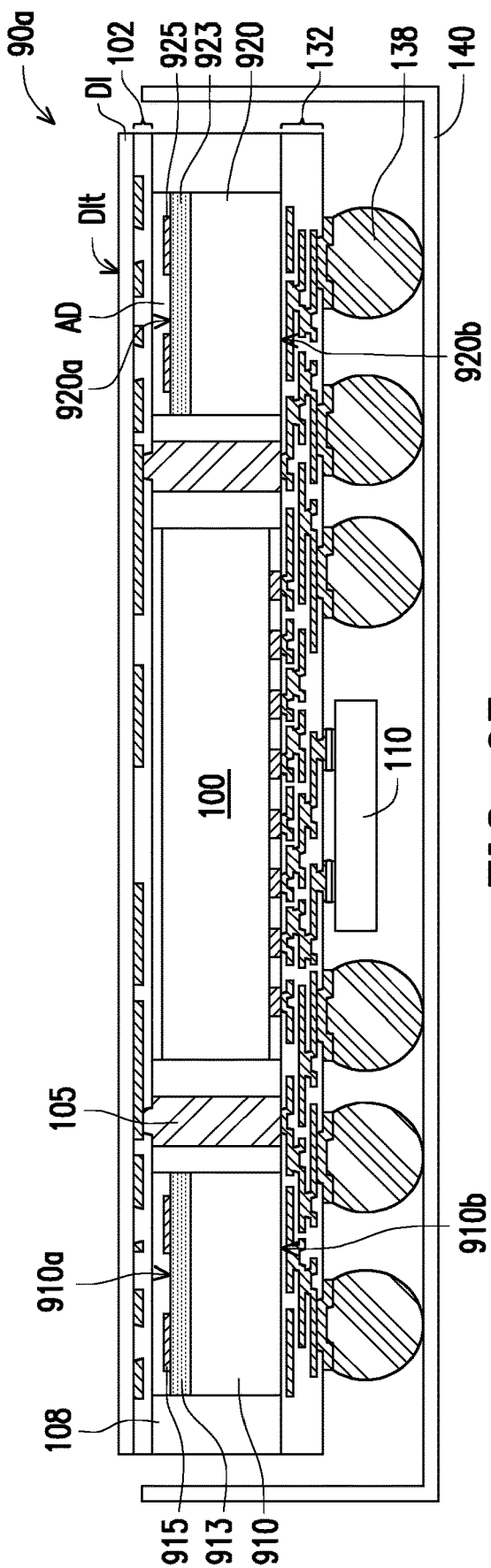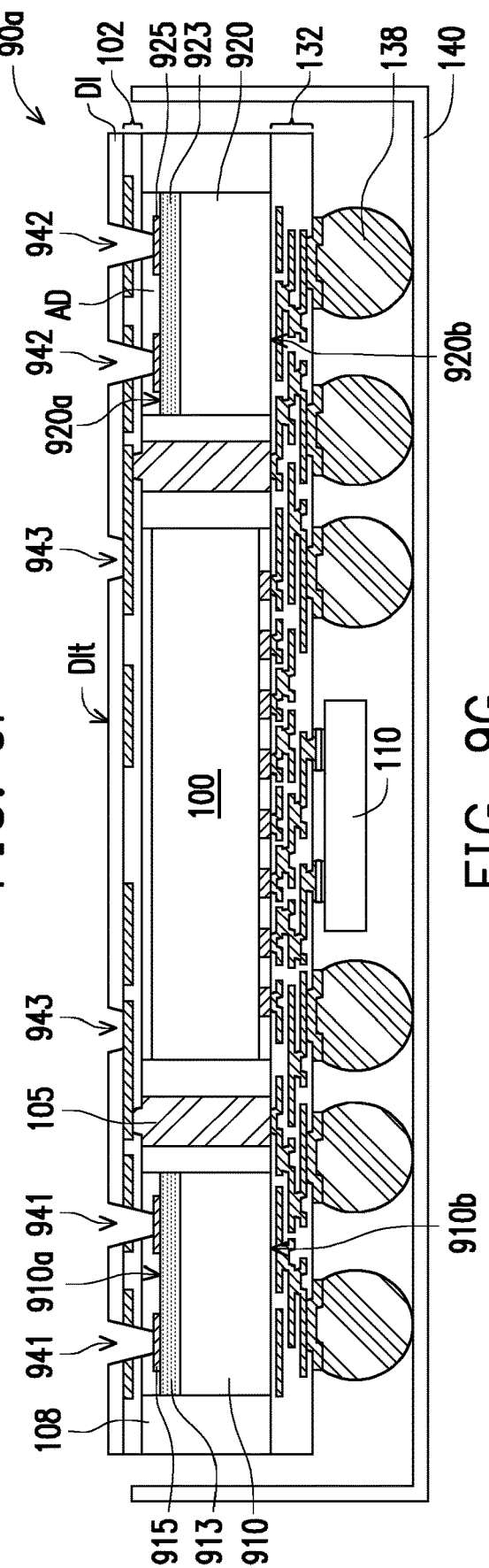

PACKAGE STRUCTURE AND METHOD OF MANUFACTURING THE SAME

CROSS-REFERENCE TO RELATED APPLICATION

This application is a continuation application of and claims the priority benefit of a prior application Ser. No. 16/218,492, filed on Dec. 13, 2018, now allowed. The prior application claims the priority benefit of U.S. provisional application Ser. No. 62/678,274, filed on May 31, 2018. The entirety of the above-mentioned patent application is hereby incorporated by reference herein and made a part of this specification.

BACKGROUND

A Power Distribution Network (hereinafter "PDN") delivers power and ground voltages from pad locations to all devices in an integrated circuit (hereinafter "IC"). With the continuous improvement of manufacturing the IC device technology, the portable electronic products require greater functionalities, higher performances, and lower costs in smaller and lighter formats. These requirements have been partly satisfied through major advances in the IC device technology and by the introduction of smaller packaging form factors, smaller discrete passive components, and high-density interconnection technologies. In the case, integrated passive devices (IPD) are becoming increasingly popular for their compactness.

However, there is still a need for improving the current IPD integration to meet various needs.

BRIEF DESCRIPTION OF THE DRAWINGS

FIG. 1A to FIG. 1I are schematic cross-sectional views illustrating a method of manufacturing a package structure according to a first embodiment of the disclosure.

FIG. 2A to FIG. 2I are schematic cross-sectional views illustrating a method of manufacturing a package structure according to a second embodiment of the disclosure.

FIG. 7A to FIG. 7K are schematic cross-sectional views illustrating a method of manufacturing a package structure according to a seventh embodiment of the disclosure.

FIG. 8A to FIG. 8L are schematic cross-sectional views illustrating a method of manufacturing a package structure according to an eighth embodiment of the disclosure.

FIG. 9A to FIG. 9J are schematic cross-sectional views illustrating a method of manufacturing a package structure according to a ninth embodiment of the disclosure.

DETAILED DESCRIPTION

Figure 1C:
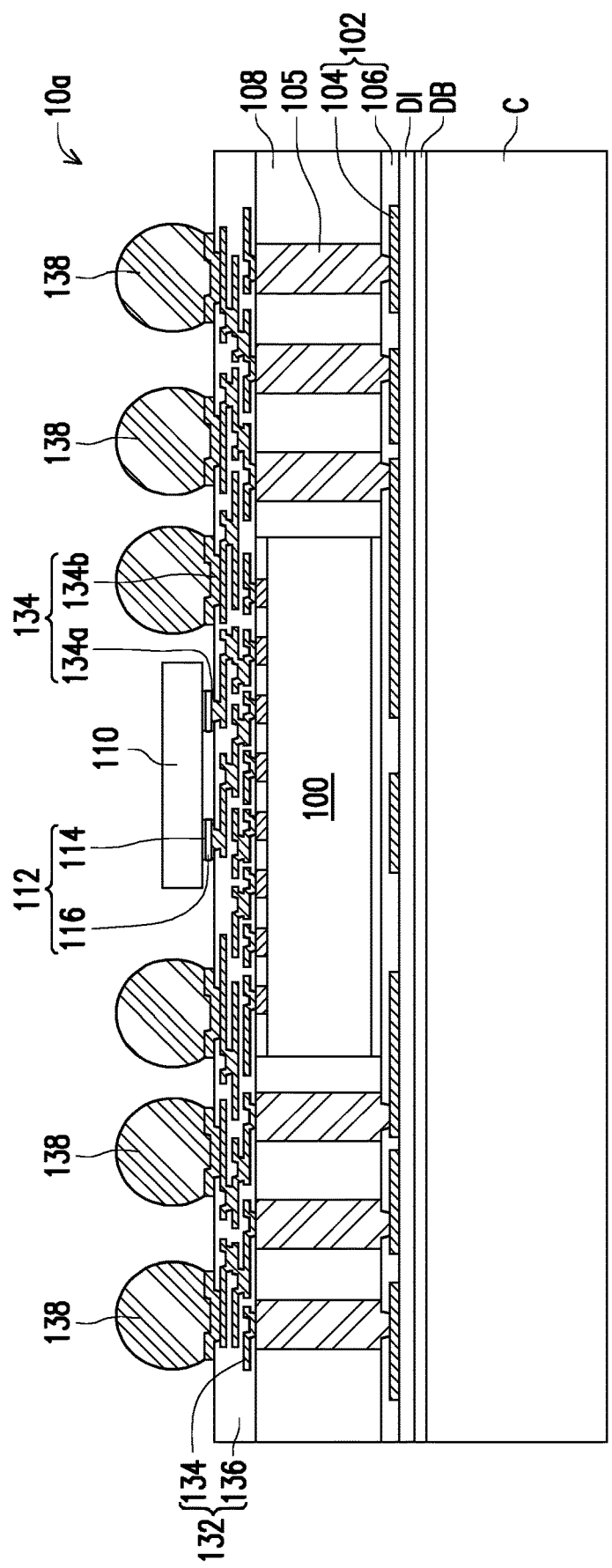

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG.s. The spatially relative terms are intended to encompass different orientations of the device in use or operation in addition to the orientation depicted in the FIG.s. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1I are schematic cross-sectional views illustrating a method of manufacturing a package structure according to a first embodiment of the disclosure.

Referring to FIG. 1A, a carrier C having a de-bonding layer DB and a dielectric layer DI formed thereon is provided, wherein the de-bonding layer DB is formed between the carrier C and the dielectric layer DI. In some embodiments, the carrier C is a glass substrate, the de-bonding layer DB is a light-to-heat conversion (LTHC) release layer formed on the glass substrate, and the dielectric layer DI is a photosensitive polybenzoxazole (PBO) or polyimide (PI) layer formed on the de-bonding layer DB, for example. In alternative embodiments, the de-bonding layer DB may be a photo-curable release film whose viscosity is decreased by photo-curing process or a thermal curable release film whose viscosity is decreased by thermal-curing process, and the dielectric layer DI may be made from other photosensitive or non-photosensitive dielectric materials.

Referring to FIG. 1B, a redistribution layer (RDL) structure 102 is formed on the dielectric layer DI. In detail, the RDL structure 102 may include a plurality of conductive features 104 embedded in a dielectric layer 106. The dielectric layer 106 may be a single layer or a multilayer structure, for example. In some embodiments, a material of the dielectric layer 106 includes an inorganic dielectric material, an organic dielectric material, or a combination thereof. The inorganic dielectric material is, for example, silicon oxide, silicon nitride, silicon oxynitride, or a combination thereof. The organic dielectric material may include polymer. The polymer includes a photosensitive material, a non-photosensitive material, or a combination thereof. In some embodiments, the photosensitive material includes polybenzoxazole (PBO), polyimide, benzocyclobutene (BCB), positive photoresist, negative photoresist, a combination thereof, and/or the like. The non-photosensitive material includes Ajinomoto buildup film (ABF). The dielectric layer 106 may be formed by chemical vapor deposition, spin coating, or lamination.

In some embodiments, the conductive features 104 includes a plurality of traces and vias (not shown) stacked alternately. The conductive features 104 is formed by following steps including forming a seed layer (not shown) on the dielectric layer DI by a CVD process or a PVD process (e.g., sputtering), forming a photoresist pattern (not shown) with a plurality of openings on the seed layer, forming a conductive material (not shown) in the openings by a plating process, and removing the photoresist pattern and the seed layer covered by the photoresist pattern. In the case, the conductive features 104 may include the conductive material and underlying seed layer. In some embodiments, the conductive features 104 may be made of conductive materials with low resistivity, such as copper (Cu), aluminum (Al), Cu alloys, Al alloys, or other suitable materials.

Although only one RDL structure 102 is illustrated in FIG. 1B, the embodiments of the present invention are not limited thereto. In some embodiments, one or more RDL structures are formed on the dielectric layer DI. That is, one or more dielectric layers and conductive features formed in the one or more dielectric layers are included in the RDL structure 102. However, the layout or the arrangement of the RDL structures is not limited by the embodiments described herein.

In FIG. 1B, after the RDL structure 102 is formed, a plurality of through insulator vias (TIVs) 105 are formed on and electrically connected to the RDL structure 102. In some embodiments, the TIVs 105 are formed by photolithography, plating, and photoresist stripping process. For example, the TIVs 105 include copper posts. The TIVs 105 may be formed by following steps including forming a seed layer (not shown) on the RDL structure 102 by a CVD process or a PVD process (e.g., sputtering), forming a photoresist pattern (not shown) with a plurality of openings on the seed layer, forming a conductive material (not shown) in the openings by a plating process, and removing the photoresist pattern and the seed layer covered by the photoresist pattern. In the case, the TIVs 105 may include the conductive material and underlying seed layer. In some alternative embodiments, the TIVs 105 are obtained by the manufacturer may be mounted on the RDL structure 102.

In FIG. 1B, after the TIVs 105 are formed, a die 100 is picked and placed on the RDL structure 102, so that the die 100 is surrounded by the TIVs 105. In some embodiments, the dies 100 may be or include a logic die, such as a central processing unit (CPU) die, a graphic processing unit (GPU) die, a micro control unit (MCU) die, an input-output (I/O) die, a baseband (BB) die, or an application processor (AP) die. In some embodiments, the die 100 includes a memory die such as high bandwidth memory (HBM) die. Although only one die 100 is illustrated in FIG. 1B, the embodiments of the present invention are not limited thereto. In alternative embodiments, one or more dies are placed on the RDL structure 102.

In detail, the die 100 includes a front side (or an active surface) 100a and the backside 100b opposite to each other. Herein, the front side 100a of the die 100 is referred to as a top surface of a substrate 101. The front side 100a of the die 100 faces up and the backside 100b of the die 100 faces forward the RDL structure 102. In some embodiments, the backside 100b of the die 100 is adhered on the RDL structure 102 through an adhesive layer AD such as a die attach film (DAF), silver paste, or the like. In the case, the backside 100b of the die 100 is in contact with the adhesive layer AD, so that the adhesive layer AD is disposed between the die 100 and the RDL structure 102.

In FIG. 1B, the die 100 may include the substrate 101, a plurality of contacts 103, and a passivation layer 107. The contacts 103 are formed on the top surface 100a of the substrate 101. The passivation layer 107 is formed to laterally surround the contacts 103. In some embodiments, the substrate 101 may be made of silicon or other semiconductor materials. Alternatively, or additionally, the substrate 101 may include other elementary semiconductor materials such as germanium. In some embodiments, the substrate 101 is made of a compound semiconductor such as silicon carbide, gallium arsenic, indium arsenide or indium phosphide. In some embodiments, the substrate 101 is made of an alloy semiconductor such as silicon germanium, silicon germanium carbide, gallium arsenic phosphide, or gallium indium phosphide. Furthermore, the substrate 101 may be a semiconductor on insulator such as silicon on insulator (SOI) or silicon on sapphire.

In some embodiments, the contacts 103 may be metal posts, such as copper post or the like. The passivation layer 107 may be a single layer or a multi-layered structure. In some embodiments, the passivation layer 107 includes an inorganic dielectric material, an organic dielectric material, or a combination thereof. The inorganic dielectric material is, for example, silicon oxide, silicon nitride, silicon oxynitride, or a combination thereof. The organic dielectric material may include polymer. The polymer includes polybenzoxazole (PBO), polyimide, benzocyclobutene (BCB), positive photoresist, negative photoresist, a combination thereof, and/or the like.

After the die 100 is placed on the RDL structure 102, an encapsulant 108 is formed to laterally encapsulate the die 100 and the TIVs 105. In some embodiments, the encapsulant 108 includes a molding compound, a molding underfill, a resin (such as an epoxy resin), or a combination thereof, or the like. The encapsulant 108 may be formed by a sequence of an over-molding process and a planarizing process. For example, an encapsulation material (not shown) is formed over the carrier C to fill in the gaps between the die 100 and TIVs 105 and encapsulate the die 100 and the TIVs 105. In addition, the encapsulation material further covers the top surfaces of the die 100 and the TIVs 105. The planarizing process is performed on the encapsulation material until top surfaces 103t of the contacts 103 and top surfaces 105t of the TIVs 105 are exposed. In the case, the top surface 103t of the contacts 103, the top surfaces 105t of the TIVs 105, and a top surface 108t of the encapsulant 108 are coplanar after performing the planarizing process. In some embodiments, the planarizing process includes a mechanical grinding process and/or a chemical mechanical polishing (CMP) process.

Referring to FIG. 1C, a RDL structure 132 is formed on the die 100, the TIVs 105 and the encapsulant 108. The RDL structure 132 is electrically connected to the die 100 and the RDL structure 102 through the TIVs 105. In detail, the RDL structure 132 may include a plurality of conductive features 134 embedded in a dielectric layer 136. In some embodiments, the conductive features 134 include a plurality of traces and vias (not shown) stacked alternately. The material and forming method of the conductive features 134 and the dielectric layer 136 are similar to the material and forming method of the conductive features 104 and the dielectric layer 106 illustrated in above embodiments. Thus, details thereof are omitted here.

Herein, the RDL structure 132 is formed on the front side 100a of the die 100, thus, the RDL structure 132 is referred to as a front side RDL (FSRDL) structure. Similarly, the RDL structure 102 is formed on the backside 100b of the die 100, thus the RDL structure 102 is referred to as a backside RDL (BSRDL) structure. As shown in FIG. 1C, the die 100 is sandwiched between the BSRDL structure 102 and the FSRDL structure 132.

In FIG. 1C, the conductive features 134 of the RDL structure 132 may include topmost conductive features 134a and 134b exposed by the dielectric layer 136. In detail, the topmost conductive features 134a may be metal posts or metal pads for connecting to a first passive device 110. The topmost conductive features 134b may be referred as under-ball metallurgy (UBM) layer for mounting a plurality of conductive connectors 138.

After the RDL structure 132 is formed, the first passive device 110 is formed on the RDL structure 132 through the topmost conductive features 134a and connectors 112. As shown in FIG. 1C, the connectors 112 are micro-bumps containing copper posts 114 and solder caps 116, but the disclosure is not limited thereto, and other conductive structures such as solder bumps, gold bumps or metallic bumps may also be used as the connectors 112. A size of the connector 112 is less than a size of the conductive connectors 138. Herein, the term "size" is referred to the length, width, height, or area. For example, as shown in FIG. 1C, a width and/or a height of the connector 112 is less than a width and/or a height of the conductive connectors 138. In some embodiments, the first passive device 110 may be an integrated passive device (IPD), such as capacitors, resistors, inductors, baluns, couplers, splitters, filters, diplexers, or the like is able to be integrated in the IPD. Although only one first passive device 110 is illustrated in FIG. 1C, the embodiments of the present invention are not limited thereto. In alternative embodiments, one or more passive devices are placed on the RDL structure 132.

After the first passive device 110 is mounted on the RDL structure 132, the conductive connectors 138 (also referred to as conductive balls) are formed on the topmost conductive features 134b (e.g., the UBM layer). In some embodiments, the conductive connectors 138 are made of a conductive material with low resistivity, such as Sn, Pb, Ag, Cu, Ni, Bi or an alloy thereof, and are formed by a suitable process such as evaporation, plating, ball drop, screen printing, or a ball mounting process.

Figure 1D:
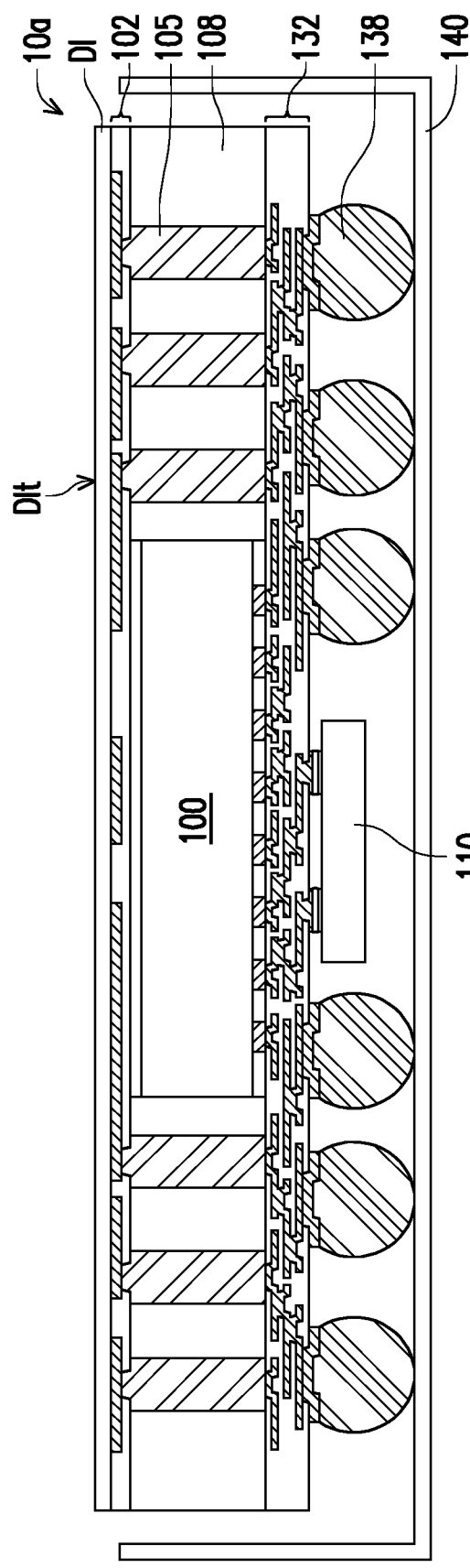

Referring to FIG. 1C and FIG. 1D, a structure 10a illustrated in FIG. 1C is flipped and mounted on the frame 140 by the conductive connectors 138. The carrier C and the de-bonding layer DB are detached from the structure 10a and then removed. In the case, as shown in FIG. 1D, a top surface DIt of the dielectric layer DI is exposed. In some embodiments, the de-bonding layer DB (e.g., the LTHC release layer) is irradiated with a UV laser so that the carrier C and the de-bonding layer DB are easily peeled off from the structure 10a. Nevertheless, the de-bonding process is not limited thereto, and other suitable de-bonding methods may be used in some alternative embodiments.

Figure 1E:
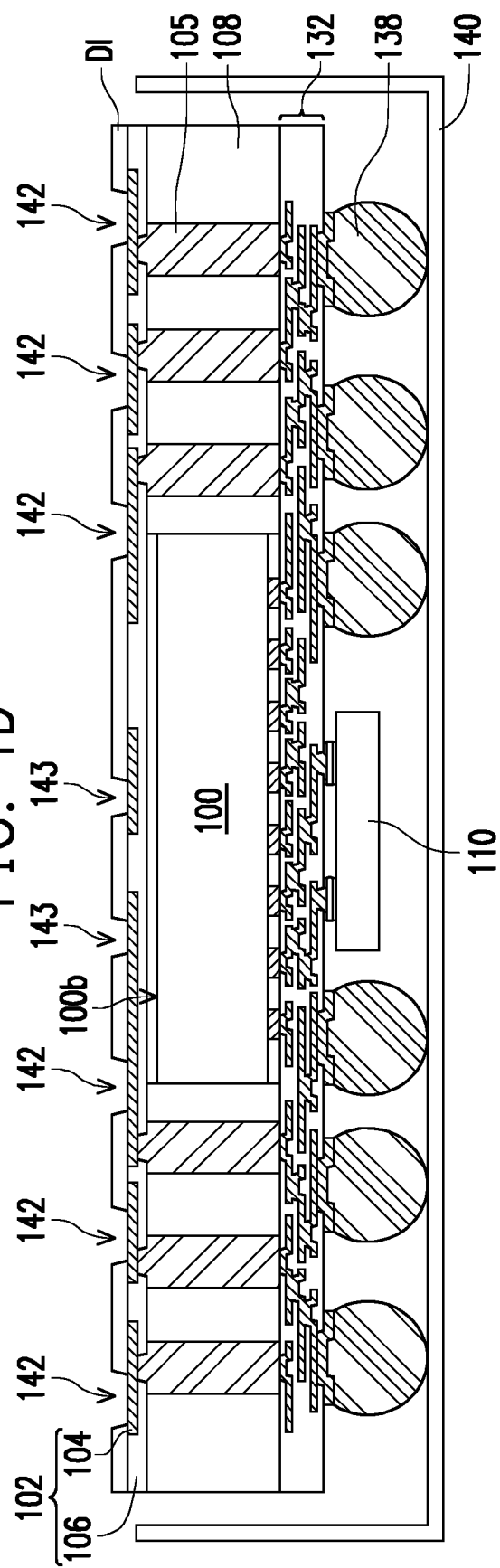

Referring to FIG. 1D and FIG. 1E, the dielectric layer DI is patterned to form a plurality of openings 142 and 143. In FIG. 1E, the openings 142 expose one portion of the conductive features 104 of the RDL structure 102, while the openings 143 expose another portion of the conductive features 104 of the RDL structure 102. The openings 143 are directly formed on the backside 100b of the die 100. The openings 142 are disposed aside the openings 143. In some embodiments, the openings 142 and 143 are formed by a laser drilling process or a photolithography and etching processes. In some alternative embodiments, widths of the openings 142 and 143 are different. In the embodiments, as shown in FIG. 1E, the width of the openings 142 is greater than the width of the openings 143.

Referring to FIGS. 1E and 1F, a plurality of solders 144 are respectively formed in the openings 142 to connect to the one portion of the conductive features 104 exposed by the openings 142. A plurality of solders 145 are respectively formed in the openings 143 to connect to the another portion of the conductive features 104 exposed by the openings 143. In some embodiments, the solders 144 are formed by a solder pasting or printing process, but the disclosure is not limited thereto. In some alternative embodiments, widths of the solders 144 and 145 are different. In the embodiments, as shown in FIG. 1F, the width of the solders 144 is greater than the width of the solders 145.

Referring to FIG. 1G, a second passive device 120 is flipped and mounted on the RDL structure 102 through connectors 122 and the solders 145. In some embodiments, the connectors 122 are micro-bumps containing copper posts 124 and solder caps 126, but the disclosure is not limited thereto, and other conductive structures such as solder bumps, gold bumps or metallic bumps may also be used as the connectors 122. In some embodiments, the second passive device 120 may be an integrated passive device (IPD), such as capacitors, resistors, inductors, baluns, couplers, splitters, filters, diplexers, or the like is able to be integrated in the IPD. In some alternative embodiments, the second passive device 120 and the first passive device 110 may perform the same function or different functions depending on the designer's need. Although only one second passive device 120 is illustrated in FIG. 1G, the embodiments of the present invention are not limited thereto. In alternative embodiments, one or more passive devices are placed on the RDL structure 102. As shown in FIG. 1G, a package 10b is accomplished.

Figure 1H:
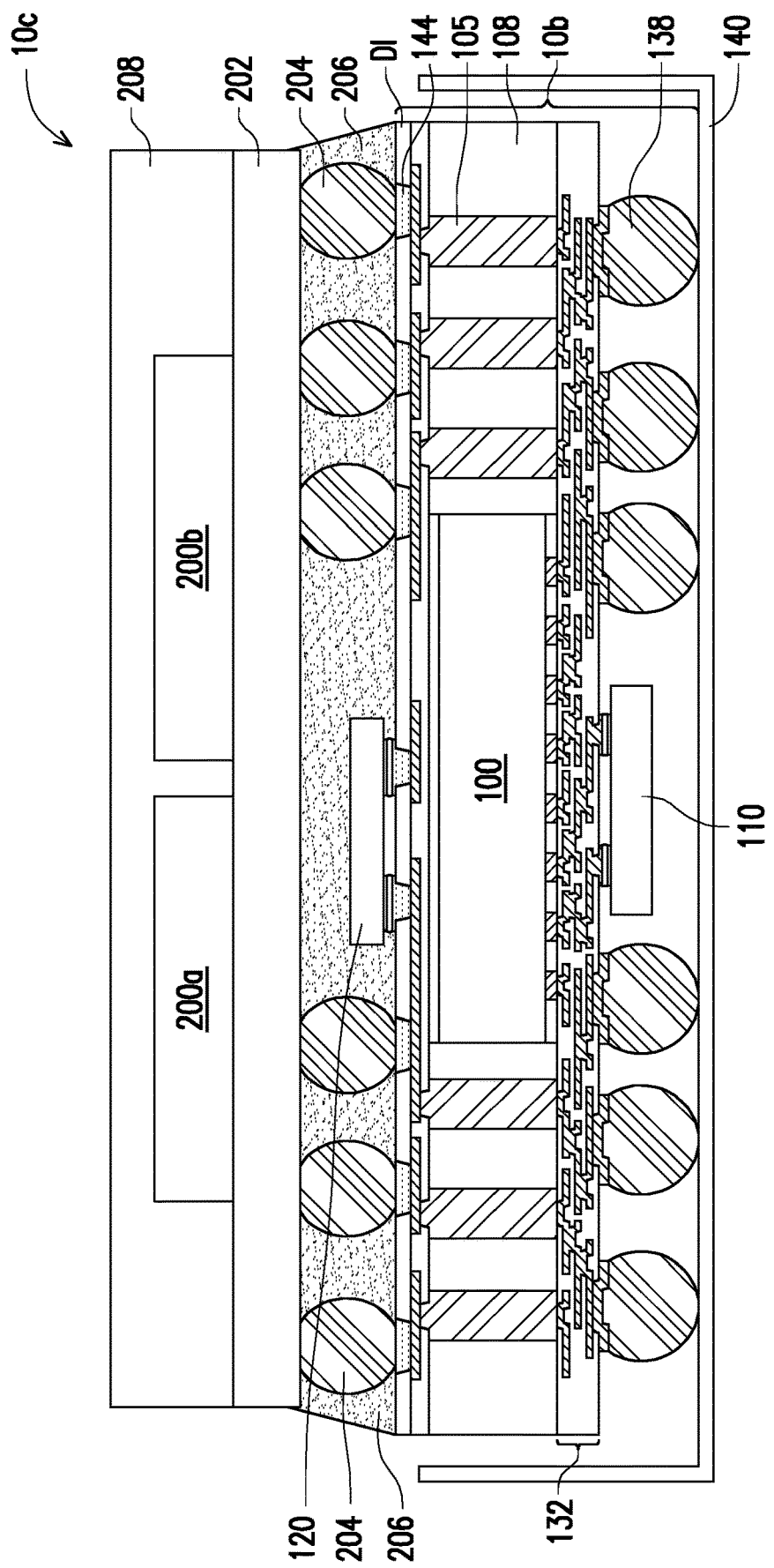

Referring to FIG. 1H, another package (or upper package) 10c is bonded to the bottom package 10b through a plurality of conductive connectors 204 (also referred to as conductive balls) and the solders 144. In detail, the upper package 10c includes a circuit substrate 202, a first die 200a, a second die 200b, and an encapsulant 208. The first die 200a and the second die 200b are mounted on the circuit substrate 202 by a flip-chip way or wire-bonding way. In some embodiments, the first die 200a may be selected from an application-specific integrated circuit ("ASIC") chip, an analog chip, a sensor chip, a wireless chip, a radio frequency chip, a voltage regulator chip or a memory chip. In some embodiments, the second die 200b may be selected from an ASIC chip, an analog chip, a sensor chip, a wireless chip, a radio frequency chip, a voltage regulator chip or a memory chip. In certain embodiments, the first die 200a and the second die 200b are different types of dies. For example, the first die 200a and the second die 200b may encompass different electronic components or elements. Depending on the application, the first die 200a and the second die 200b may perform different functions. In some embodiments, the first die 200a may be a system on chip (SoC) die and the second die 200b may be a high bandwidth memory (HBM) die. However, the disclosure is not limited thereto, and the first die 200a and the second die 200b may be the same type of die, such as the memory die. Although only two dies 200a and 200b are illustrated in FIG. 1H, the embodiments of the present invention are not limited thereto. In alternative embodiments, two or more dies are laterally placed on the circuit substrate 202. In other embodiments, the first die 200a or the second die 200b may be a die stack structure that includes a plurality of dies stacked alternately on the circuit substrate 202.

In FIG. 1H, the encapsulant 208 are formed on the circuit substrate 202 to encapsulate the first die 200a and the second die 200b. In some embodiments, the encapsulant 208 includes a molding compound, a molding underfill, a resin (such as an epoxy resin), or a combination thereof, or the like. The encapsulant 208 may be formed by an over-molding process.

After the upper package 10c is bonded to the package 10b, an underfill layer 206 is formed to laterally encapsulate the conductive connectors 204 and the second passive device 120. In some embodiments, the underfill layer 206 may be any acceptable material, such as a polymer, epoxy, molding underfill, or the like. The underfill layer 206 may be formed by a capillary flow process after the upper package 10c is attached or may be formed by a suitable deposition method before the upper package 10c is attached. In some embodiments, a width and/or a height of the conductive connector 204 is greater than a width and/or a height of the connector 122.

Figure 1I:
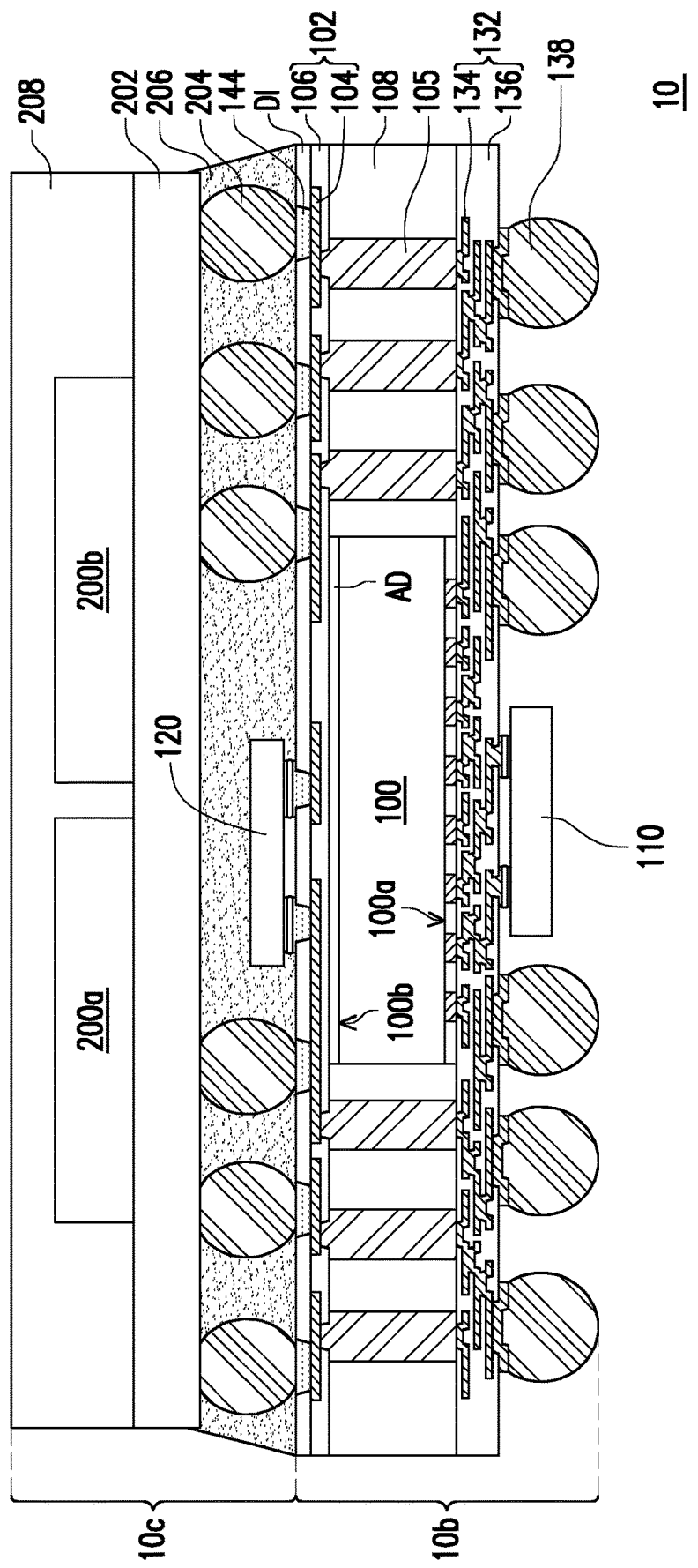

Referring to FIG. 1H and FIG. 1I, a package structure 10 is accomplished after the frame 140 is removed. In FIG. 1I, the package structure 10 includes the bottom package 10b and the upper package 10c being bonded together. In detail, the bottom package 10b includes the die 100, the TIVs 105 surrounding the die 100, the encapsulant 108 laterally encapsulating the die 100 and the TIVs 105, the FSRDL structure 132 formed on the front side 100a of the die 100, the BSRDL structure 102 formed on the backside 100b of the die 100. The upper package 10c includes the circuit substrate 202, the first die 200a and the second die 200b mounted on the circuit substrate 202, and the encapsulant 208 encapsulating the first die 200a and the second die 200b. The conductive connectors 204 are included between and electrically connected the BSRDL structure 102 of the bottom package 10b and the circuit substrate 202 of the upper package 10c. In addition, the underfill layer 206 are also disposed between the BSRDL structure 102 of the bottom package 10b and the circuit substrate 202 of the upper package 10c to encapsulate the second passive device 120 and the conductive connectors 204.

In FIG. 1I, the package structure 10 further includes the first passive device 110 formed on the FSRDL structure 132 (or referred to as a first RDL structure) and the second passive device 120 formed on the BSRDL structure 102 (or referred to as a second RDL structure). The second passive device 120 is disposed between the upper package 10c and the backside 100b of the die 100 (or the BSRDL structure 102). The first passive device 110 is electrically connected to the die 100 through the FSRDL structure 132. In addition, the first passive device 110 is electrically connected to the first die 200a and the second die 200b through the FSRDL structure 132, the TIVs 105, the BSRDL structure 102, the conductive connectors 204, and the circuit substrate 202. The second passive device 120 is electrically connected to the die 100 through the BSRDL structure 102, the TIVs 105, and the FSRDL structure 132. The second passive device 120 is electrically connected to the first die 200a and the second die 200b through the BSRDL structure 102, the conductive connectors 204, and the circuit substrate 202. Although the first passive device 110 and the second passive device 120 are both shown in FIG. 1I, the embodiments of the present invention are not limited thereto. In other embodiments, only second passive device 120 is included in the package structure 10. That is, the first passive device 110 is optional formed on the FSRDL structure 132.

The first passive device 110 and the second passive device 120 are able to supply and absorb short duration variations in load current and filter high frequency noise from power supplies. It should be noted that the second passive device 120 is disposed between the bottom package 10b and the upper package 10c, wherein the second passive device 120 is closer to the upper package 10c than the first passive device 110. Therefore, the equivalent series resistance (ESR) and/or the equivalent series inductance (ESL) between the upper package 10c and the second passive device 120 are decrease. As a result, the second passive device 120 is able to provide a high quality power distribution network (PDN) and a fast date rate for the high bandwidth memory, such as low power double-data-rate (LPDDR). That is, the package structure 10 with the first passive device 110 and the second passive device 120 is provide stable power supply voltage and/or current for future application processor (AP) memory system.

FIG. 2A to FIG. 2I are schematic cross-sectional views illustrating a method of manufacturing a package structure according to a second embodiment of the disclosure. FIG. 2J is a top view of line A-A' of FIG. 2I.

Figure 2A:
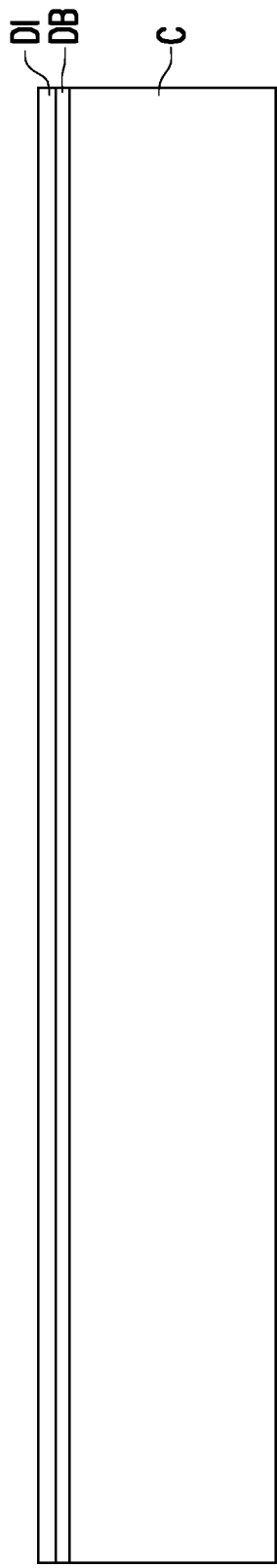
Figure 2B:
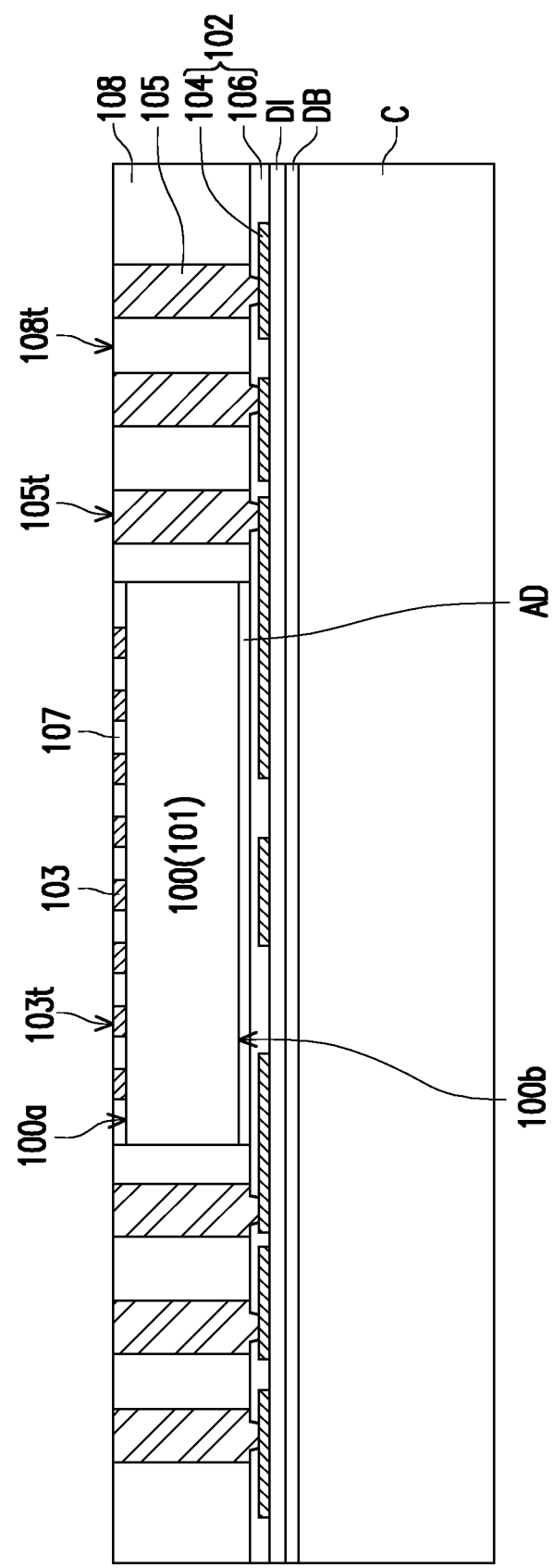
Figure 2C:
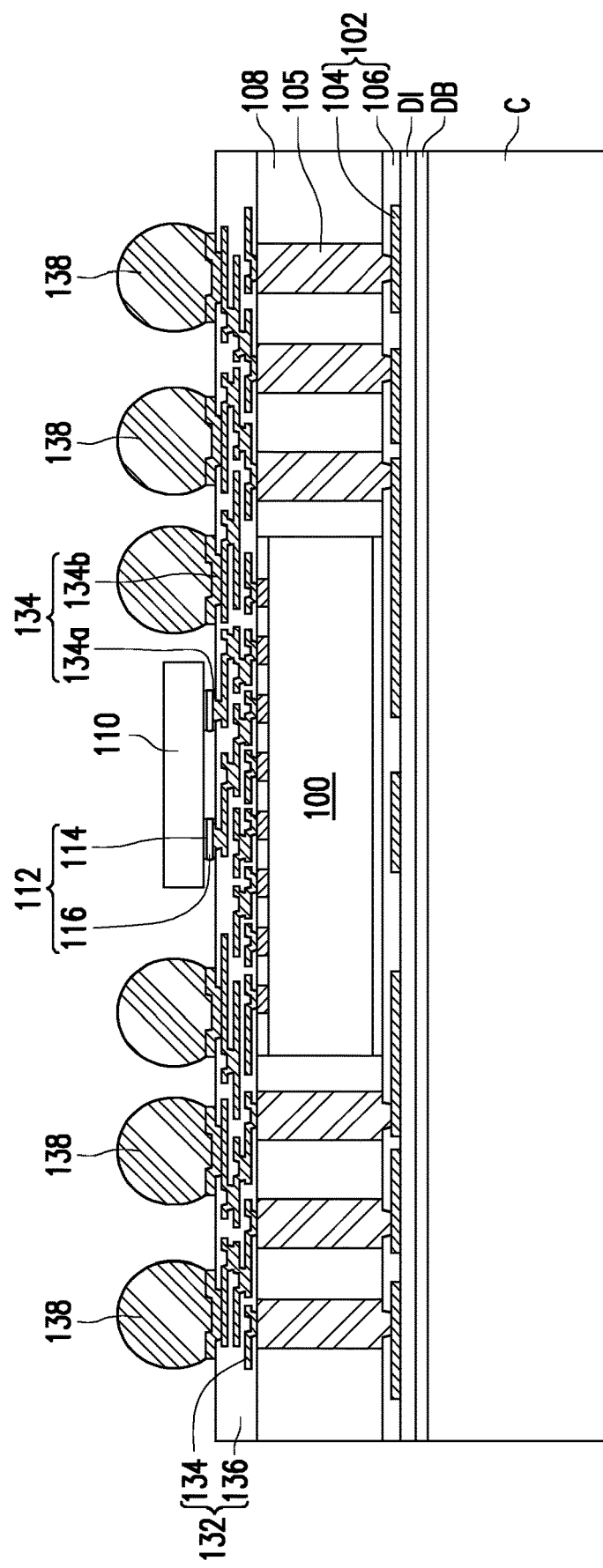
Figure 2D:
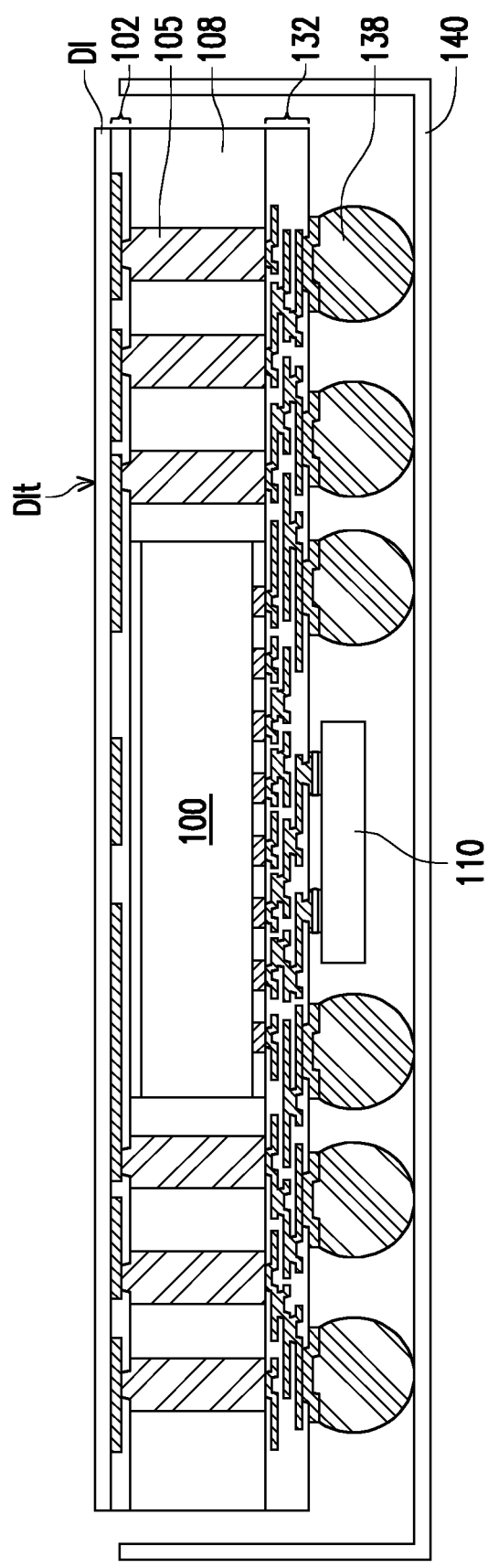
Figure 2E:
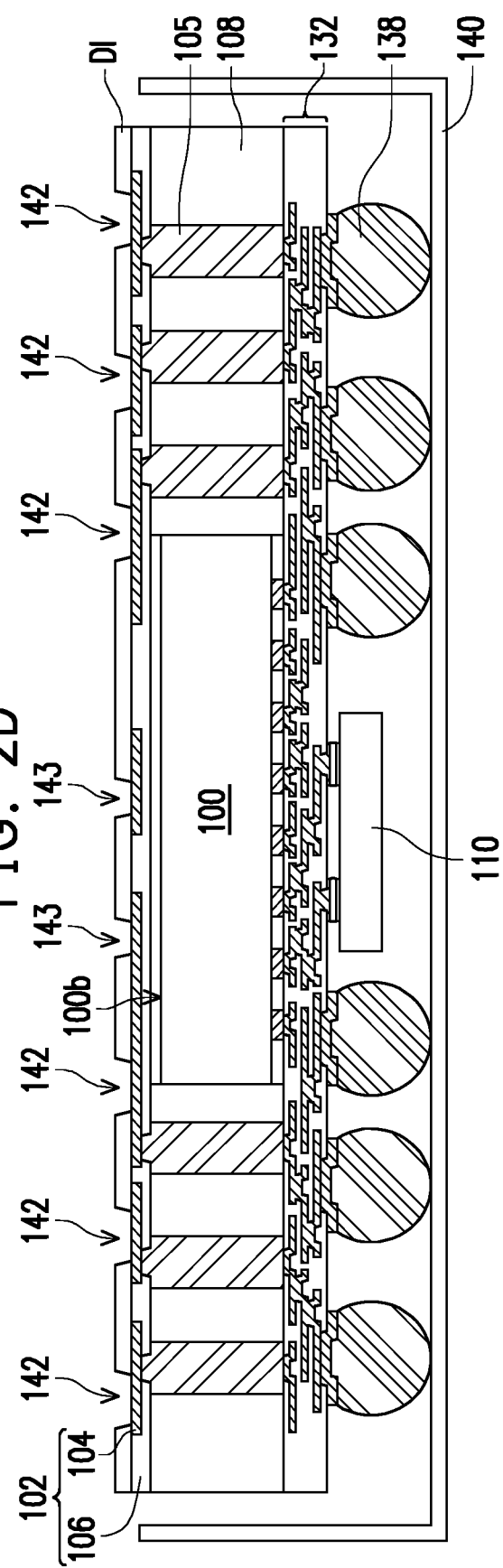
Figure 2F:
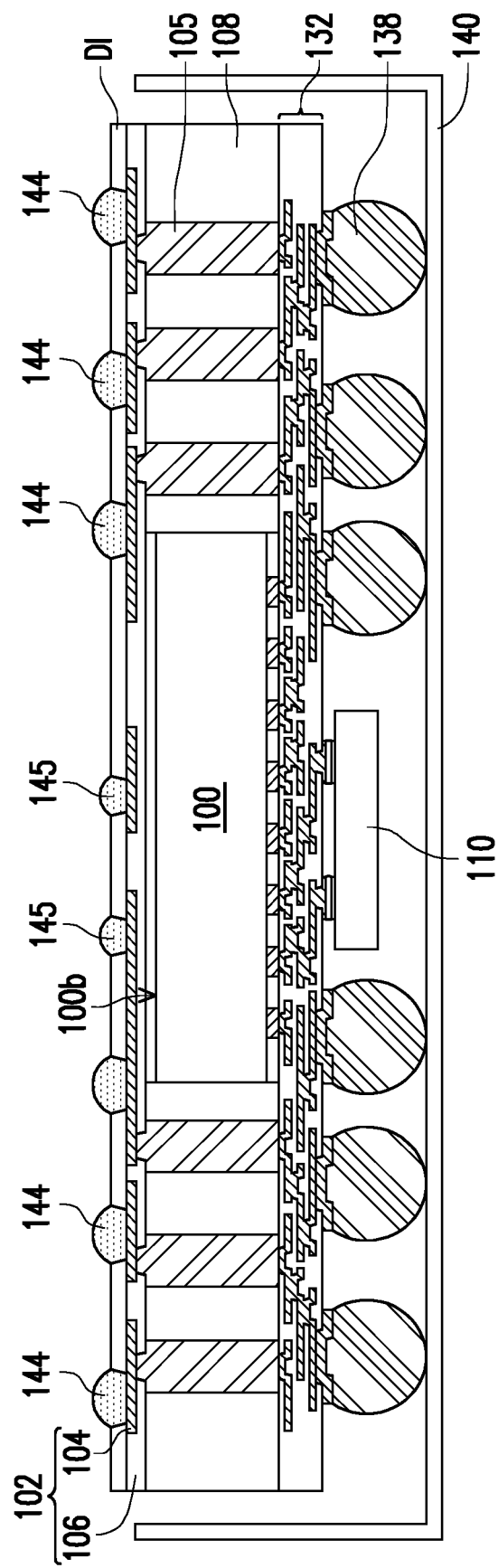
Figure 2G:
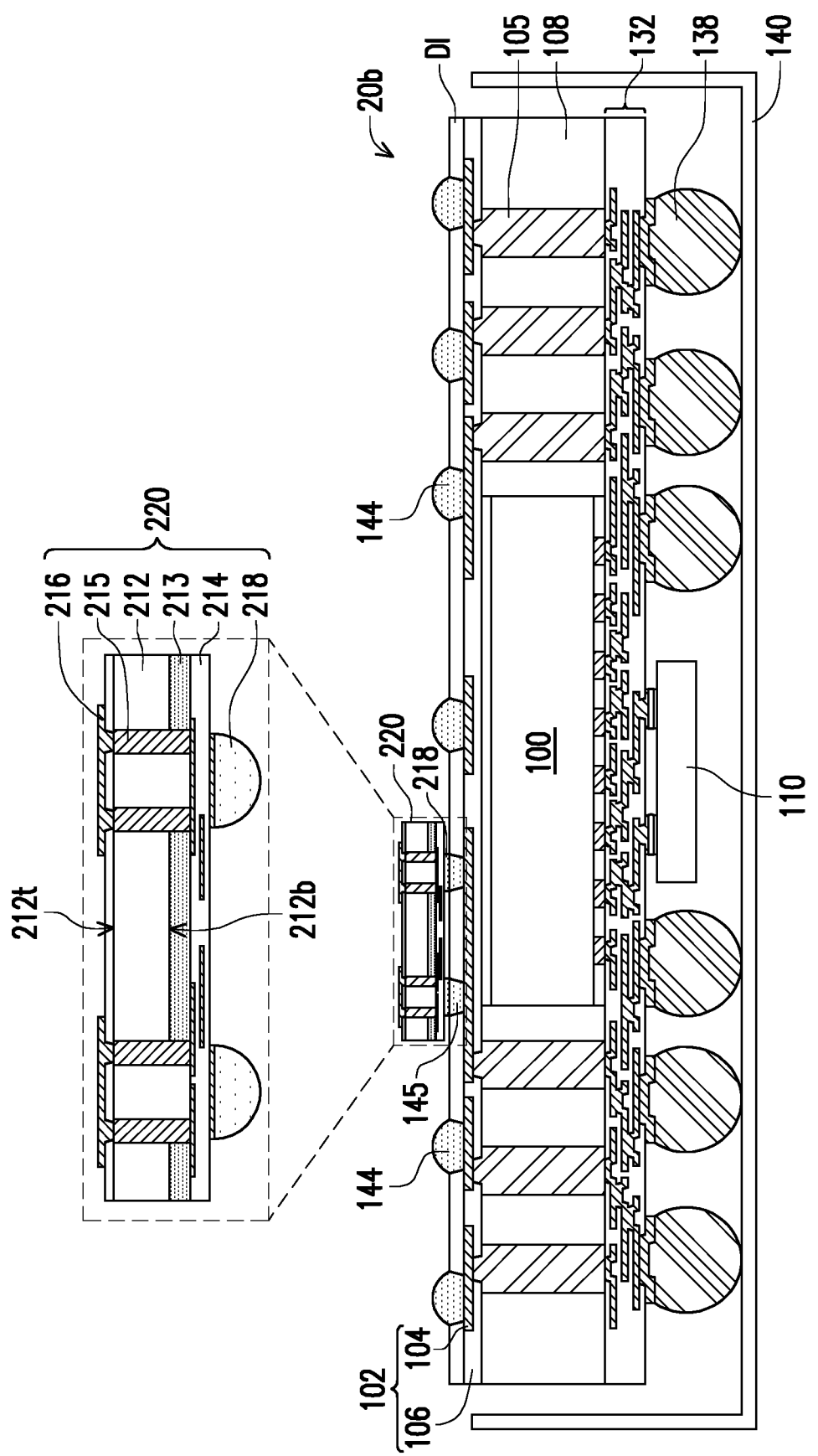

Referring to FIG. 2G, a bottom package 20b of the second embodiment is similar to the bottom package 10b of the first embodiment. That is, the forming steps of bottom package 20b are similar to the forming steps of bottom package 10b illustrated in FIG. 1A to FIG. 1G so similar elements are denoted by the same or similar reference numeral. Thus, details thereof are omitted here. A difference therebetween lies in that a second passive device 220 illustrated in FIG. 2G includes a plurality of through semiconductor vias (TSVs). In the case, the second passive device 220 is referred to as a two-side IPD.

In detail, the second passive device 220 includes a substrate 212, a device region 213, an interconnect structure 214, the TSVs 215, a plurality of pads 216, and a plurality of connectors 218. In the enlarged view of FIG. 2G, the substrate 212 includes a top surface 212t and a bottom surface 212b opposite to each other. In some embodiments, the substrate 212 may be made of silicon or other semiconductor materials. Alternatively, or additionally, the substrate 212 may include other elementary semiconductor materials such as germanium. In some embodiments, the substrate 212 is made of a compound semiconductor such as silicon carbide, gallium arsenic, indium arsenide or indium phosphide. In some embodiments, the substrate 212 is made of an alloy semiconductor such as silicon germanium, silicon germanium carbide, gallium arsenic phosphide, or gallium indium phosphide. Furthermore, the substrate 212 may be a semiconductor on insulator such as silicon on insulator (SOI) or silicon on sapphire.

In the enlarged view of FIG. 2G, the device region 213 is formed on the bottom surface 212b of the substrate 212. In some embodiments, the device regions 213 includes, but not limited, capacitors, resistors, inductors, baluns, couplers, splitters, filters, diplexers, or the like. The interconnect structure 214 is formed on the bottom surface 212b of the substrate 212, and the device region 213 is disposed between the substrate 212 and the interconnect structure 214. In some embodiments, the interconnect structure 214 includes a plurality of traces and vias (not shown) stacked alternately. The connectors 218 are formed below the interconnect structure 214. In some embodiments, the connectors 218 may be solder joints that includes tin, lead, silver, copper, or a combination thereof. The pads 216 is formed on the top surface 212t of the substrate 212. The TSVs 215 penetrates through the substrate 212 and the device region 213, so as to electrically connect the interconnect structure 214 and the pad 216.

As shown in FIG. 2G, the second passive device 220 is mounted or bonded on the RDL structure 102 through the solders 145 and the connectors 218. That is, the solders 145 are in contact with the connectors 218 respectively. The device region 213 is face toward the bottom package 20b. In some embodiments, as shown in FIG. 2G, an orthographic projection of the second passive device 220 projected on a plane S1 extending from the backside 100b of the die 100 partially overlaps with a region of the die 100. In some alternative embodiments, the orthographic projection of the second passive device 220 projected on the plane S1 extending from the backside 100b of the die 100 may completely overlaps with the region of the die 100. In some embodiments, a portion of the second passive device 220 is located within the region of the die 100, while another portion of the second passive device 220 is located out of the region of the die 100. In some alternative embodiments, the second passive device 220 is completely located within the region of the die 100 and without extending beyond the region of the die 100.

Figure 2H:
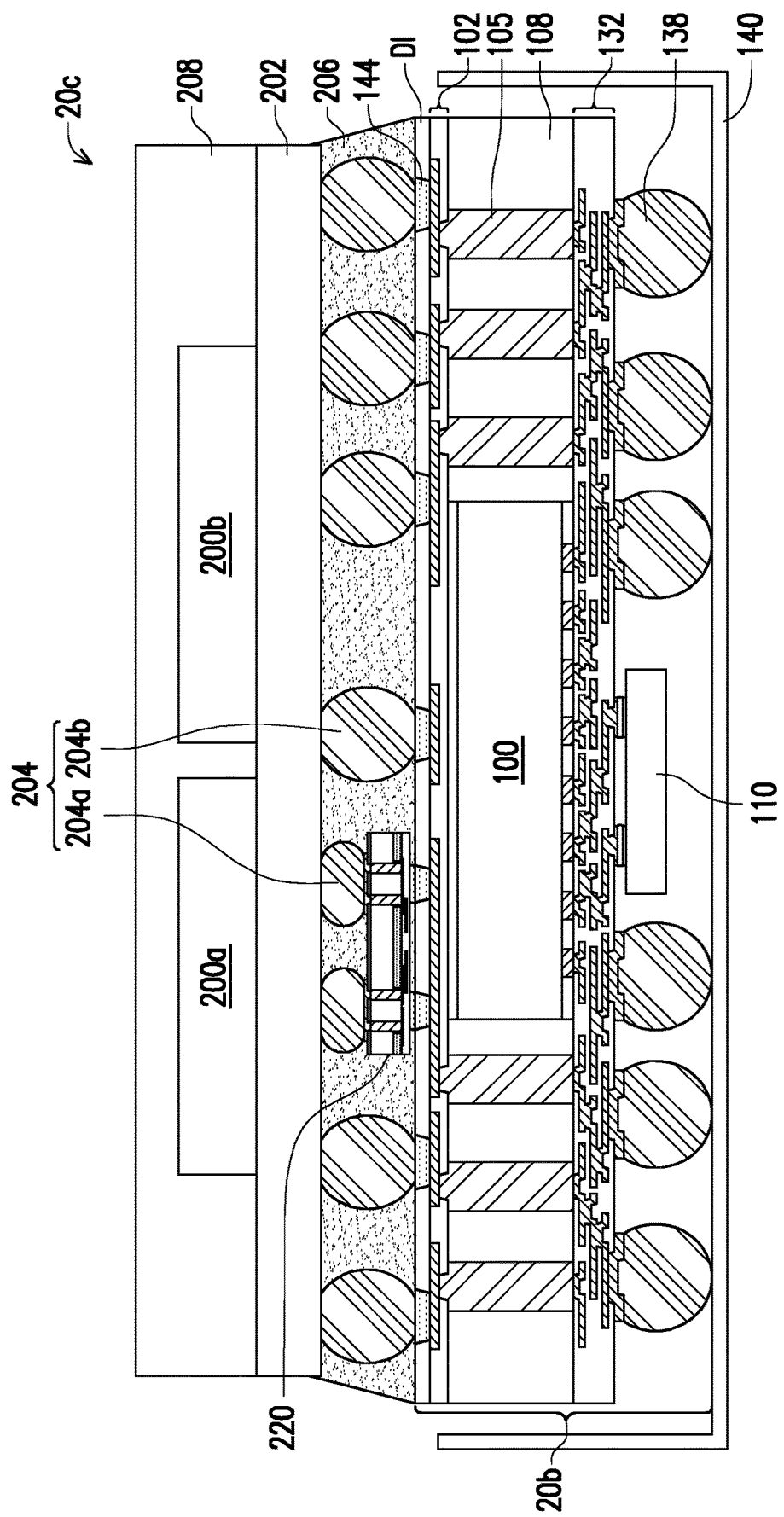
Figure 21:
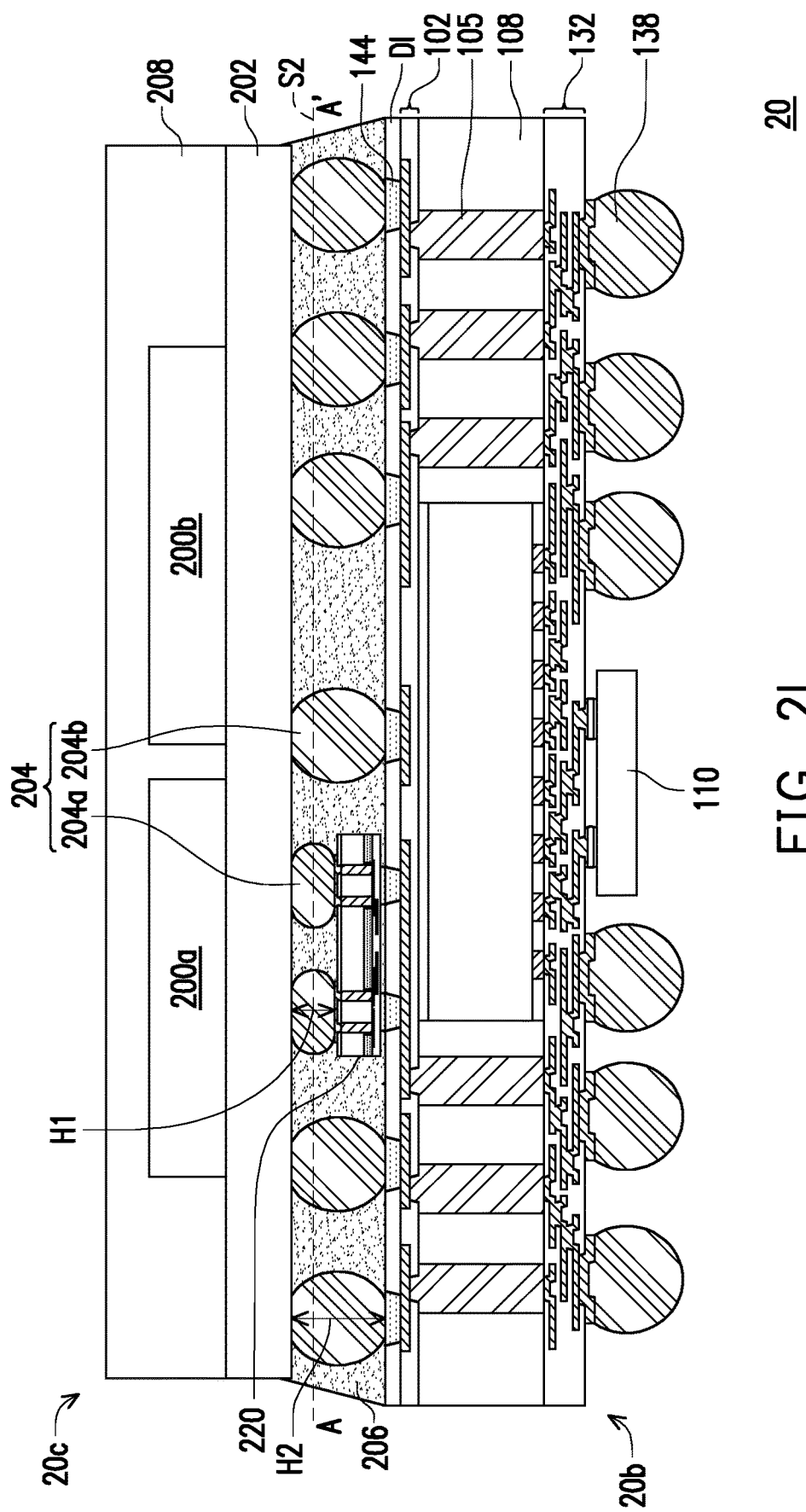
Figure 2J:
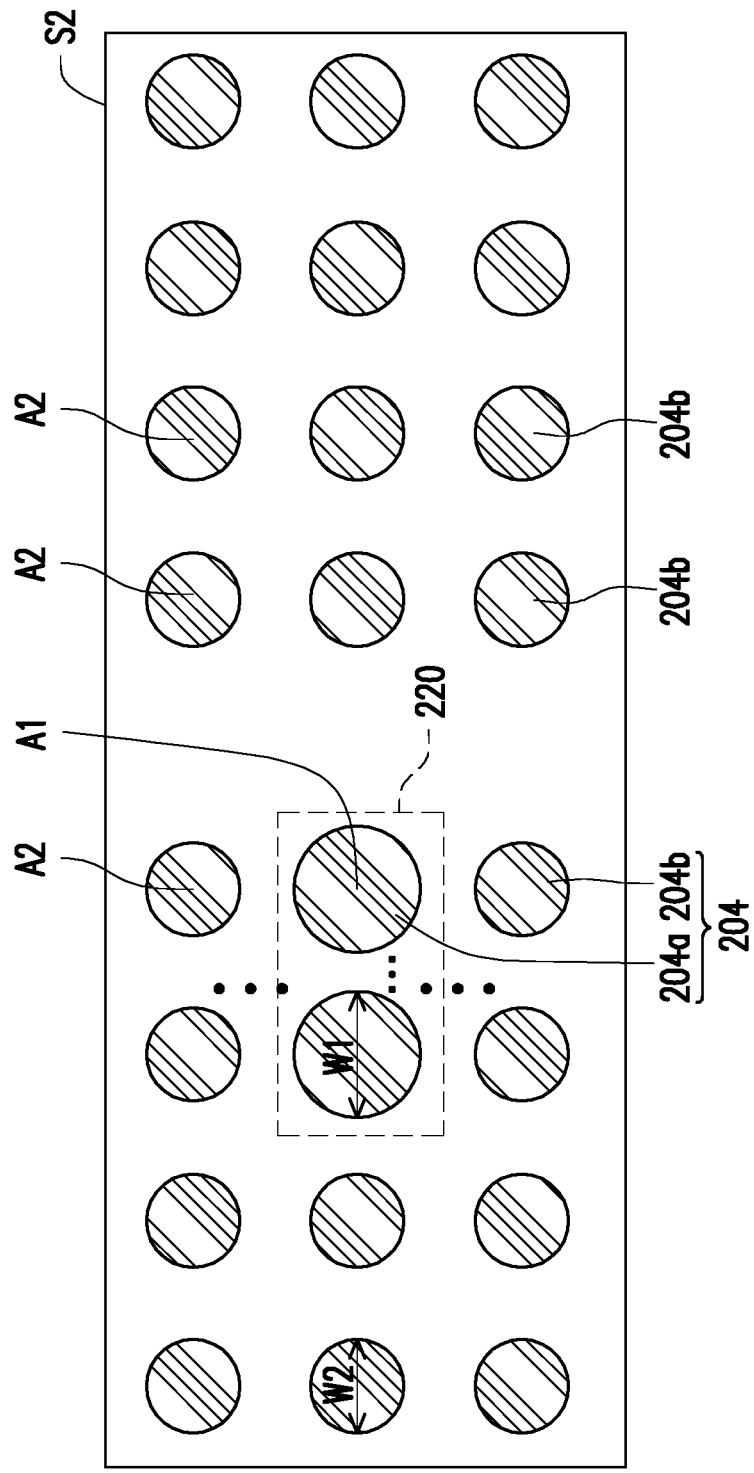
FIG. 2J is a top view of line A-A' of FIG. 2I.

Referring to FIG. 2H, the another package (or upper package) 20c is bonded to the bottom package 20b through the conductive connectors 204. In detail, the conductive connectors 204 includes a plurality of conductive connectors 204a and a plurality of conductive connectors 204b. Hereinafter, the conductive connectors 138 are referred to as first conductive connectors 138, the conductive connectors 204a are referred to as second conductive connectors 204a, and the conductive connectors 204b are referred to as third conductive connectors 204b. The second conductive connectors 204a are disposed on the pads 216 of the second passive device 220 respectively. Specifically, the second conductive connectors 204a are sandwiched between the second passive device 220 and the circuit substrate 202. The second passive device 220 is electrically connected to the first die 200a and the second die 200b through the second conductive connectors 204a and the circuit substrate 202. The third conductive connectors 204b are disposed aside the second passive device 220. The third conductive connectors 204b are sandwiched between and electrically connected the RDL structure 102 and the circuit substrate 202. The underfill layer 206 is formed to laterally encapsulate the conductive connectors 204 (including 204a and 204b) and the second passive device 220. The arrangement and forming method of the upper package 20c is similar to the arrangement and forming method of the upper package 10c illustrated in above embodiments. Thus, details thereof are omitted here.

Referring to FIG. 2I and FIG. 2J, a package structure 20 is accomplished after the frame 140 is removed. In some embodiments, as shown in FIG. 2J, a horizontal cross-sectional area A1 of the second conductive connector 204a is different from a horizontal cross-sectional area A2 of the third conductive connectors 204b at the same level, such as a plane S2 along line A-A'. In other word, a width W1 of the second conductive connectors 204a is different from a width W2 of the third conductive connectors 204b at the same level, such as a plane S2 along line A-A'. In some embodiments, the horizontal cross-sectional area A1 and/or width W1 of the second conductive connectors 204a is greater than the horizontal cross-sectional area A2 and/or width W2 of the third conductive connectors 204b at the same level, such as the plane S2 along line A-A'. However, the embodiments of the present invention are not limited thereto. In some alternative embodiments, the horizontal cross-sectional area A1 and/or width W1 of the second conductive connectors 204a may be equal to or less than the horizontal cross-sectional area A2 and/or width W2 of the third conductive connectors 204b at another plane over or below the plane S2 along line A-A'. From another perspective, a height H1 of the second conductive connectors 204a is less than a height H2 of the third conductive connectors 204b.

Figure 3A:
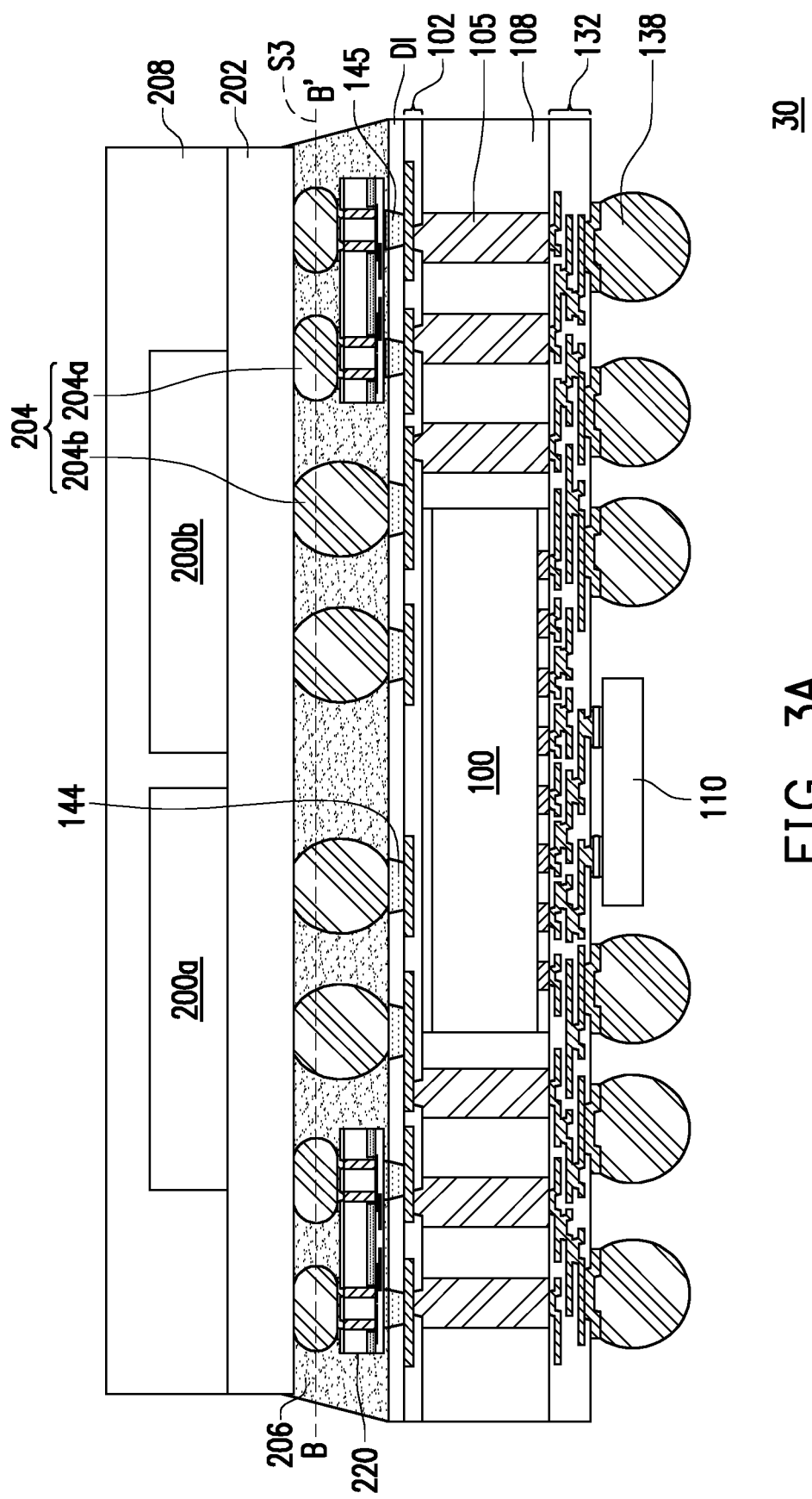
FIG. 3A is schematic cross-sectional view illustrating a package structure according to a third embodiment of the disclosure.
Figure 3B:
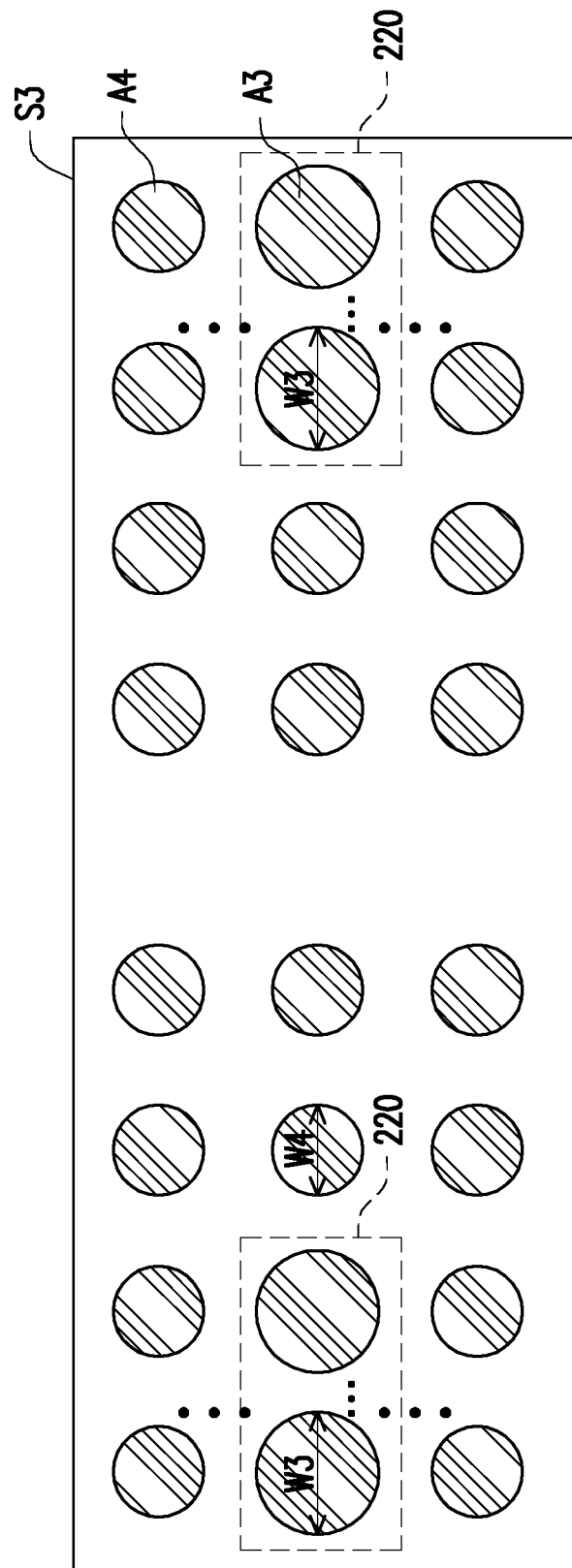
FIG. 3B is a top view of line B-B' of FIG. 3A.

FIG. 3A is schematic cross-sectional view illustrating a package structure according to a third embodiment of the disclosure. FIG. 3B is a top view of line B-B' of FIG. 3A.

Referring to FIG. 3A and FIG. 3B, a package structure 30 of the third embodiment is similar to the package structure 20 of the second embodiment. A difference therebetween lies in that the second passive devices 220 are respectively mounted on the TIVs 105 rather than on the die 100. As shown in FIG. 3A, in some embodiments, an orthographic projection of the second passive device 220 projected on the plane S3 extending from the backside 100b of the die 100 is positioned out of the region of the die 100. That is, some of the third conductive connectors 204b are directly formed over the die 100 and the second conductive connectors 204a are formed aside the third conductive connectors 204b and directly formed over the TIVs 105.

In some embodiments, as shown in FIG. 3B, a horizontal cross-sectional area A3 and/or width W3 of the second conductive connector 204a is different from a horizontal cross-sectional area A4 and/or width W4 of the third conductive connector 204b at the same level, such as a plane S3 along line B-B'. In some embodiments, the horizontal cross-sectional area A3 and/or width W3 of the second conductive connector 204a is greater than the horizontal cross-sectional area A4 and/or width W4 of the third conductive connector 204b at the same level, such as a plane S3 along line B-B'. However, the embodiments of the present invention are not limited thereto. In some alternative embodiments, the horizontal cross-sectional area A3 and/or width W3 of the second conductive connector 204a may be equal to or less than the horizontal cross-sectional area A4 and/or width W4 of the third conductive connector 204b at another plane over or below the plane S3 along line B-B'.

Figure 4A:
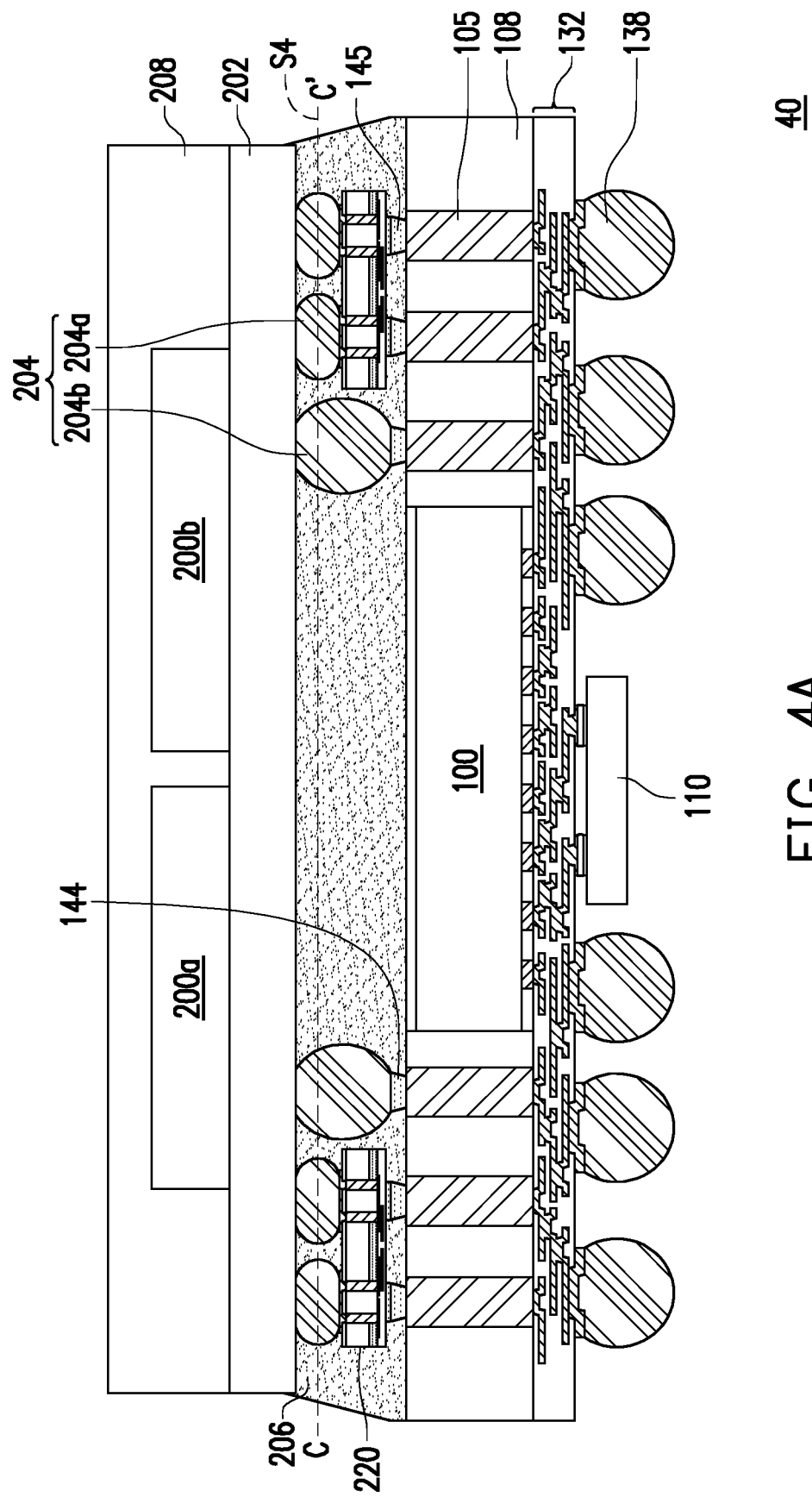
FIG. 4A is schematic cross-sectional view illustrating a package structure according to a fourth embodiment of the disclosure.
Figure 4B:
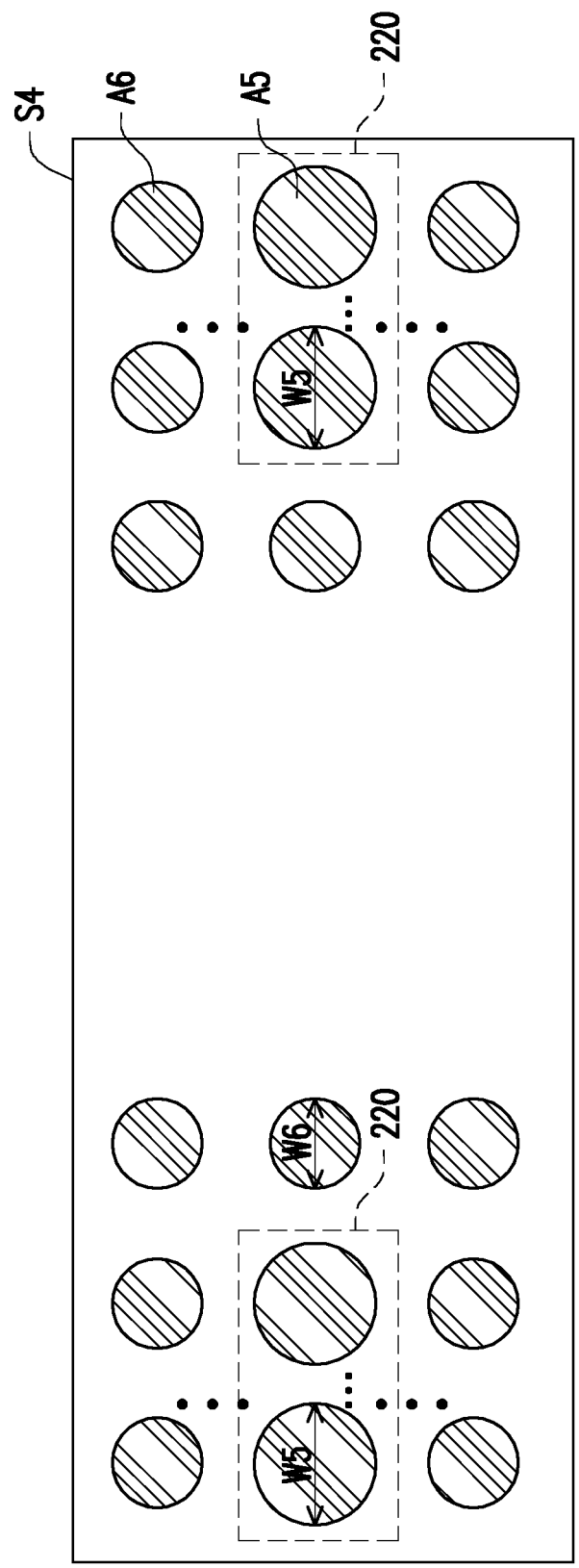
FIG. 4B is a top view of line C-C' of FIG. 4A.

FIG. 4A is schematic cross-sectional view illustrating a package structure according to a fourth embodiment of the disclosure. FIG. 4B is a top view of line C-C' of FIG. 4A.

Referring to FIG. 4A and FIG. 4B, a package structure 40 of the fourth embodiment is similar to the package structure 30 of the third embodiment. A difference therebetween lies in that the second passive devices 220 and the third conductive connectors 204b are directly mounted on and in contact with the TIVs 105. That is, the package structure 40 of the fourth embodiment is free of the RDL or BSRDL structure 102. In some embodiments, there is no conductive connector directly over the die 100, as shown in FIG. 4A. In some alternative embodiments, some conductive connectors (not shown) may be directly disposed over the die 100.

In some embodiments, as shown in FIG. 4B, a horizontal cross-sectional area A5 and/or width W5 of the second conductive connector 204a is different from a horizontal cross-sectional area A6 and/or width W6 of the third conductive connector 204b at the same level, such as a plane S4 along line C-C'. In some embodiments, the horizontal cross-sectional area A5 and/or width W5 of the second conductive connector 204a is greater than the horizontal cross-sectional area A6 and/or width W6 of the third conductive connector 204b at the same level, such as a plane S4 along line C-C'. However, the embodiments of the present invention are not limited thereto. In some alternative embodiments, the horizontal cross-sectional area A5 and/or width W5 of the second conductive connector 204a may be equal to or less than the horizontal cross-sectional area A6 and/or width W6 of the third conductive connector 204b at another plane over or below the plane S4 along line C-C'.

FIG. 5A to FIG. 5J are schematic cross-sectional views illustrating a method of manufacturing a package structure according to a fifth embodiment of the disclosure.

Figure 5A:
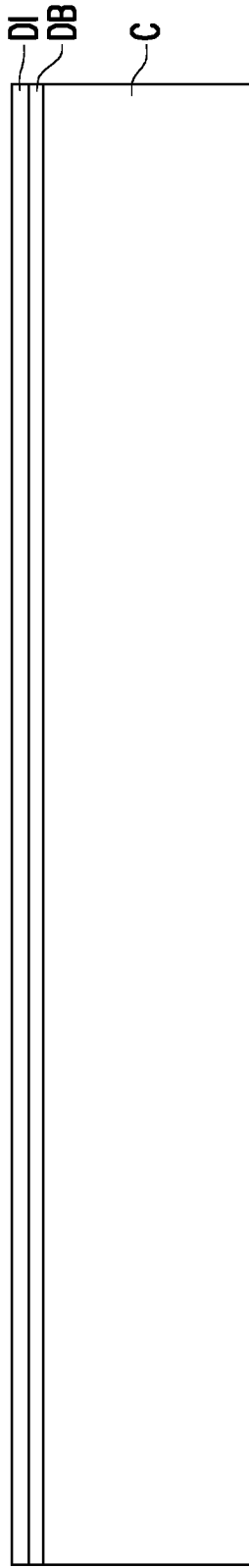
FIG. 5A to FIG. 5J are schematic cross-sectional views illustrating a method of manufacturing a package structure according to a fifth embodiment of the disclosure.

Referring to FIG. 5A, a carrier C having a de-bonding layer DB and a dielectric layer DI formed thereon is provided, wherein the de-bonding layer DB is formed between the carrier C and the dielectric layer DI.

Figure 5B:
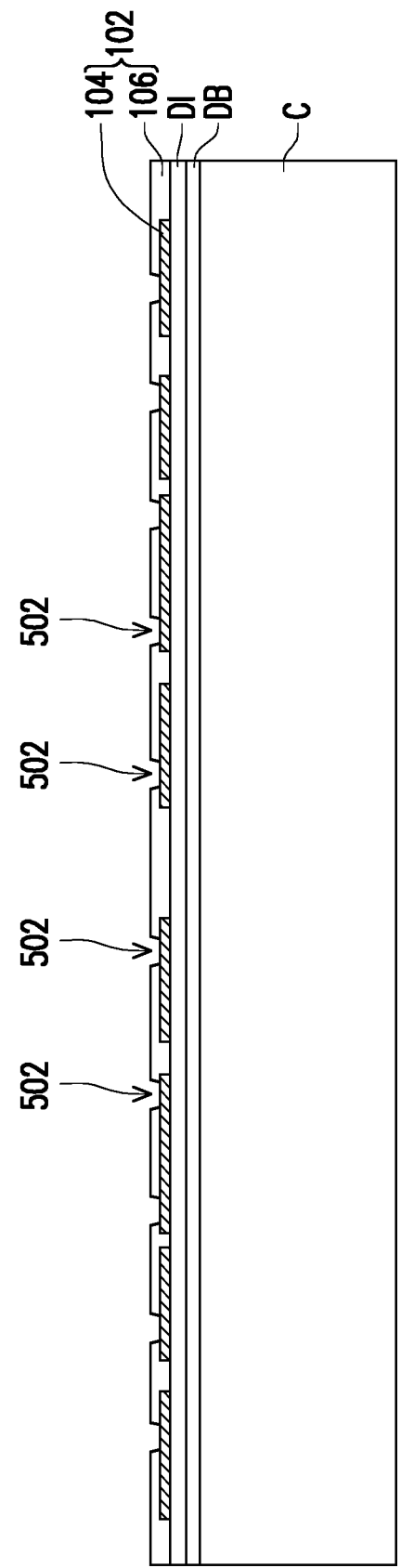

Referring to FIG. 5B, a RDL structure 102 is formed on the dielectric layer DI. A plurality of openings 502 are formed to expose portions of the conductive features 104 of the RDL structure 102 by a laser drilling process or a photolithography and etching processes.

Figure 5C:
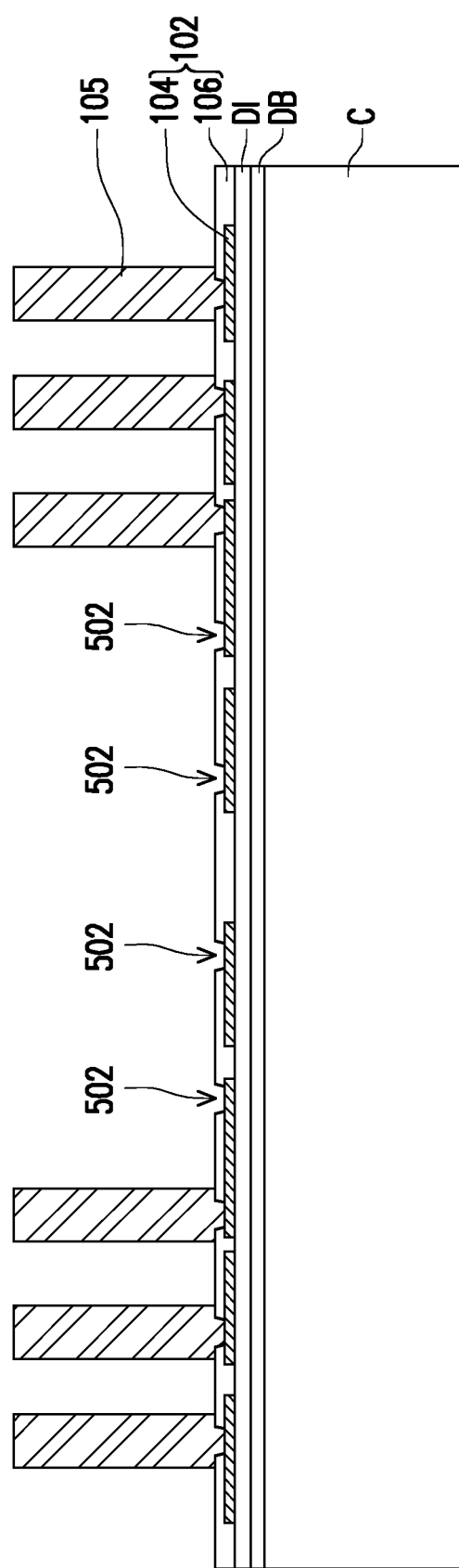

Referring to FIG. 5C, a plurality of TIVs 105 are formed on the RDL structure 102 by photolithography, plating, and photoresist stripping process.

Figure 5D:
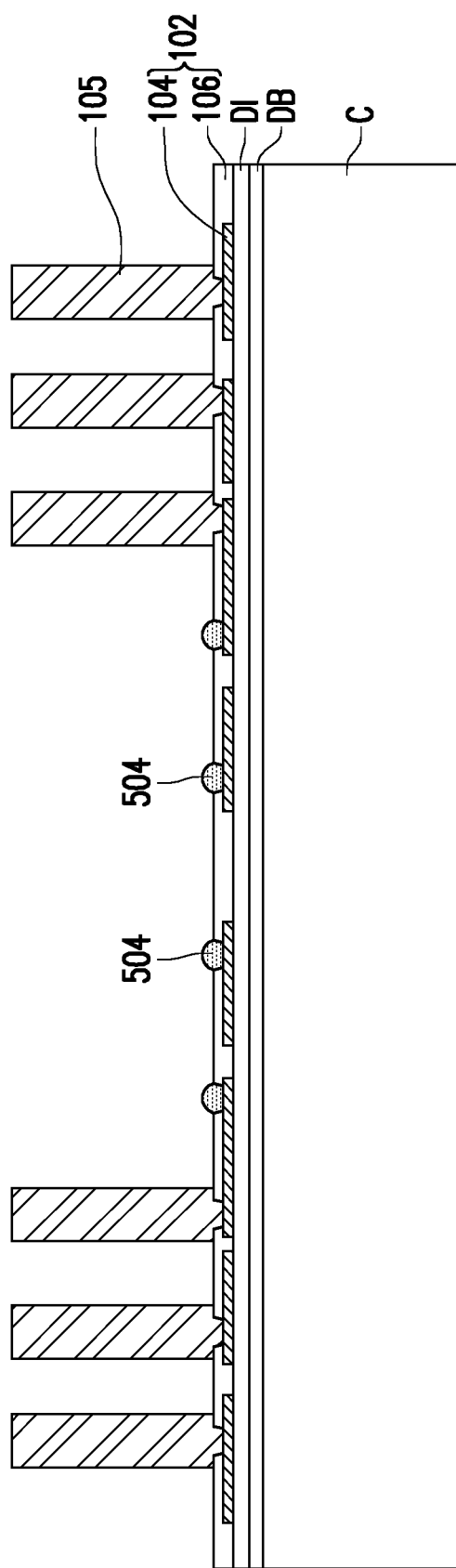

Referring to FIG. 5D, a plurality of solders 504 are respectively formed in the openings 502 by a solder pasting or printing process, but the disclosure is not limited thereto. The solders 504 are in contact with the portions of the conductive features 104 exposed by the openings 502.

Figure 5E:
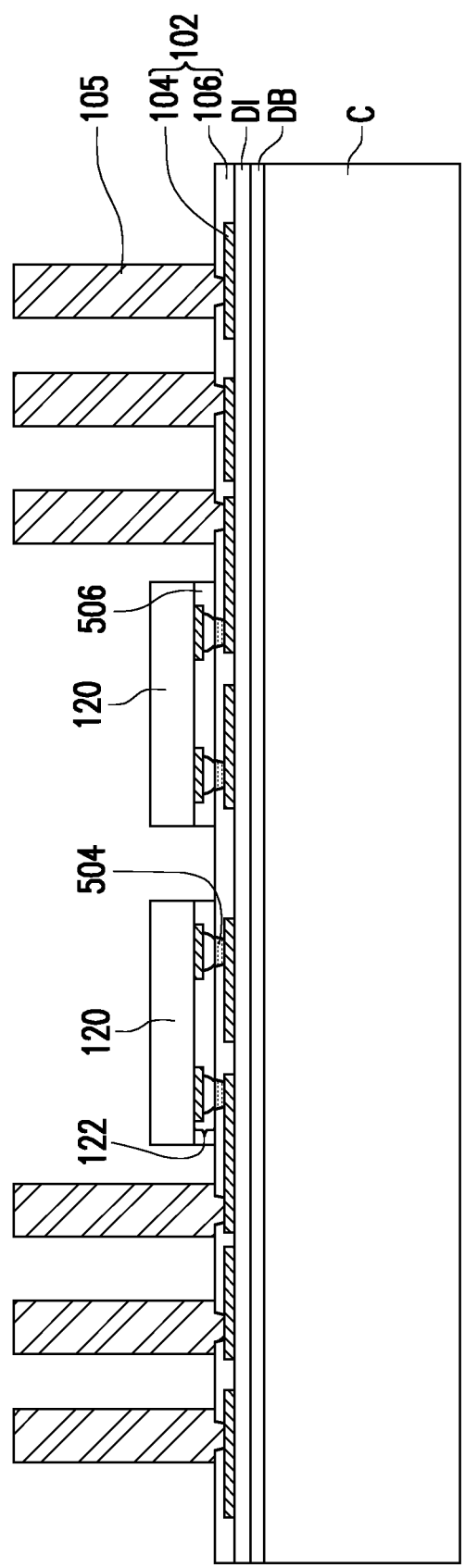

Referring to FIG. 5E, the second passive devices 120 are flipped and mounted on the RDL structure 102 through the solders 504 and the connectors 122. An underfill layer 506 is formed to laterally encapsulate the solders 504 and the connectors 122. In some embodiments, the underfill layer 506 may be any acceptable material, such as a polymer, epoxy, molding underfill, or the like. The underfill layer 506 may be formed by a capillary flow process after the second passive devices 120 are attached or may be formed by a suitable deposition method before second passive devices 120 are attached. Although only two second passive devices 120 illustrated in FIG. 5E, the embodiments of the present invention are not limited thereto. In some embodiments, one or more second passive devices 120 are mounted on the RDL structure 102.

Figure 5F:
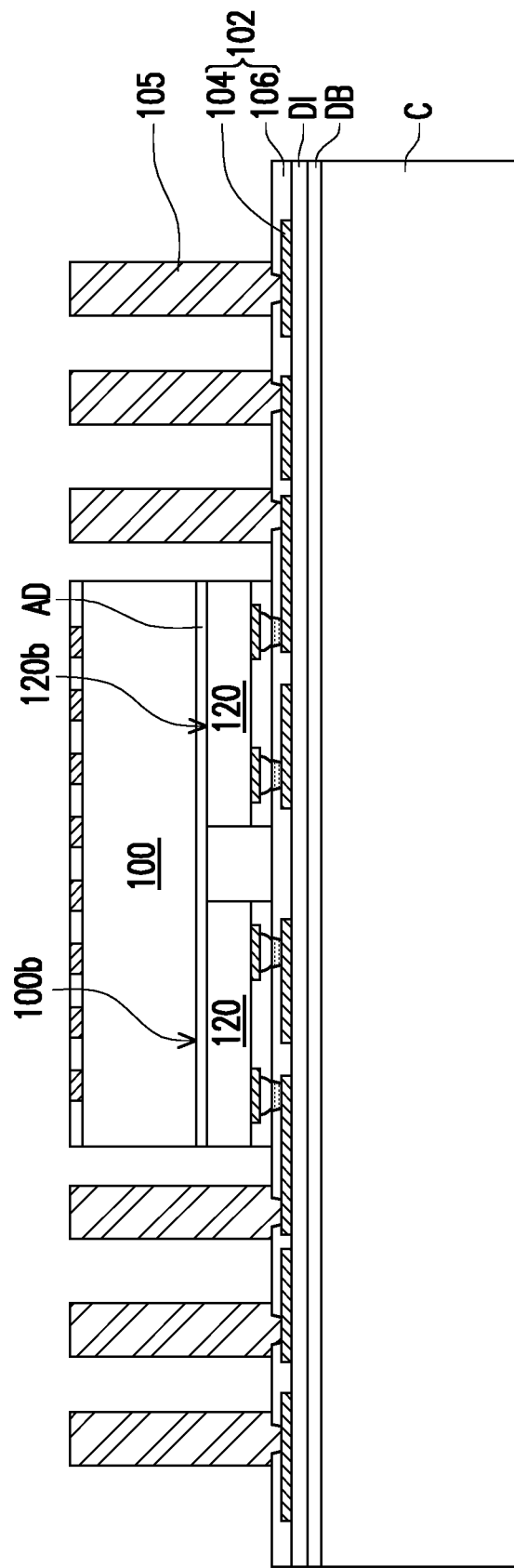

Referring to FIG. 5F, the die 100 is picked and placed on the second passive devices 120. In detail, the die 100 and the second passive devices 120 are adhered together through an adhesive layer AD and in a back-to-back configuration. That is, the backside 100b of the die 100 faces to the backsides 120b of the second passive devices 120.

Figure 5G:
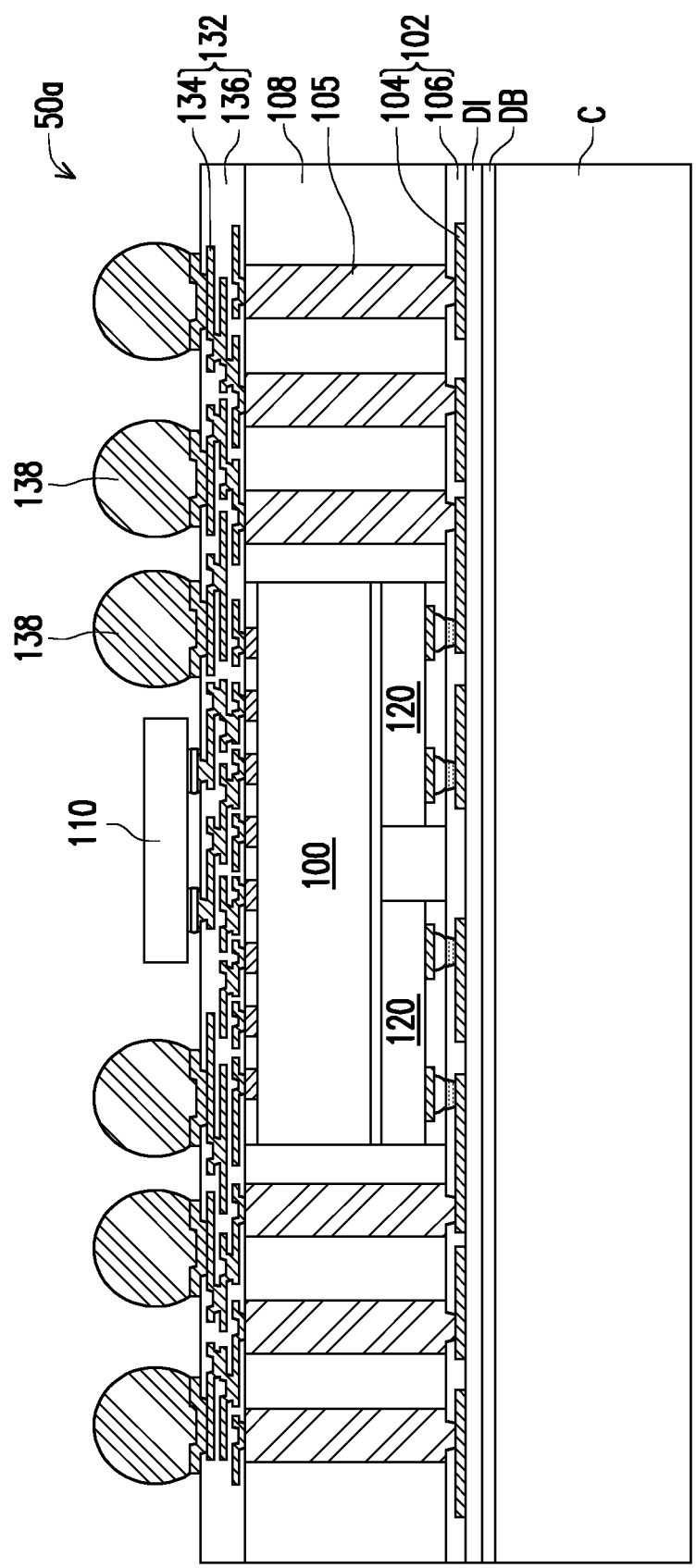

Referring to FIG. 5G, the encapsulant 108 is formed to laterally encapsulate the die 100, the TIVs 105, the second passive devices 120, and the underfill layer 506. The encapsulant 108 may be formed by a sequence of an over-molding process and a planarizing process. The RDL structure 132 is then formed on the die 100, the TIVs 105 and the encapsulant 108. A plurality of conductive connectors 138 are formed on and electrically connected to the RDL structure 132. Optionally, the first passive device 110 is formed on and electrically connected to the RDL structure 132.

Figure 5H:
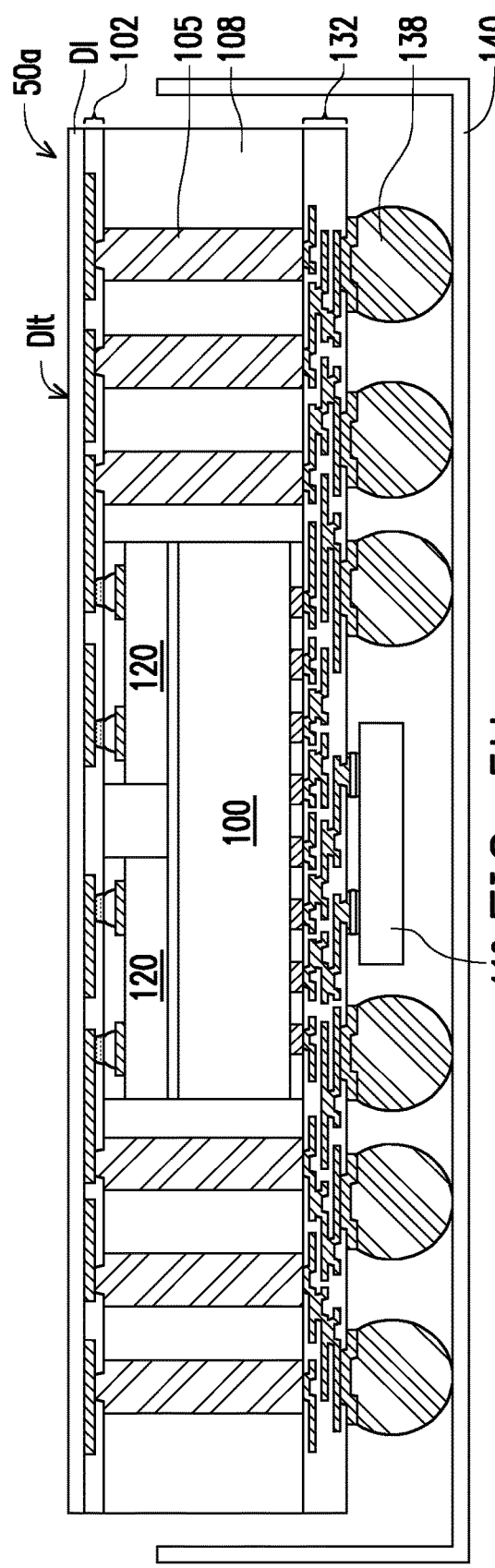

Referring to FIG. 5G and FIG. 5H, a structure 50a illustrated in FIG. 5G is flipped and mounted on the frame 140 by the conductive connectors 138. The carrier C and the de-bonding layer DB are detached from the structure 50a and then removed. In the case, as shown in FIG. 5H, a top surface DIt of the dielectric layer DI is exposed.

Figure 5I:
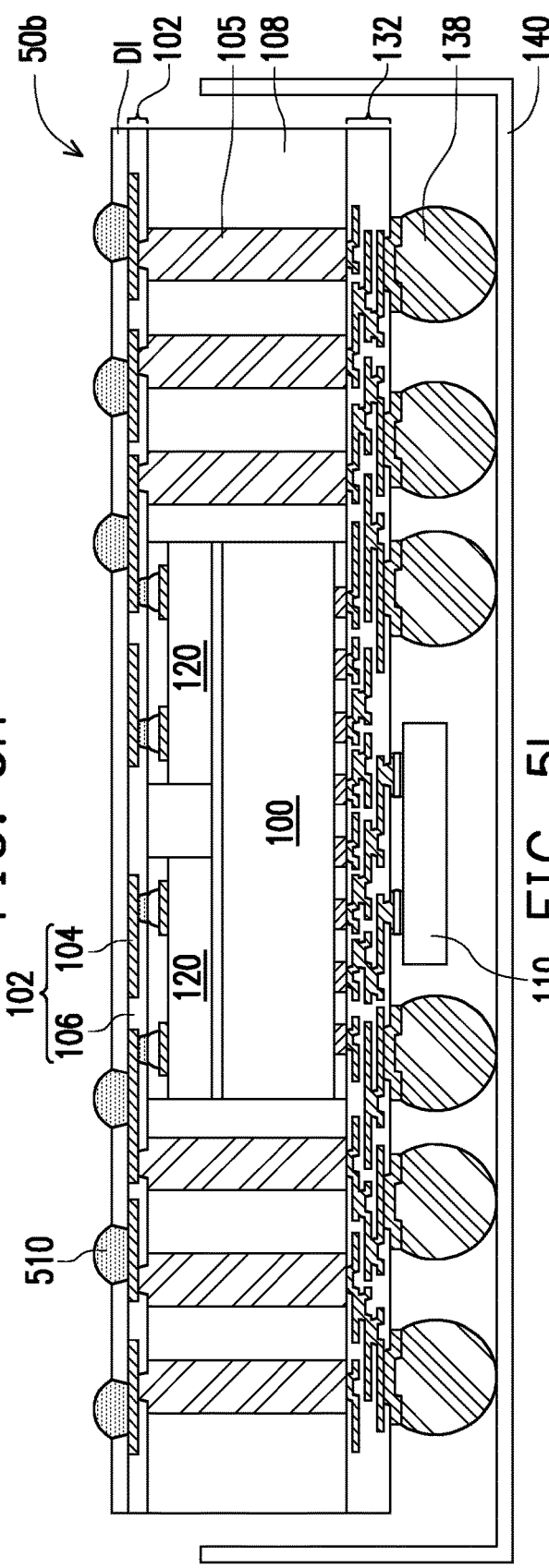

Referring to FIG. 5I, the dielectric layer DI is patterned to form a plurality of openings (not shown) by a laser drilling process or a photolithography and etching processes. A plurality of solders 510 are respectively formed in the openings by a solder pasting, a printing process, or a suitable process.

Figure 5J:
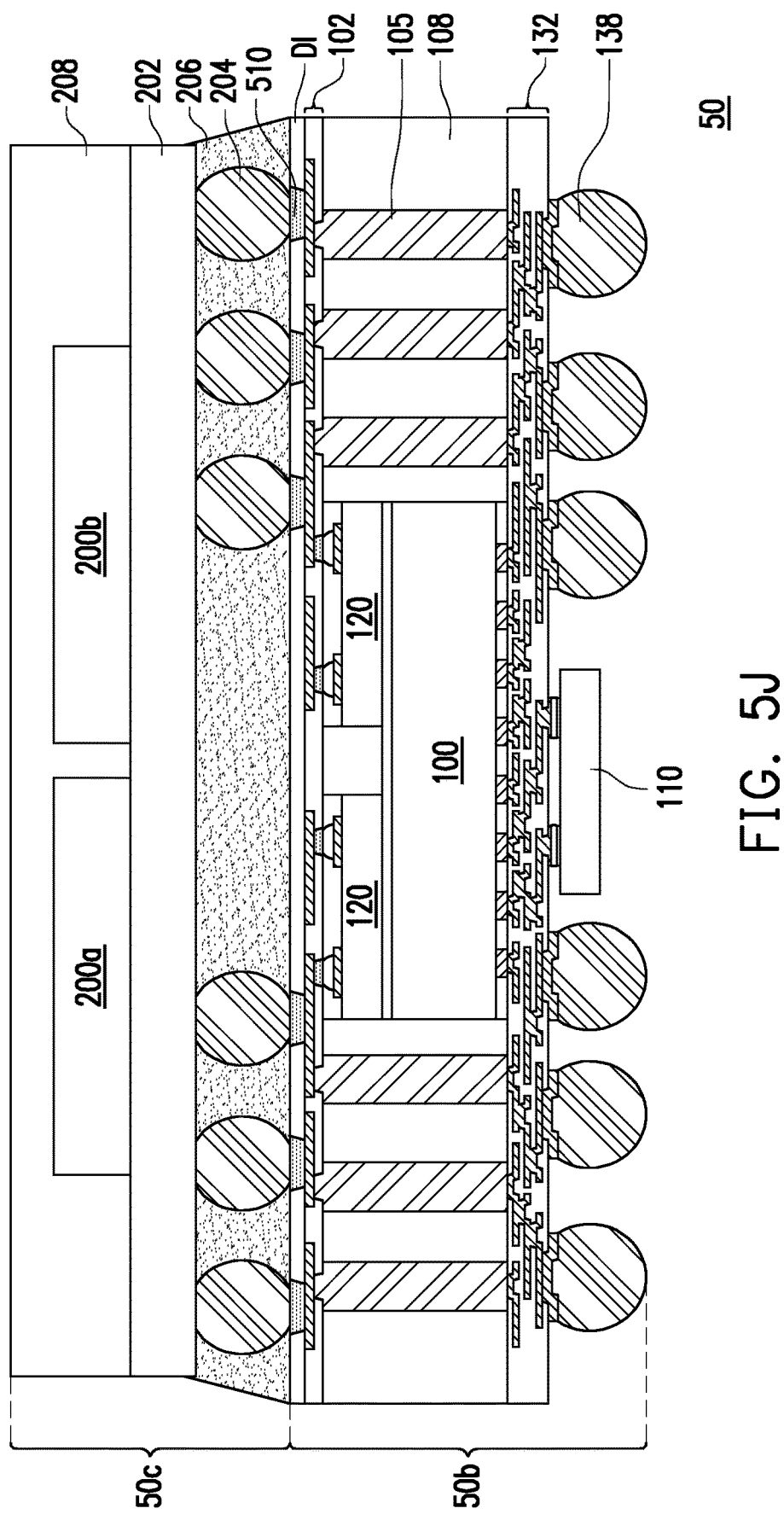

Referring to FIGS. 5I and 5J, another package (or upper package) 50c is bonded to a bottom package 50b (or bottom package) through a plurality of conductive connectors 204 and the solders 510. The arrangement and forming method of the upper package 50c are similar to the arrangement and forming method of the upper package 10c illustrated in above embodiments. Thus, details thereof are omitted here. After removing the frame 140, a package structure 50 is accomplished. In FIG. 5J, the second passive devices 120 are closer to the upper package 50c than the first passive device 110. Therefore, the equivalent series resistance (ESR) and/or the equivalent series inductance (ESL) between the upper package 50c and the second passive devices 120 are decrease. As a result, the second passive devices 120 are able to provide a high quality power distribution network (PDN) and a fast date rate for the high bandwidth memory, such as low power double-data-rate (LPDDR).

FIG. 6A to FIG. 6J are schematic cross-sectional views illustrating a method of manufacturing a package structure according to a sixth embodiment of the disclosure.

Figure 6A:
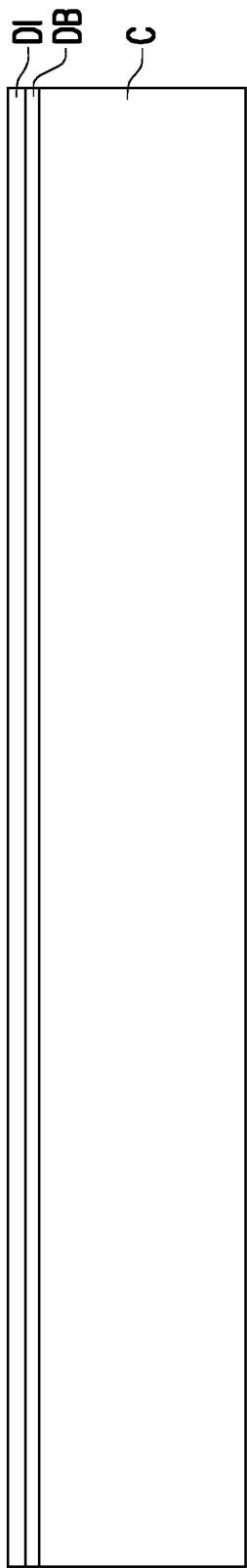
FIG. 6A to FIG. 6J are schematic cross-sectional views illustrating a method of manufacturing a package structure according to a sixth embodiment of the disclosure.

Referring to FIG. 6A, a carrier C having a de-bonding layer DB and a dielectric layer DI formed thereon is provided, wherein the de-bonding layer DB is formed between the carrier C and the dielectric layer DI.

Figure 6B:
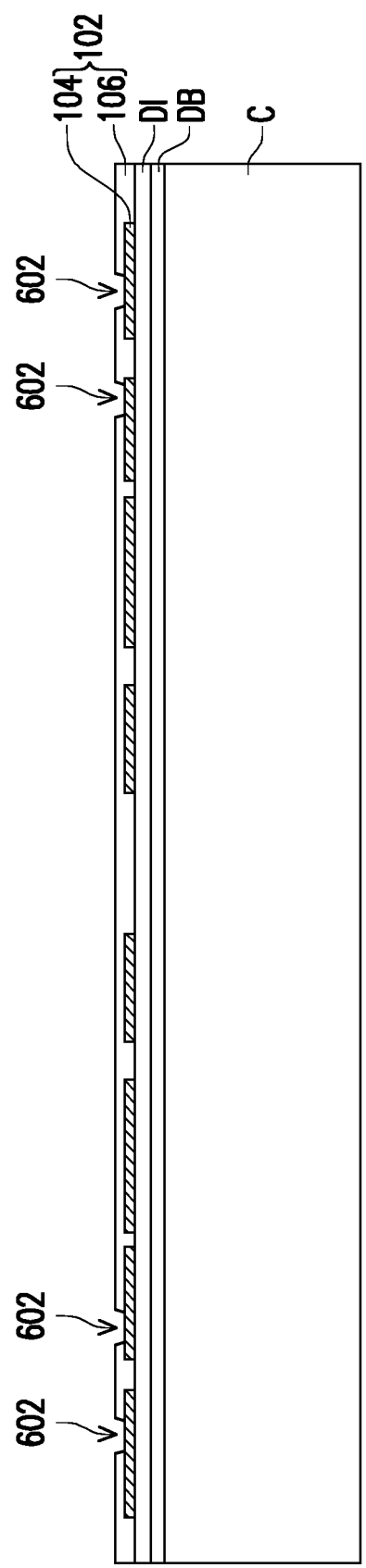

Referring to FIG. 6B, a RDL structure 102 is formed on the dielectric layer DI. A plurality of openings 602 are formed in the dielectric layer 106 of the RDL structure 102 to expose portions of the conductive features 104 of the RDL structure 102 by a laser drilling process or a photolithography and etching processes.

Figure 6C:
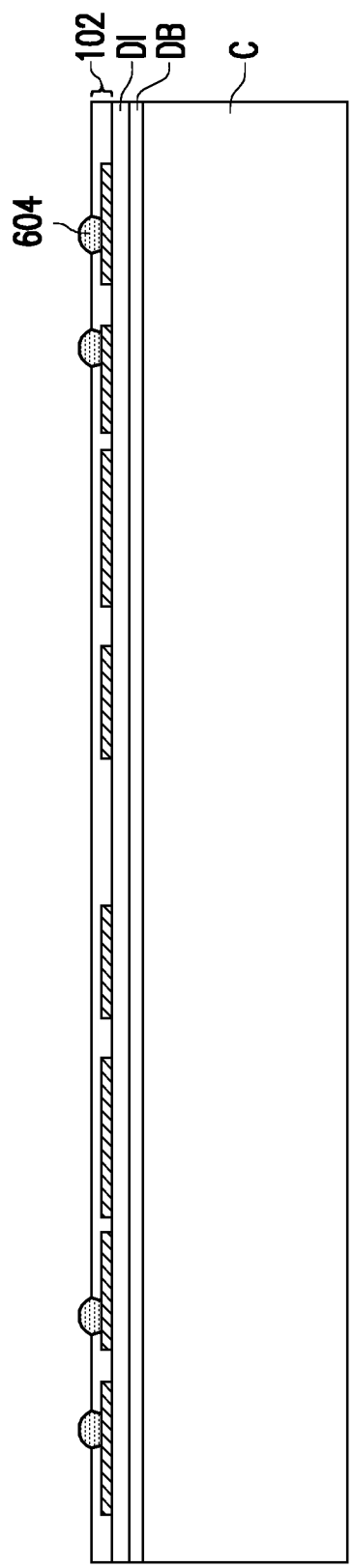

Referring to FIG. 6C, a plurality of solders 604 are respectively formed in the openings 602 by a solder pasting or printing process, but the disclosure is not limited thereto. The solders 604 are in contact with and electrically connected to the portions of the conductive features 104 exposed by the openings 602.

Figure 6D:
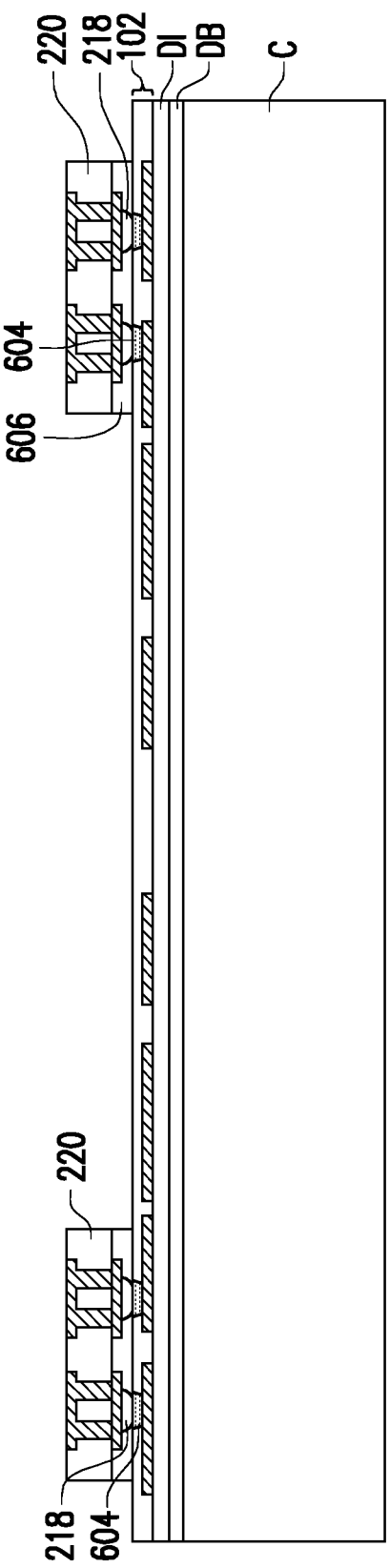

Referring to FIG. 6D, the second passive devices 220 are flipped and mounted on the RDL structure 102 through the solders 604 and the connectors 218. An underfill layer 606 is formed to laterally encapsulate the solders 604 and the connectors 218. In some embodiments, the underfill layer 606 may be any acceptable material, such as a polymer, epoxy, molding underfill, or the like. The underfill layer 606 may be formed by a capillary flow process after the second passive devices 220 are attached or may be formed by a suitable deposition method before second passive devices 220 are attached. Although only two second passive devices 220 illustrated in FIG. 6D, the embodiments of the present invention are not limited thereto. In some embodiments, one or more second passive devices 220 are mounted on the RDL structure 102.

Figure 6E:
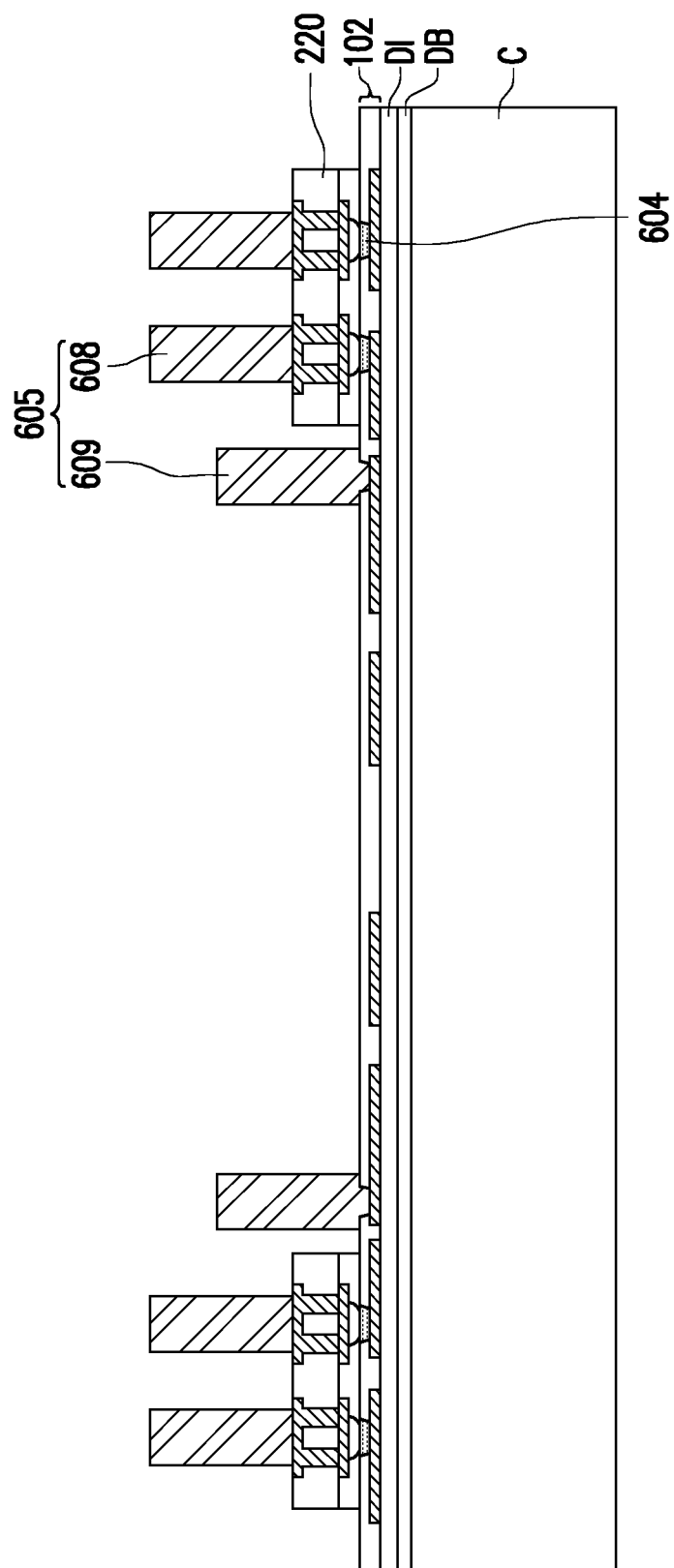

Referring to FIG. 6E, a plurality of TIVs 605 are formed on the RDL structure 102 and the second passive devices 220 by photolithography, plating, and photoresist stripping process. For example, the TIVs 605 include copper posts. In detail, the TIVs 605 includes TIVs 608 and 609. The TIVs 608 are directly formed on and electrically connected to the second passive devices 220, and the TIVs 609 are directly formed on and electrically connected to the RDL structure 102. In the case, the second passive devices 220 are disposed between and electrically connect the TIVs 608 and the RDL structure 102.

Figure 6F:
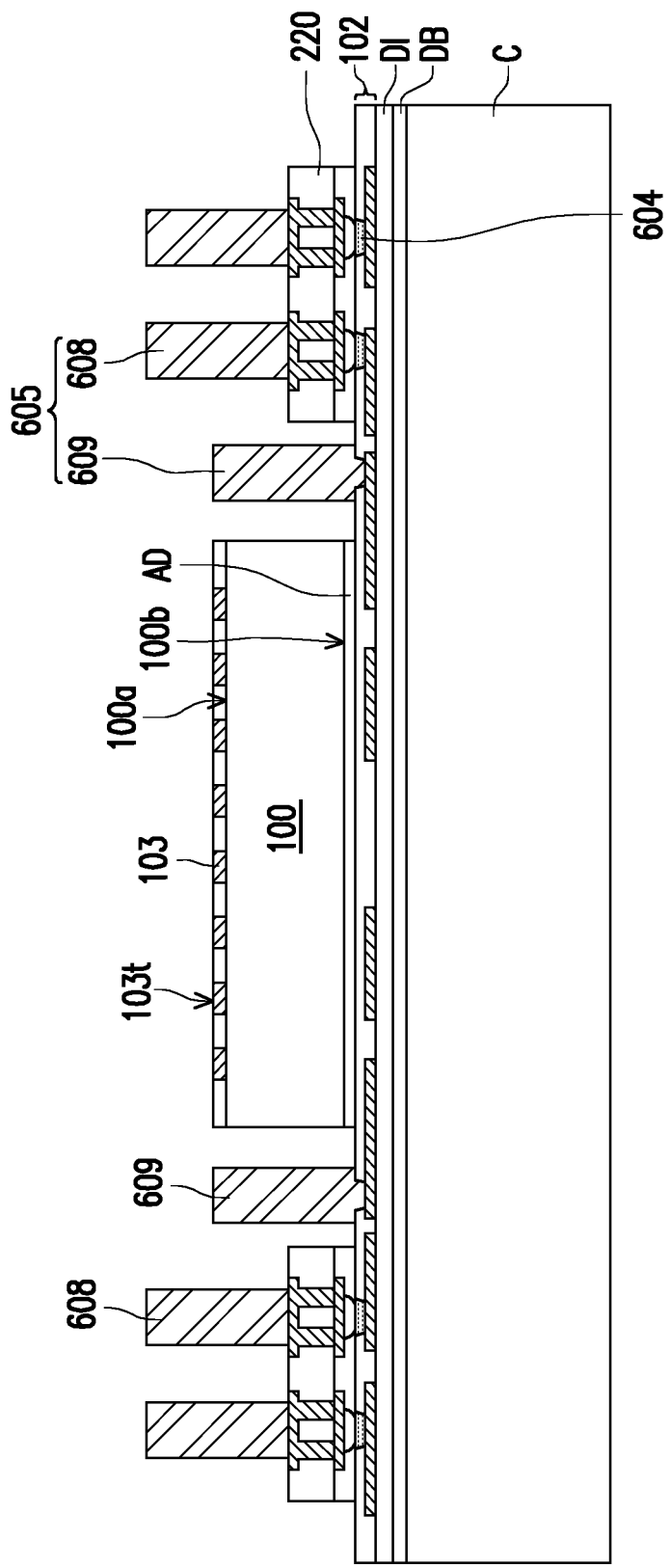

Referring to FIG. 6F, the die 100 is picked and placed on the RDL structure 102 through an adhesive layer AD. The TIVs 609 are laterally disposed between the die 100 and the second passive devices 220. In the case, the front side 100a of the die 100 faces up, while the backside 100b of the die 100 faces toward the RDL structure 102 and in contact with the adhesive layer AD. In some embodiments, the RDL structure 102 is referred to as a backside RDL (BSRDL) structure.

Figure 6G:
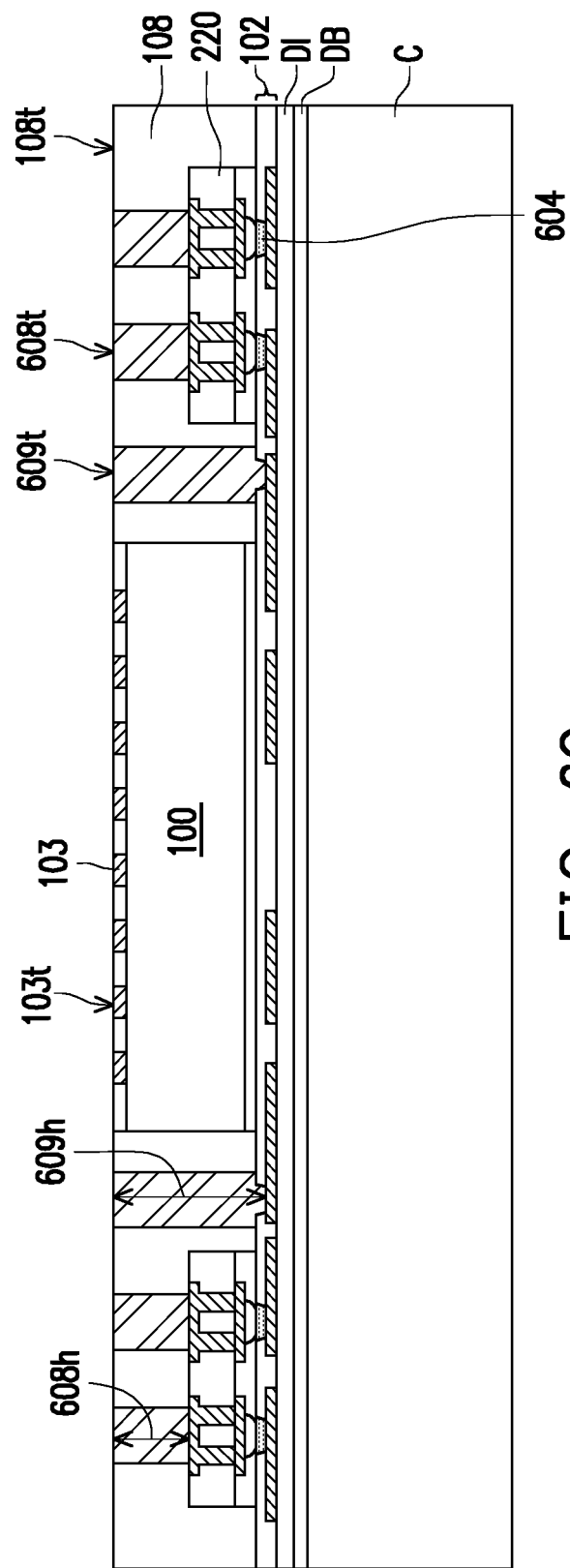

Referring to FIG. 6F and FIG. 6G, after the die 100 is placed on the RDL structure 102, an encapsulant 108 is formed to laterally encapsulate the die 100 and the TIVs 605. The encapsulant 108 may be formed by a sequence of an over-molding process and a planarizing process. For example, an encapsulation material (not shown) is formed over the carrier C to fill in the gaps between the die 100 and TIVs 605, and encapsulate the die 100 and the TIVs 605. In addition, the encapsulation material further covers the top surfaces of the die 100 and the TIVs 605. The planarizing process is performed on the encapsulation material until top surfaces 103t of the contacts 103 of the die 100 are exposed. In the case, the top surface 103t of the contacts 103, top surfaces 608t of the TIVs 608, top surfaces 609t of the TIVs 609, and a top surface 108t of the encapsulant 108 are coplanar after performing the planarizing process. In some embodiments, the planarizing process includes a mechanical grinding process and/or a chemical mechanical polishing (CMP) process. In FIG. 6G, a height 608h of the TIVs 608 is less than a height 609 of the TIVs 609 after performing the planarizing process.

Figure 6H:
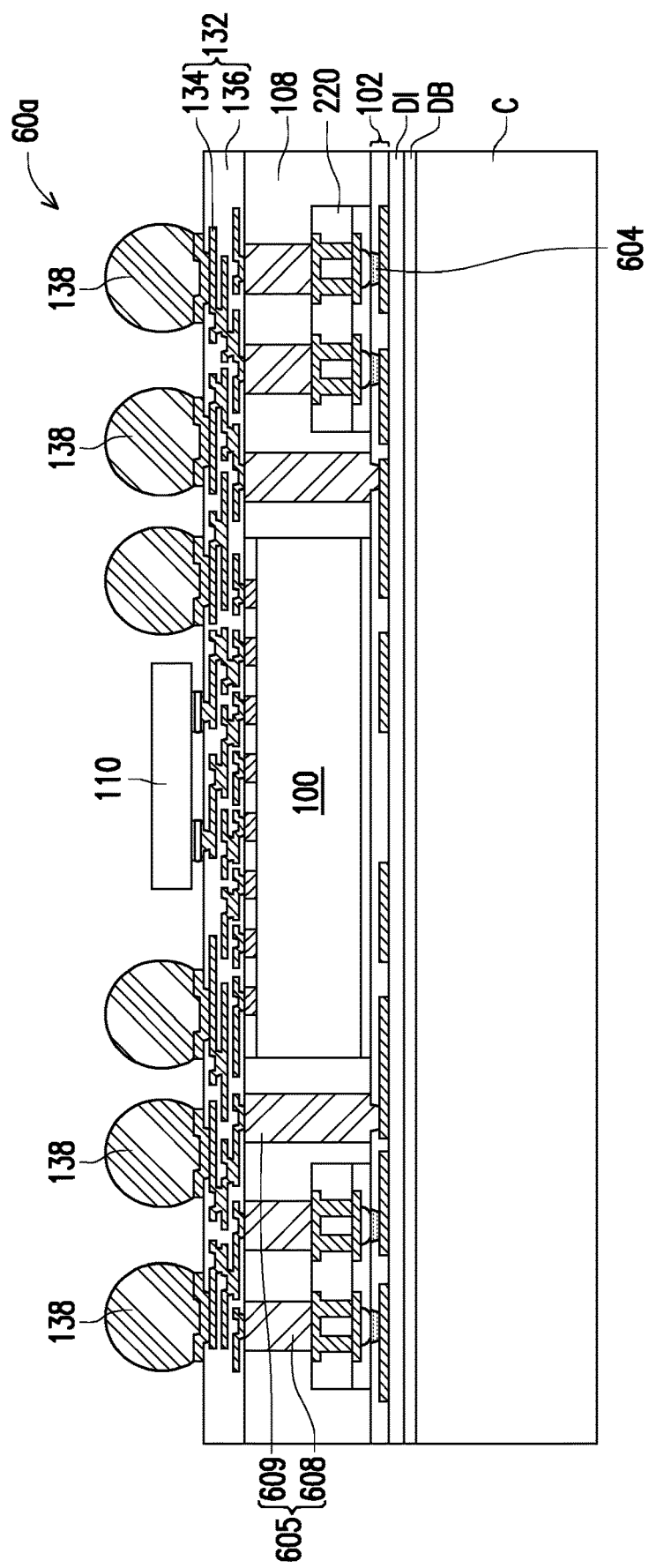

Referring to FIG. 6H, the RDL structure 132 is then formed on the die 100, the TIVs 605 and the encapsulant 108. A plurality of conductive connectors 138 are formed on and electrically connected to the RDL structure 132. Optionally, the first passive device 110 is formed on and electrically connected to the RDL structure 132. In some embodiments, the RDL structure 132 is referred to as a front side RDL (FSRDL) structure.

Figure 6I:
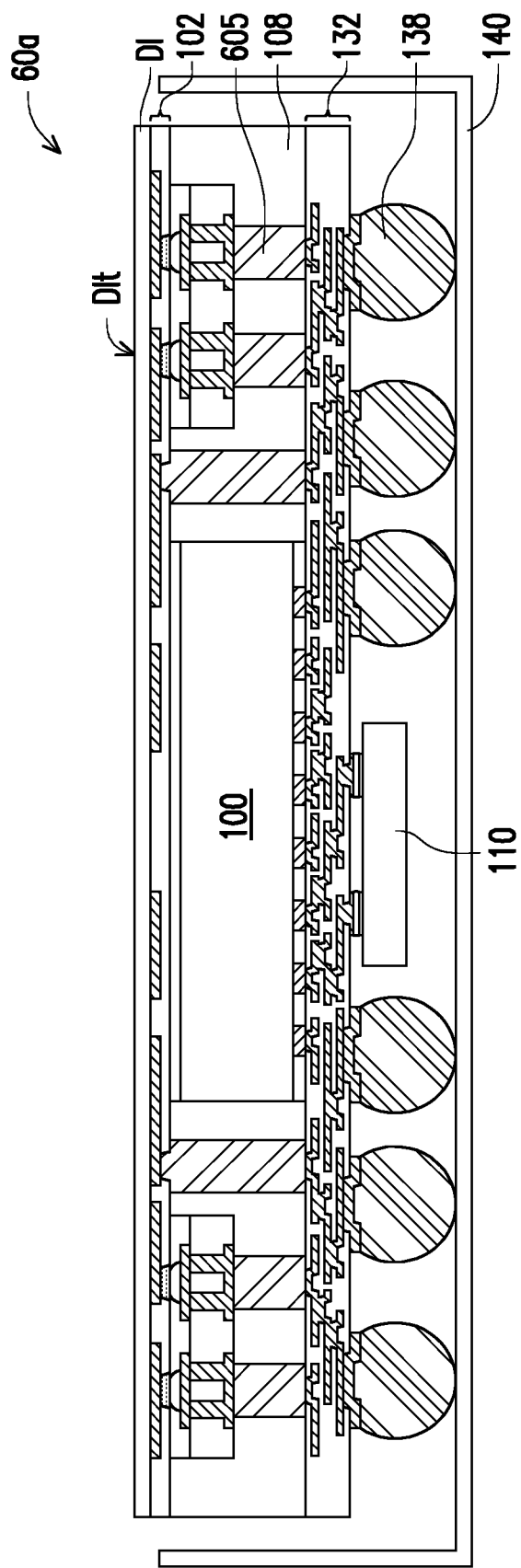

Referring to FIG. 6H and FIG. 6I, a structure 60a illustrated in FIG. 6H is flipped and mounted on the frame 140 by the conductive connectors 138. The carrier C and the de-bonding layer DB are detached from the structure 60a and then removed. In the case, as shown in FIG. 6I, a top surface DIt of the dielectric layer DI is exposed.

Figure 6J:
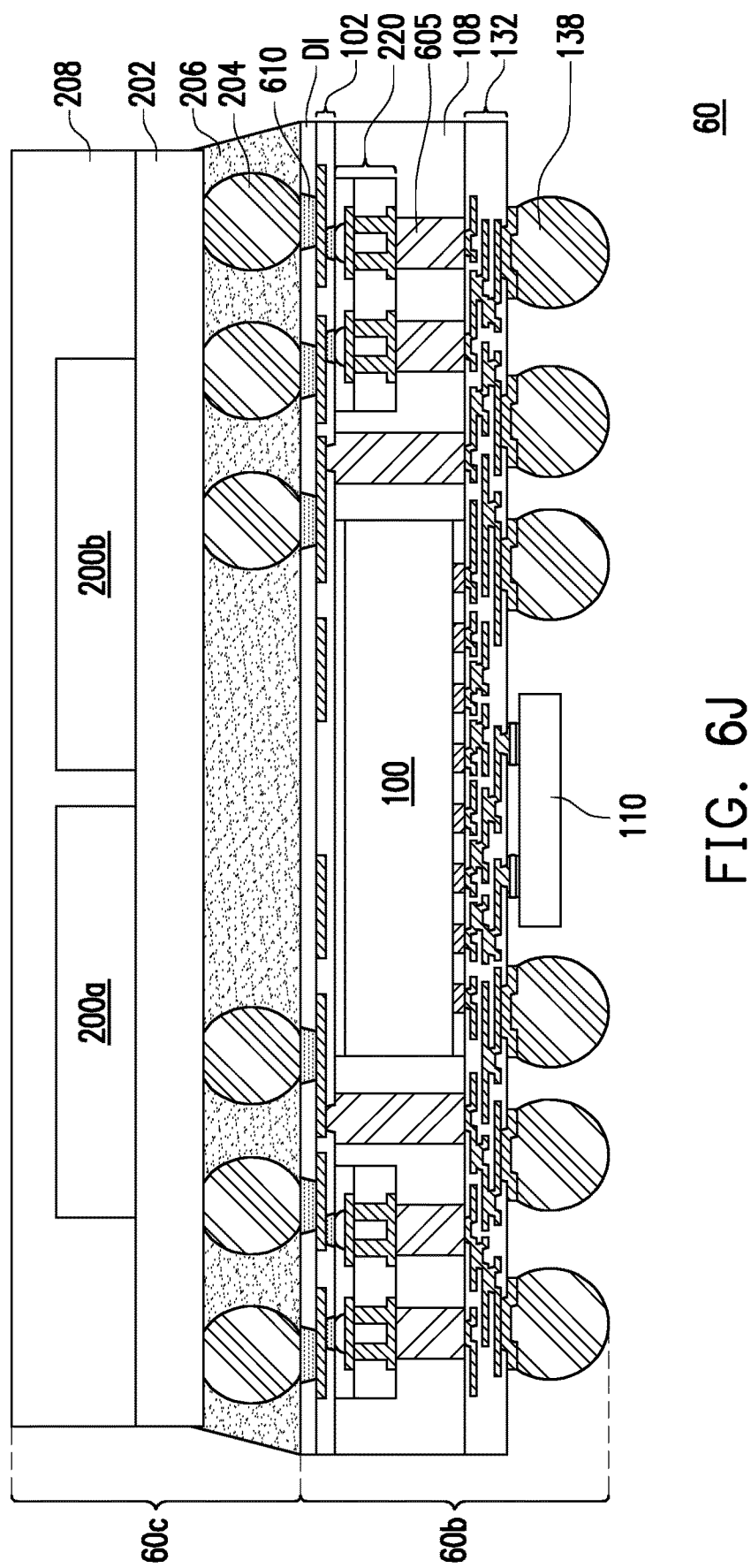

Referring to FIG. 6I and FIG. 6J, the dielectric layer DI is patterned to form a plurality of openings (not shown) by a laser drilling process or a photolithography and etching processes. A plurality of solders 610 are respectively formed in the openings by a solder pasting, a printing process, or a suitable process. Another package (or upper package) 60c is bonded to a package (or bottom package) 60b through a plurality of conductive connectors 204 and the solders 610. The arrangement and forming method of the upper package 60c are similar to the arrangement and forming method of the upper package 10c illustrated in above embodiments. Thus, details thereof are omitted here. After removing the frame 140, a package structure 60 is accomplished, as shown in FIG. 6J.

In FIG. 6J, the upper package 60c is formed on the RDL structure (or BSRDL structure) 102, and the BSRDL structure 102 is disposed between the die 100 and the upper package 60c and between the second passive devices 220 and the upper package 60c. The upper package 60c is electrically connected to the second passive devices 220 through the conductive connectors 204 and BSRDL structure 102. In addition, the second passive devices 220 are closer to the upper package 60c than the first passive device 110. Therefore, the equivalent series resistance (ESR) and/or the equivalent series inductance (ESL) between the upper package 60c and the second passive devices 220 are decrease. As a result, the second passive devices 220 are able to provide a high quality power distribution network (PDN) and a fast date rate for the high bandwidth memory, such as low power double-data-rate (LPDDR).

FIG. 7A to FIG. 7K are schematic cross-sectional views illustrating a method of manufacturing a package structure according to a seventh embodiment of the disclosure.

Referring to FIG. 7A, a carrier C having a de-bonding layer DB and a dielectric layer DI formed thereon is provided, wherein the de-bonding layer DB is formed between the carrier C and the dielectric layer DI.

Referring to FIG. 7B, a RDL structure 102 is formed on the dielectric layer DI. A plurality of TIVs 105 are formed on the RDL structure 102 by photolithography, plating, and photoresist stripping process.

Figure 7C:
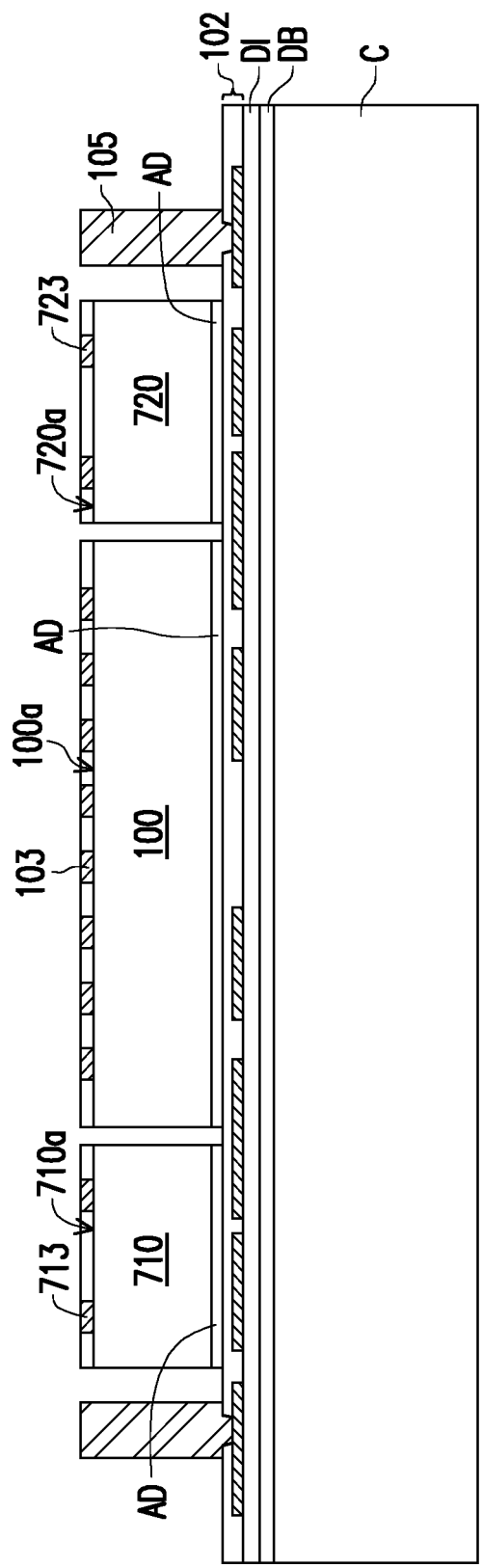

Referring to FIG. 7C, a die 100, a first passive device 710, and a second passive device 720 are picked and placed on the RDL structure 102 through adhesive layers AD. The die 100 is laterally disposed between the first passive device 710 and the second passive device 720. In the case, a front side 100a of the die 100, a front side 710a of the first passive device 710, and a front side 720a of the second passive device 720 all face up. That is, contacts 103 of the die 100, contacts 713 of the first passive device 710, and contacts 723 of the second passive device 720 face up. In some embodiments, the RDL structure 102 is referred to as a backside RDL (BSRDL) structure.

Figure 7D:
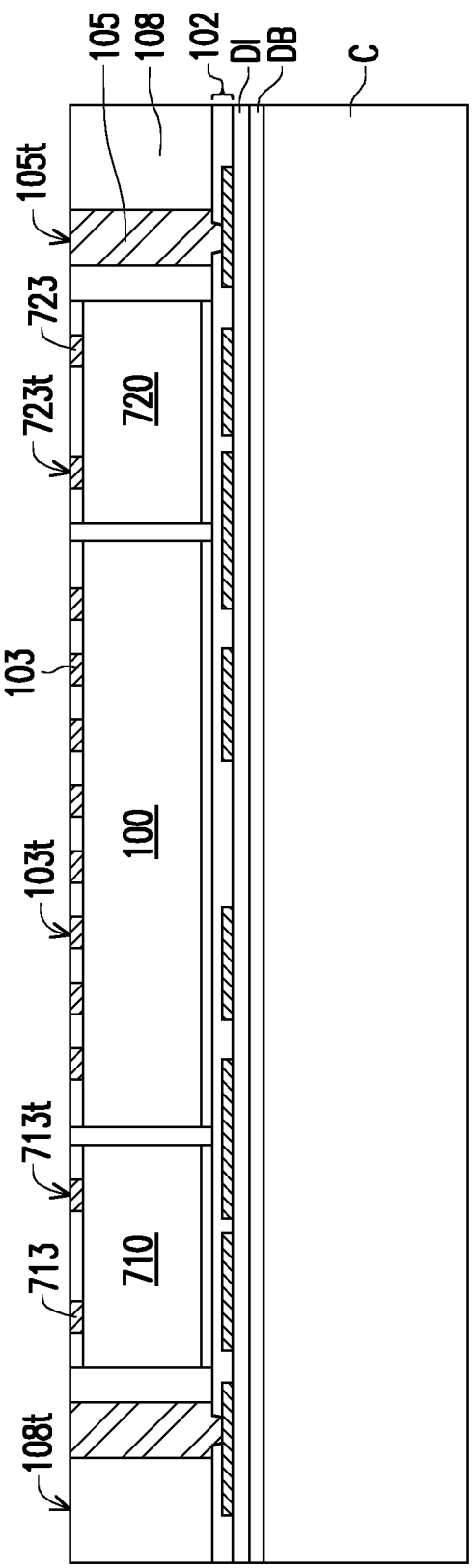

Referring to FIG. 7D, the encapsulant 108 is formed to laterally encapsulate the die 100, the TIVs 105, the first passive device 710, and the second passive device 720. The encapsulant 108 may be formed by a sequence of an over-molding process and a planarizing process. In the case, top surface 103t of the contacts 103, top surfaces 105t of the TIVs 105, a top surface 108t of the encapsulant 108, top surfaces 713t of the contacts 713, and top surfaces 715t of the contacts 715 are coplanar.

Figure 7E:
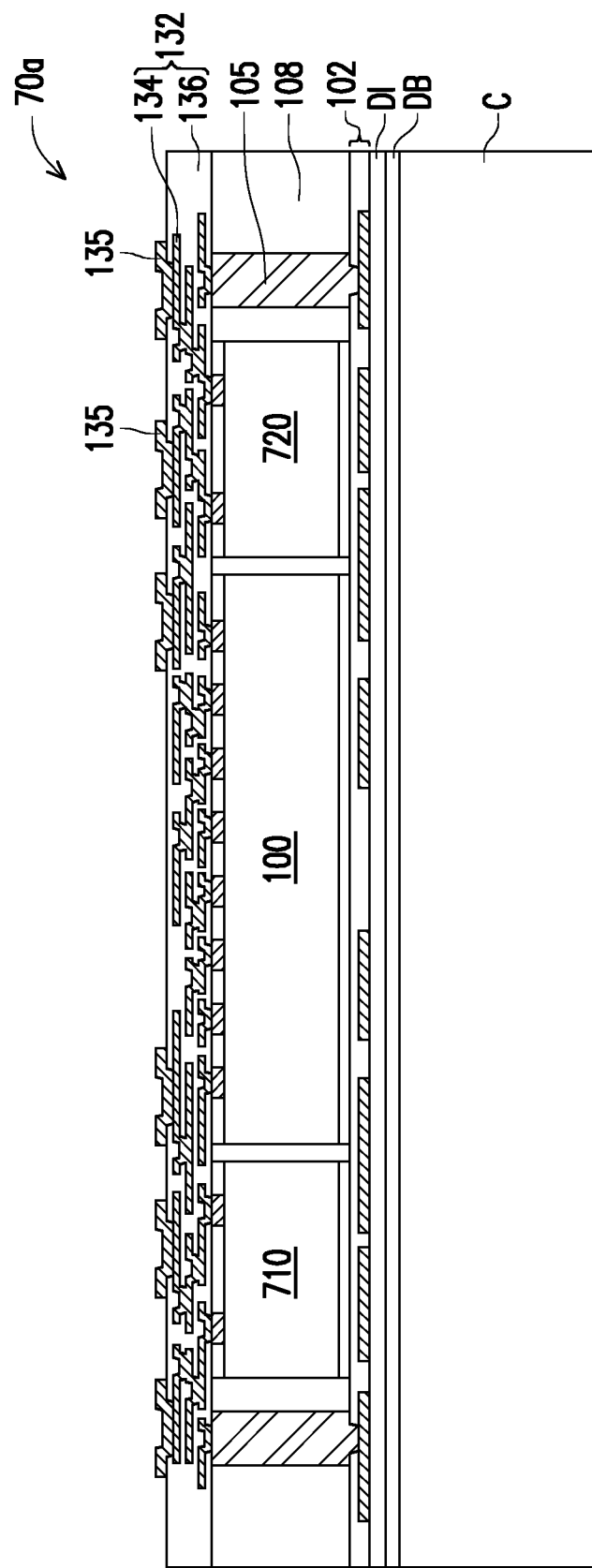

Referring to FIG. 7E, a RDL structure 132 is then formed on the die 100, the TIVs 105, the encapsulant 108, the first passive device 710, and the second passive device 720. In some embodiments, the RDL structure 132 is referred to as a front side RDL (FSRDL) structure. The RDL structure 132 may include a plurality of conductive features 134 embedded in a dielectric layer 136. In some embodiments, the conductive features 134 includes a plurality of traces and vias (not shown) stacked alternately. In addition, the conductive features 134 of the RDL structure 132 may include topmost conductive features 135 exposed by the dielectric layer 136. The topmost conductive features 135 may be referred as under-ball metallurgy (UBM) layer for mounting a plurality of conductive connectors 204 (as shown in FIG. 7J).

Figure 7F:
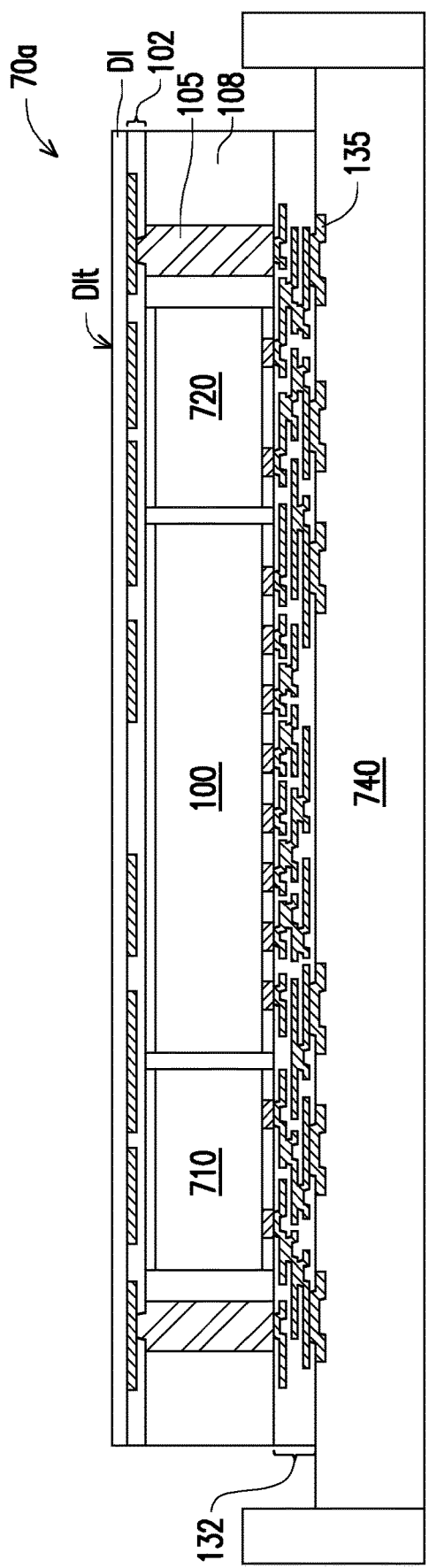

Referring to FIG. 7E and FIG. 7F, a structure 70a illustrated in FIG. 7E is flipped and mounted on a de-bonding carrier 740 by the topmost conductive features 135. In some embodiments, the de-bonding carrier 740 may include a frame and a tape being held tightly by the frame. The tape of the de-bonding carrier 740 helps to provide support such that the carrier C and the de-bonding layer DB may be removed from the structure 70a. After the carrier C and the de-bonding layer DB are detached from the structure 70a, as shown in FIG. 7F, a top surface DIt of the dielectric layer DI is exposed.

Figure 7G:
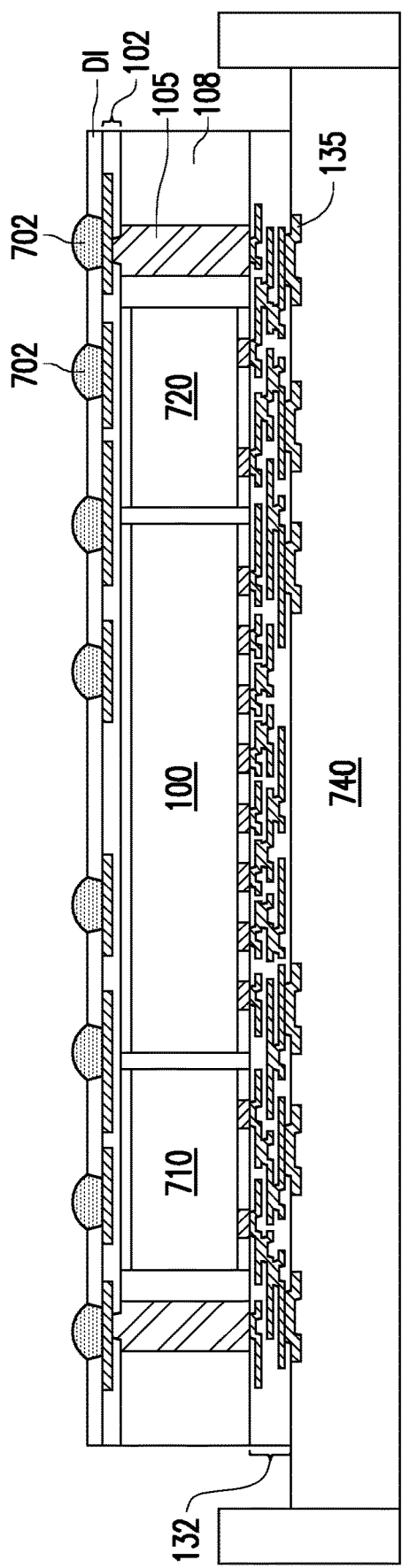
Figure 7J:
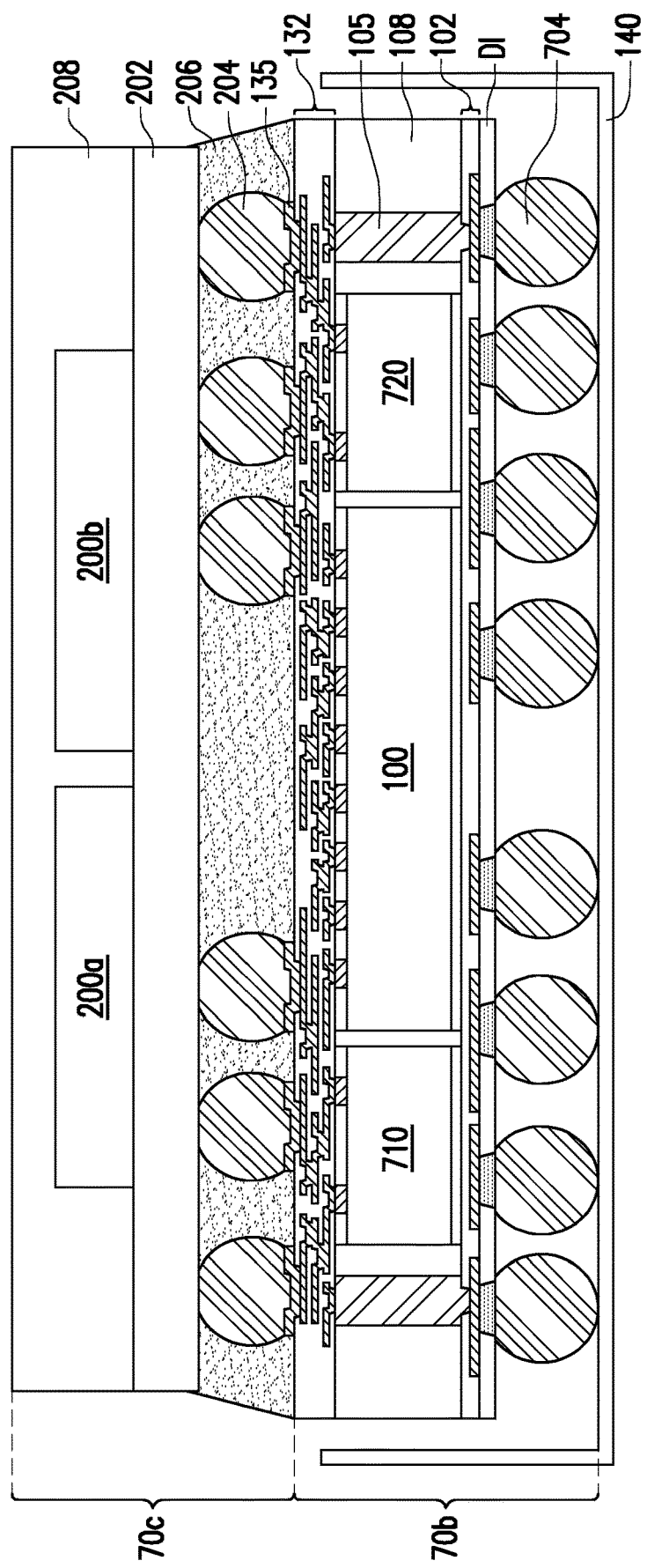

Referring to FIG. 7G, the dielectric layer DI is patterned to form a plurality of openings (not shown) by a laser drilling process or a photolithography and etching processes. The openings (not shown) expose portions of the conductive features 104 of the RDL structure 102. A plurality of solders 702 are respectively formed in the openings (not shown) by a solder pasting or printing process, but the disclosure is not limited thereto. The solders 702 are in contact with the portions of the conductive features 104.

Referring to FIG. 7G and FIG. 7H, a plurality of conductive connectors 704 (also referred to as conductive balls) are formed on and electrically connected to the RDL structure 132 through the solders 702. In some embodiments, the conductive connectors 704 are made of a conductive material with low resistivity, such as Sn, Pb, Ag, Cu, Ni, Bi or an alloy thereof, and are formed by a suitable process such as evaporation, plating, ball drop, screen printing, or a ball mounting process.

Referring to FIG. 7H and FIG. 7I, after the conductive connectors 704 are formed, the structure 70b illustrated in FIG. 7H is separated from the de-bonding carrier 740 and is flipped upside down again to attach to a frame 140. In the case, the topmost conductive features 135 face up, while the conductive connectors 704 is in contact with the frame 140, as shown in FIG. 7I.

Figure 7K:
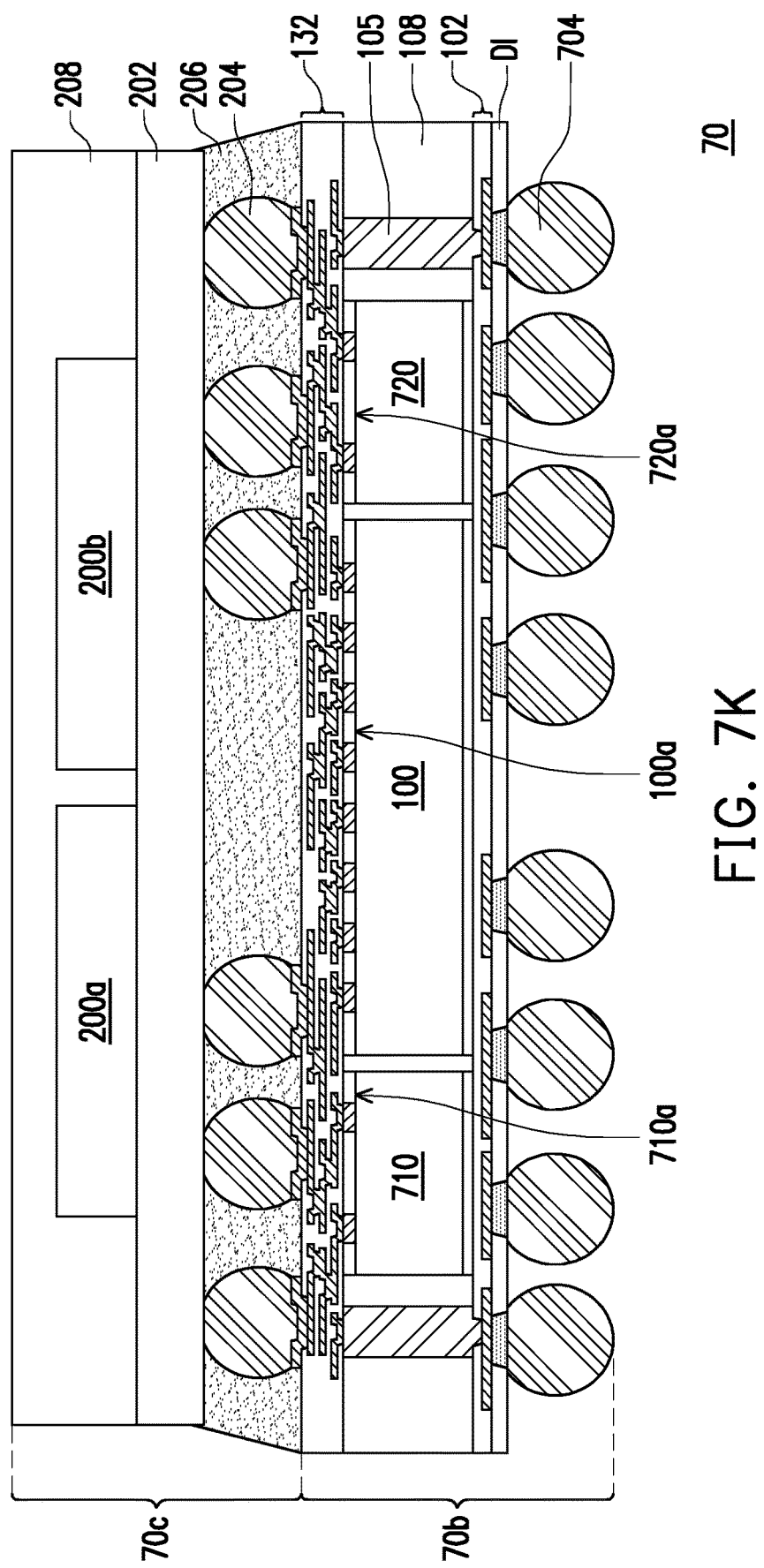

Referring to FIG. 7J and FIG. 7K, another package (or upper package) 70c is bonded to a bottom package 70b through a plurality of conductive connectors 204 and the topmost conductive features 135. The arrangement and forming method of the upper package 70c are similar to the arrangement and forming method of the upper package 10c illustrated in above embodiments. Thus, details thereof are omitted here. After the upper package 70c is bonded to the package 70b, an underfill layer 206 is formed to laterally encapsulate the conductive connectors 204. After the frame 140 is removed, a package structure 70 is accomplished, as shown in FIG. 7K.

In FIG. 7K, the upper package 70c is formed on the RDL structure (or FSRDL structure) 132, and the FSRDL structure 132 is disposed between the die 100 and the upper package 70c. The upper package 70c is electrically connected to the first passive device 710 and the second passive device 720 through the conductive connectors 204 and FSRDL structure 132. In some embodiments, the front side 100a of the die 100, the front side 710a of the first passive device 710, and the front side 720a of the second passive device 720 face toward the upper package 70c. In the case, the equivalent series resistance (ESR) and/or the equivalent series inductance (ESL) between the upper package 70c and the first passive device 710 and the second passive device 720 are decrease. As a result, the first passive device 710 and the second passive device 720 are able to provide a high quality power distribution network (PDN) and a fast date rate for the high bandwidth memory, such as low power double-data-rate (LPDDR).

FIG. 8A to FIG. 8L are schematic cross-sectional views illustrating a method of manufacturing a package structure according to an eighth embodiment of the disclosure.

Referring to FIG. 8A, a carrier C having a de-bonding layer DB and a dielectric layer DI formed thereon is provided, wherein the de-bonding layer DB is formed between the carrier C and the dielectric layer DI.

Referring to FIG. 8B, a RDL structure 102 is formed on the dielectric layer DI. A plurality of TIVs 105 are formed on the RDL structure 102 by photolithography, plating, and photoresist stripping process.

Figure 8C:
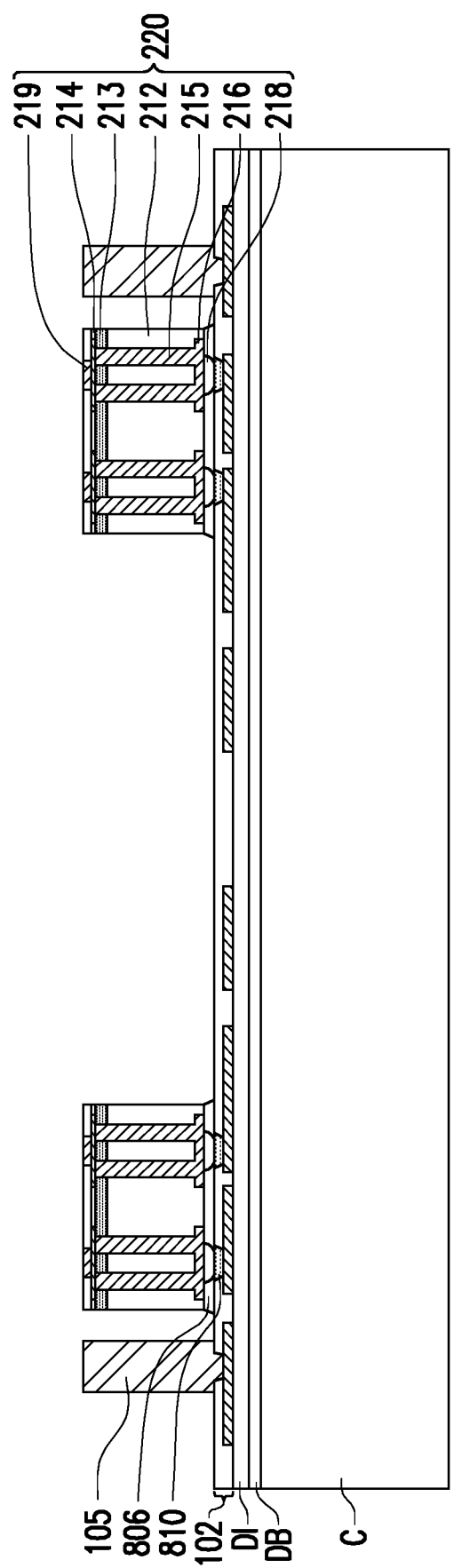

Referring to FIG. 8C, the dielectric layer 106 of the RDL structure 102 is patterned to form a plurality of openings (not shown) by a laser drilling process or a photolithography and etching processes. The openings (not shown) expose portions of the conductive features 104 of the RDL structure 102. A plurality of solders 810 are respectively formed in the openings (not shown) by a solder pasting or printing process, but the disclosure is not limited thereto. The second passive devices 220 are picked and placed on the RDL structure 102 through the connectors 218 and the solders 810. In the case, the second passive device 220 includes device regions 213 and pads 216. The device regions 213 of the second passive device 220 face up, while pads 216 of the second passive device 220 face down. In addition, the second passive device 220 further includes a plurality of through semiconductor vias (TSVs) 215 and a plurality of contacts 219. The TSVs 215 penetrates through the substrate 212 and in contact with the interconnect structure 214. The plurality of contacts 219 is disposed on and in contact with the interconnect structure 214.

After the second passive device 220 are mounted on the RDL structure 102, an underfill layer 806 is formed to laterally encapsulate the connectors 218. In some embodiments, the underfill layer 806 may be any acceptable material, such as a polymer, epoxy, molding underfill, or the like. The underfill layer 806 may be formed by a capillary flow process after the second passive devices 220 are attached or may be formed by a suitable deposition method before second passive devices 220 are attached. Although only two second passive devices 220 illustrated in FIG. 8C, the embodiments of the present invention are not limited thereto. In some embodiments, one or more second passive devices 220 are mounted on the RDL structure 102.

Figure 8D:
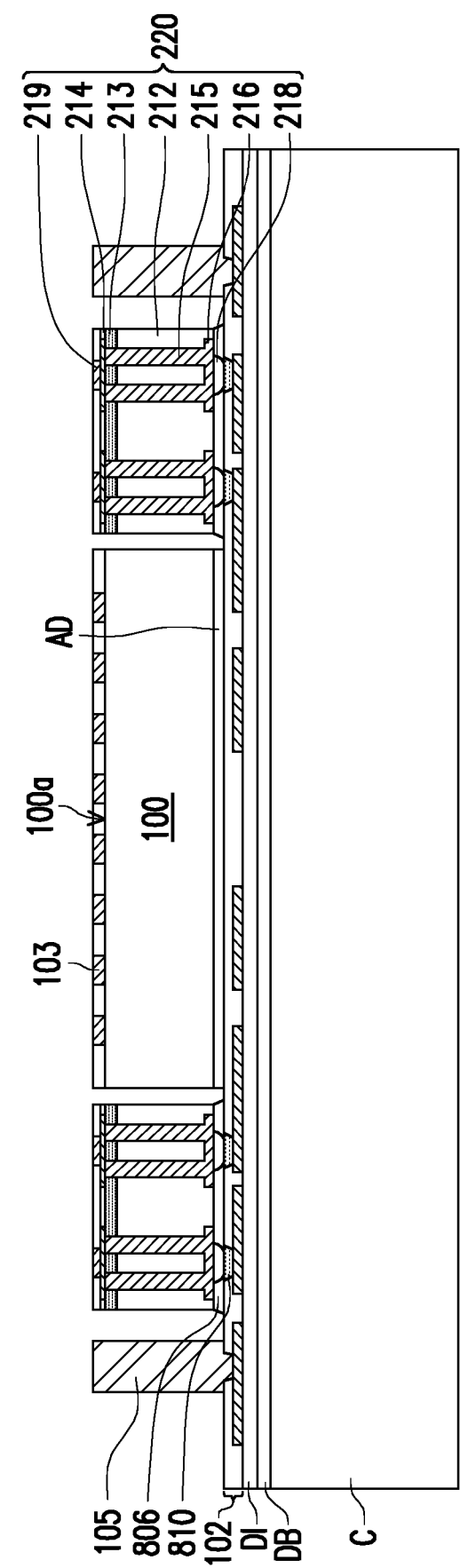

Referring to FIG. 8D, the die 100 is picked and placed on the RDL structure 102 through an adhesive layer AD. In the case, the front side 100a of the die 100 faces up and the die 100 is laterally disposed between the second passive devices 220. The TIVs 105 may laterally surround the die 100 and the second passive devices 220.

Figure 8E:
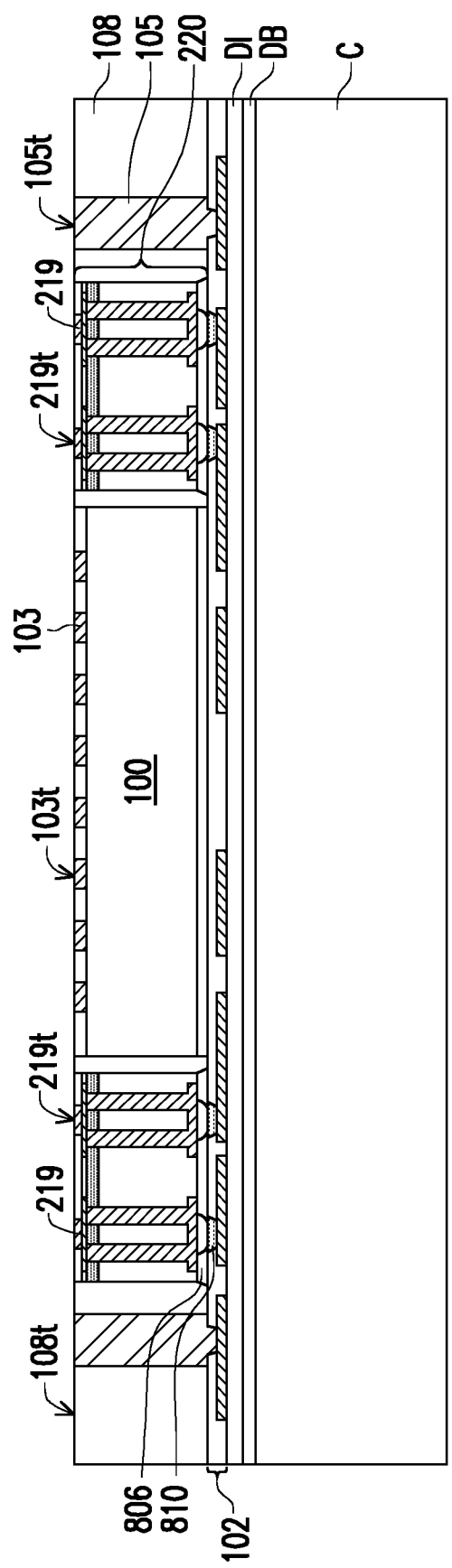

Referring to FIG. 8D and FIG. 8E, after the die 100 is placed on the RDL structure 102, an encapsulant 108 is formed to laterally encapsulate the die 100, the second passive devices 220, and the TIVs 105. The encapsulant 108 may be formed by a sequence of an over-molding process and a planarizing process. For example, an encapsulation material (not shown) is formed over the carrier C to fill in the gaps between the die 100 and the second passive devices 220, and between the second passive devices 220 and TIVs 105, and encapsulate the die 100, the second passive devices 220, and the TIVs 105. In addition, the encapsulation material further covers the top surfaces of the die 100, the second passive devices 220, and the TIVs 105. The planarizing process is performed on the encapsulation material until top surfaces 103t of the contacts 103 of the die 100 and top surfaces 219t of the contacts 219 are exposed. In the case, the top surfaces 103t of the contacts 103, the top surfaces 219*t* of the contacts 219, top surfaces 105*t* of the TIVs 105, and a top surface 108*t* of the encapsulant 108 are coplanar after performing the planarizing process. In some embodiments, the planarizing process includes a mechanical grinding process and/or a chemical mechanical polishing (CMP) process.

Figure 8F:
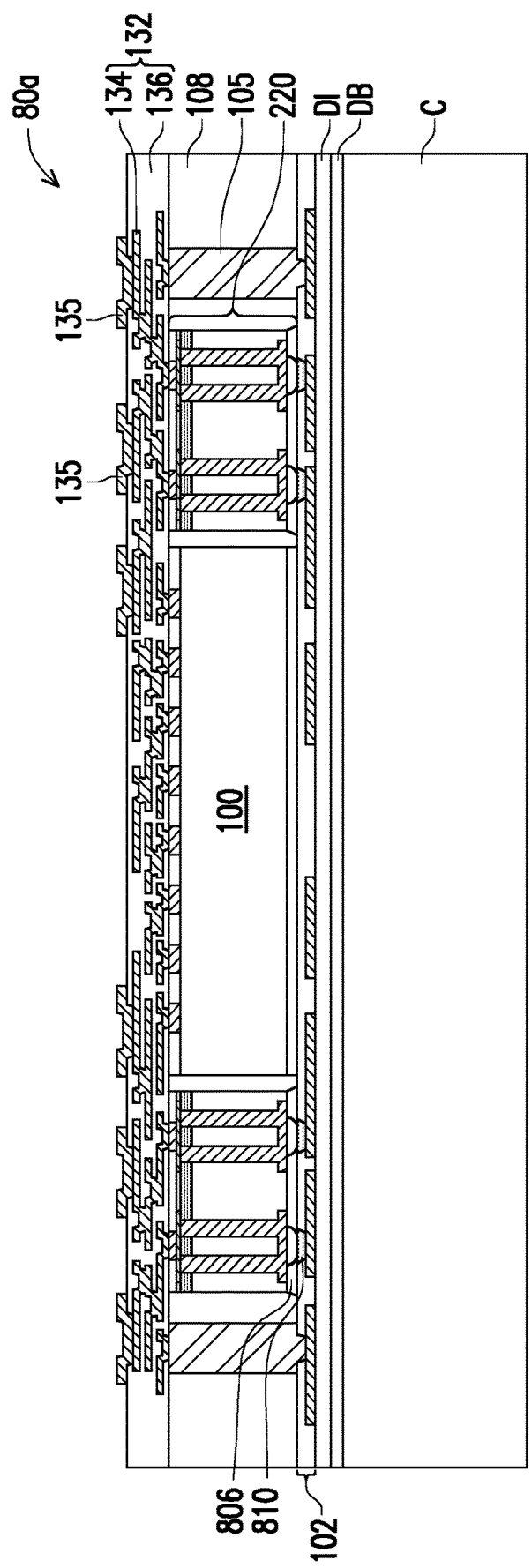

Referring to FIG. 8F, a RDL structure 132 is then formed on the die 100, the TIVs 105, the encapsulant 108, and the second passive devices 220. The RDL structure 132 may include a plurality of conductive features 134 embedded in a dielectric layer 136. In some embodiments, the conductive features 134 includes a plurality of traces and vias stacked alternately. In addition, the conductive features 134 of the RDL structure 132 may include topmost conductive features 135 exposed by the dielectric layer 136. The topmost conductive features 135 may be referred as under-ball metallurgy (UBM) layer for mounting a plurality of conductive connectors 204 (as shown in FIG. 8K).

Figure 8G:
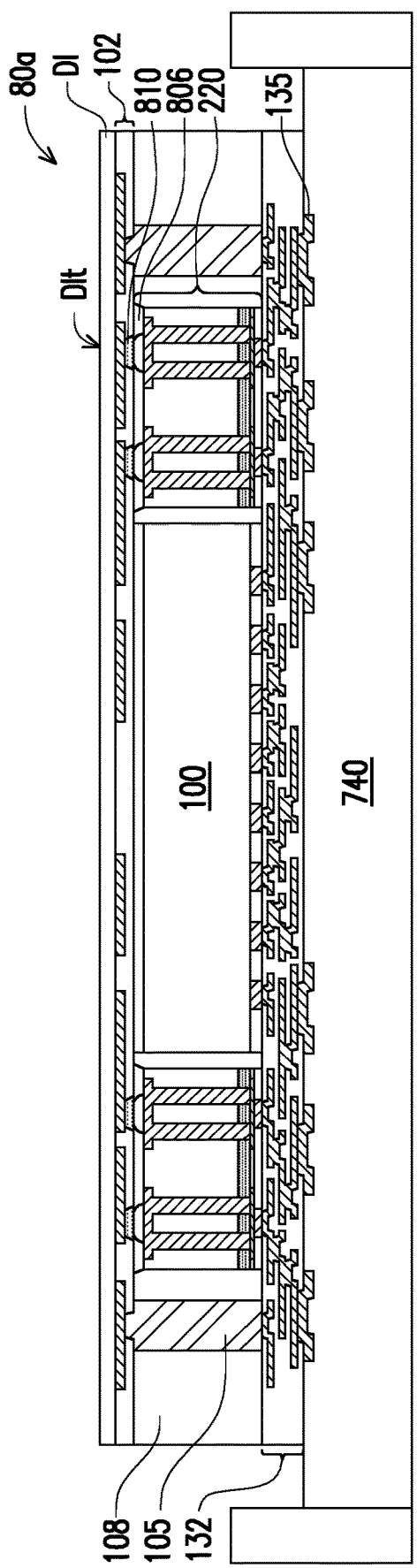

Referring to FIG. 8F and FIG. 8G, a structure 80*a* illustrated in FIG. 8F is flipped and mounted on a de-bonding carrier 740 by the topmost conductive features 135. In some embodiments, the de-bonding carrier 740 may include a frame and a tape being held tightly by the frame. The tape of the de-bonding carrier 740 helps to provide support such that the carrier C and the de-bonding layer DB may be removed from the structure 80*a*. After the carrier C and the de-bonding layer DB are detached from the structure 80*a*, as shown in FIG. 8G, a top surface DI*t* of the dielectric layer DI is exposed.

Figure 8H:
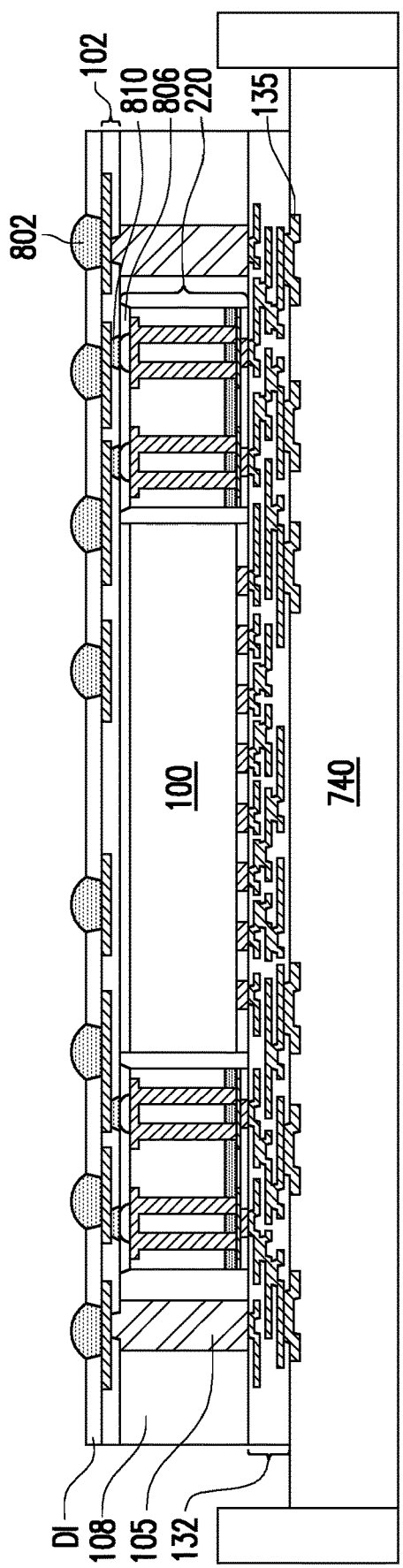
Figure 8K:
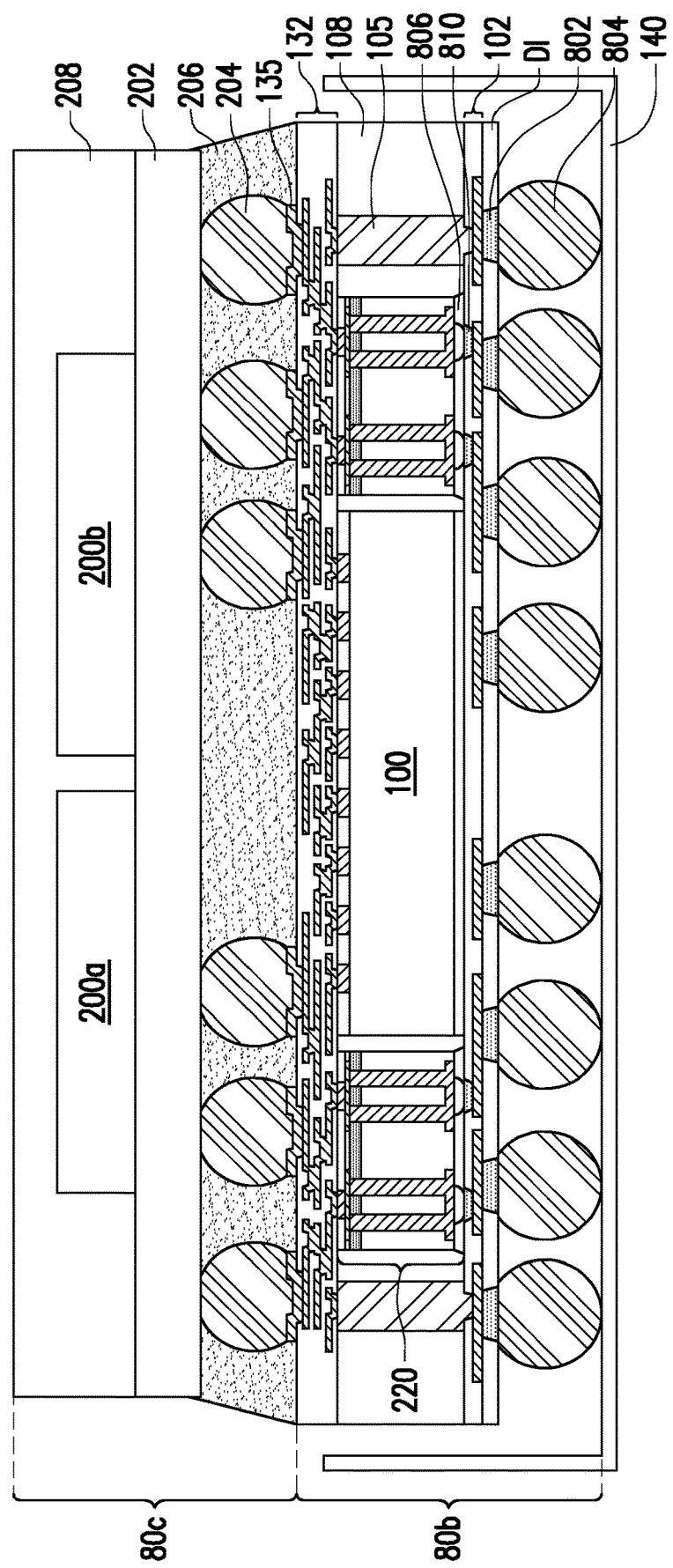

Referring to FIG. 8H, the dielectric layer DI is patterned to form a plurality of openings (not shown) by a laser drilling process or a photolithography and etching processes. The openings (not shown) expose portions of the conductive features 104 of the RDL structure 102. A plurality of solders 802 are respectively formed in the openings (not shown) by a solder pasting or printing process, but the disclosure is not limited thereto. The solders 802 are in contact with the portions of the conductive features 104.

Referring to FIG. 8H, a plurality of conductive connectors 804 (also referred to as conductive balls) are formed on and electrically connected to the RDL structure 132 through the solders 802. In some embodiments, the conductive connectors 804 are made of a conductive material with low resistivity, such as Sn, Pb, Ag, Cu, Ni, Bi or an alloy thereof, and are formed by a suitable process such as evaporation, plating, ball drop, screen printing, or a ball mounting process.

Referring to FIG. 8I and FIG. 8J, after the conductive connectors 804 are formed, the structure 80*b* illustrated in FIG. 8I is separated from the de-bonding carrier 740 and is flipped upside down again to attach to a frame 140. In the case, the topmost conductive features 135 face up, while the conductive connectors 804 is in contact with the frame 140, as shown in FIG. 8J.

Figure 8L:
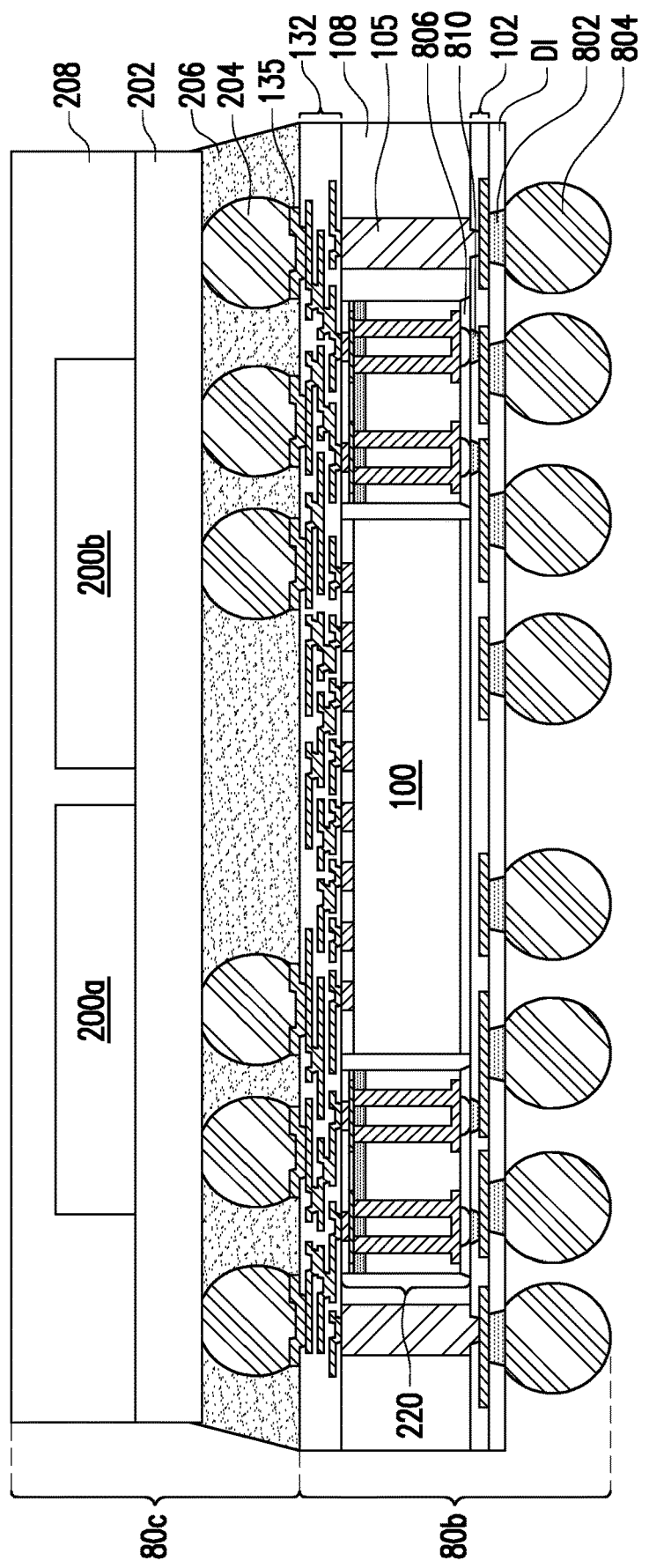

Referring to FIG. 8K and FIG. 8L, another package (or upper package) 80*c* is bonded to a bottom package 80*b* through a plurality of conductive connectors 204 and the topmost conductive features 135. The arrangement and forming method of the upper package 80*c* are similar to the arrangement and forming method of the upper package 10*c* illustrated in above embodiments. Thus, details thereof are omitted here. After the upper package 80*c* is bonded to the package 80*b*, an underfill layer 206 is formed to laterally encapsulate the conductive connectors 204. In FIG. 8L, after the frame 140 is removed, a package structure 80 is accomplished.

In FIG. 8L, the arrangement of the package structure 80 are similar to the arrangement of the package structure 70 illustrated in above embodiments. A difference therebetween lies in that the second passive device 220 of the package structure 80 includes the plurality of through semiconductor vias (TSVs) 215. The TSVs 215 penetrates through the substrate 212, so as to electrically connect to the RDL structures 102 and 132.

In the case, the equivalent series resistance (ESR) and/or the equivalent series inductance (ESL) between the upper package 80*c* and the first passive device 810 and the second passive device 820 are decrease. As a result, the first passive device 810 and the second passive device 820 are able to provide a high quality power distribution network (PDN) and a fast date rate for the high bandwidth memory, such as low power double-data-rate (LPDDR).

FIG. 9A to FIG. 9J are schematic cross-sectional views illustrating a method of manufacturing a package structure according to a ninth embodiment of the disclosure.

Referring to FIG. 9A, a carrier C having a de-bonding layer DB and a dielectric layer DI formed thereon is provided, wherein the de-bonding layer DB is formed between the carrier C and the dielectric layer DI.

Referring to FIG. 9B, a RDL structure 102 is formed on the dielectric layer DI. A plurality of TIVs 105 are formed on the RDL structure 102 by photolithography, plating, and photoresist stripping process.

Figure 9C:
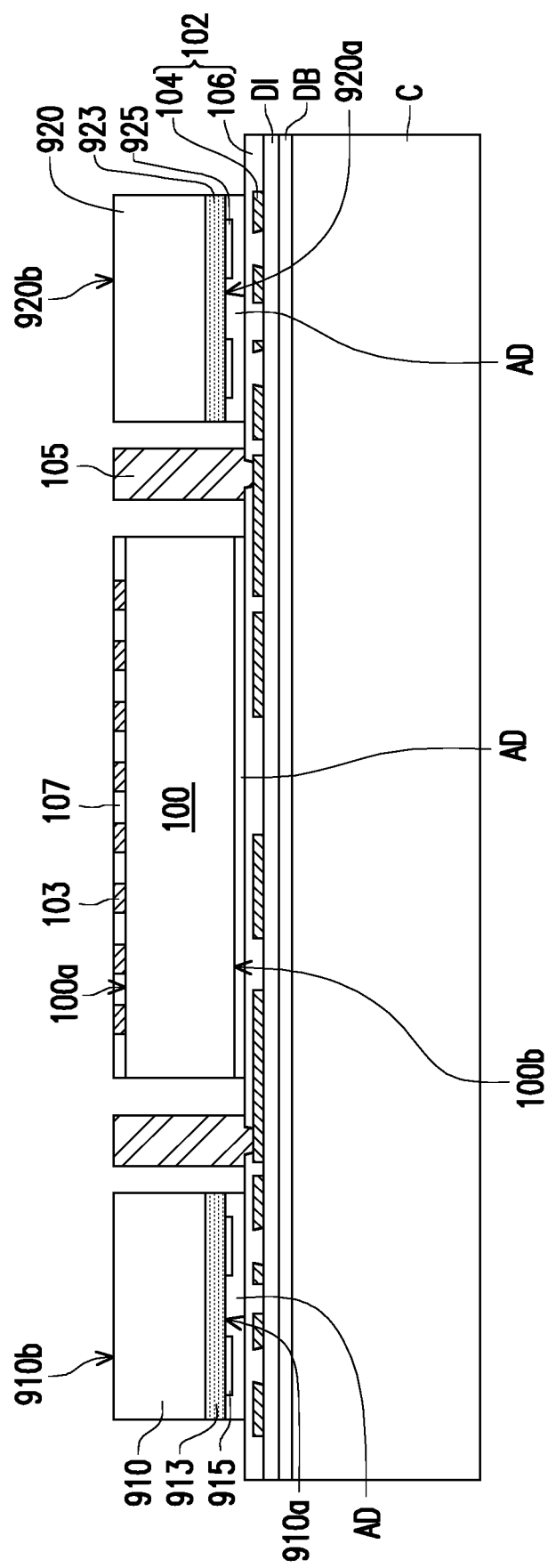

Referring to FIG. 9C, a die 100, two passive devices 910 and 920 are picked and placed on the RDL structure 102 through adhesive layers AD. The TIVs 105 are laterally disposed between the die 100 and the passive device 910 (or the passive device 920). In detail, a front side 100*a* and contacts 103 of the die 100 face up. A front side 910*a*, a device region 913, and contacts 915 of the passive device 910 face down or face toward the RDL structure 102. Similarly, a front side 920*a*, a device region 923, and contacts 925 of the passive device 920 face down or face toward the RDL structure 102. In some embodiments, the RDL structure 102 is referred to as a backside RDL (BSRDL) structure.

Figure 9D:
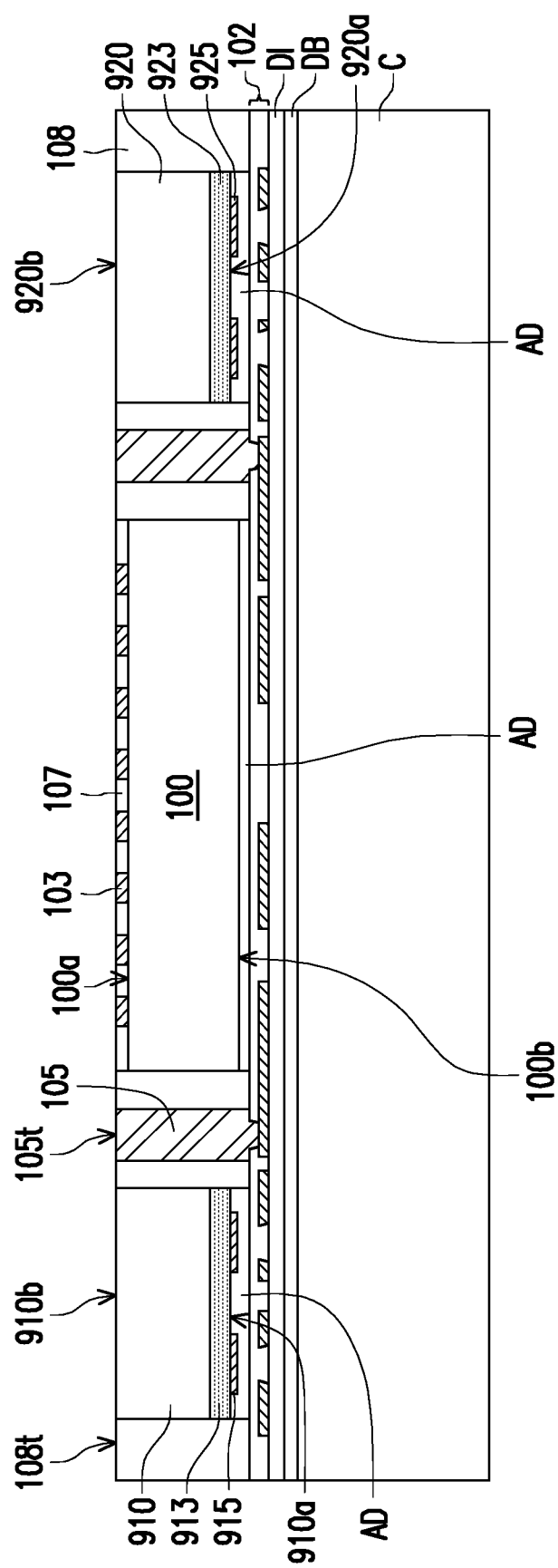

Referring to FIG. 9D, the encapsulant 108 is formed to laterally encapsulate the die 100, the TIVs 105, the passive devices 910 and 920. The encapsulant 108 may be formed by a sequence of an over-molding process and a planarizing process. In the case, top surface 103*t* of the contacts 103, top surfaces 105*t* of the TIVs 105, a top surface 108*t* of the encapsulant 108, a backside 910*b* of the passive device 910, and a backside 920*b* of the passive device 920 are coplanar.

Figure 9E:
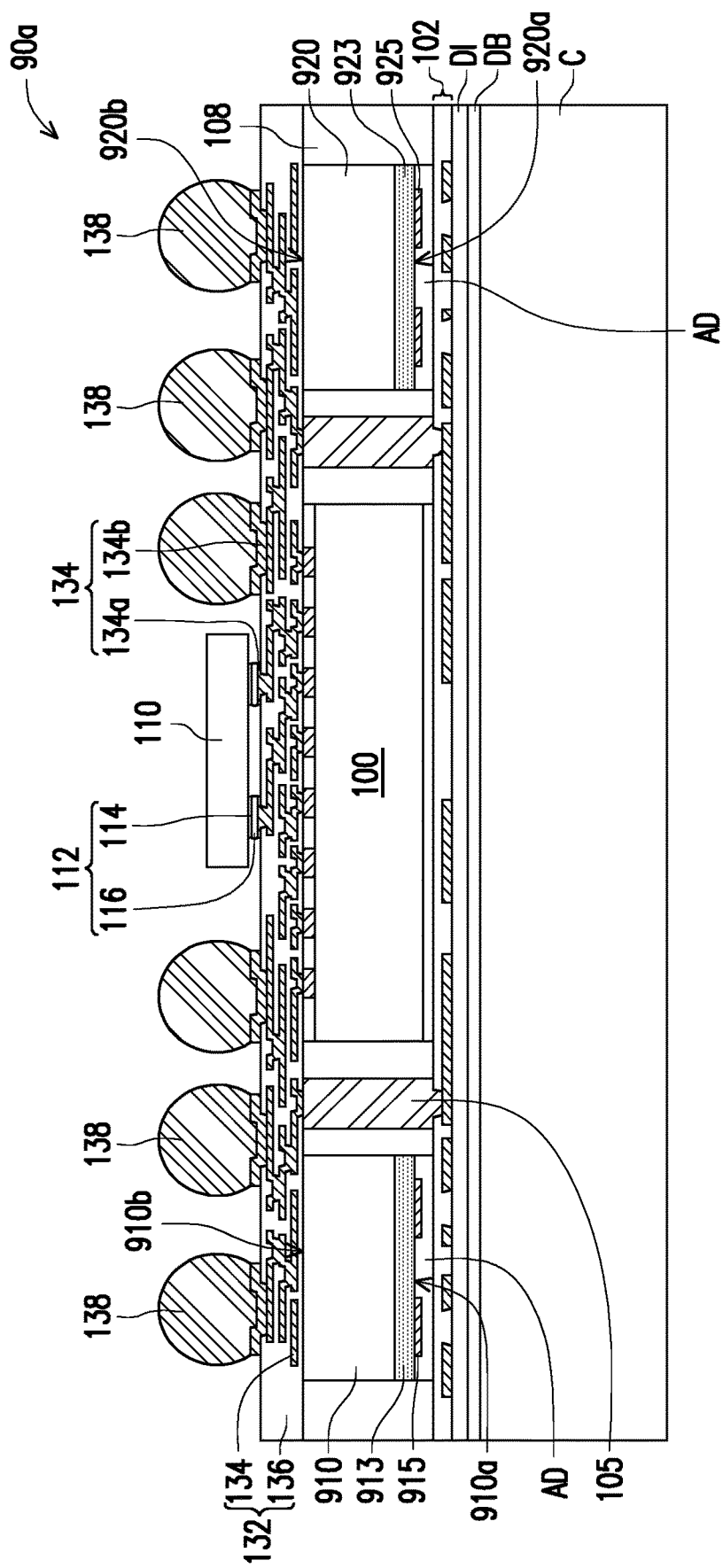

Referring to FIG. 9E, a RDL structure 132 is then formed on the die 100, the TIVs 105, the encapsulant 108, the passive devices 910 and 920. In some embodiments, the RDL structure 132 is referred to as a front side RDL (FSRDL) structure. The RDL structure 132 may include a plurality of conductive features 134 embedded in a dielectric layer 136. In some embodiments, the conductive features 134 includes a plurality of traces and vias (not shown) stacked alternately. In addition, the conductive features 134 of the RDL structure 132 may include topmost conductive features 134*a* and 134*b* exposed by the dielectric layer 136. In detail, the topmost conductive features 134*a* may be metal posts or metal pads for connecting to a first passive device 110. The topmost conductive features 134*b* may be referred as under-ball metallurgy (UBM) layer for mounting a plurality of conductive connectors 138.

After the RDL structure 132 is formed, the first passive device 110 is formed on the RDL structure 132 through the topmost conductive features 134*a* and connectors 112. As shown in FIG. 9E, the connectors 112 are micro-bumps containing copper posts 114 and solder caps 116, but the disclosure is not limited thereto, and other conductive structures such as solder bumps, gold bumps or metallic bumps may also be used as the connectors 112. After the first passive device 110 is mounted on the RDL structure 132, the conductive connectors 138 (also referred to as conductive balls) are formed on the topmost conductive features 134b (e.g., the UBM layer).

Referring to FIG. 9E and FIG. 9F, a structure 90a illustrated in FIG. 9E is flipped and mounted on the frame 140 by the conductive connectors 138. The carrier C and the de-bonding layer DB are detached from the structure 90a and then removed. In the case, as shown in FIG. 9F, a top surface DIt of the dielectric layer DI is exposed. In some embodiments, the de-bonding layer DB (e.g., the LTHC release layer) is irradiated with a UV laser so that the carrier C and the de-bonding layer DB are easily peeled off from the structure 10a. Nevertheless, the de-bonding process is not limited thereto, and other suitable de-bonding methods may be used in some alternative embodiments.

Referring to FIG. 9F and FIG. 9G, the dielectric layer DI, the RDL structure 102, and the adhesive layer AD are patterned to form a plurality of openings 941 and 942, and the dielectric layer DI is patterned to form a plurality of openings 943. In detail, as shown in FIG. 1G, the openings 941 penetrates through the dielectric layer DI, the RDL structure 102, and the adhesive layer AD to expose one portion of the contacts 915 of the passive device 910. The openings 942 penetrates through the dielectric layer DI, the RDL structure 102, and the adhesive layer AD to expose one portion of the contacts 925 of the passive device 920. The openings 943 penetrates through the dielectric layer DI to expose one portion of the conductive features 104 of the RDL structure 102. In some embodiments, the openings 941, 942, and 943 are formed by a laser drilling process or a photolithography and etching processes. In some alternative embodiments, widths of the openings 941, 942, and 943 may be the same or different.

Figure 9H:
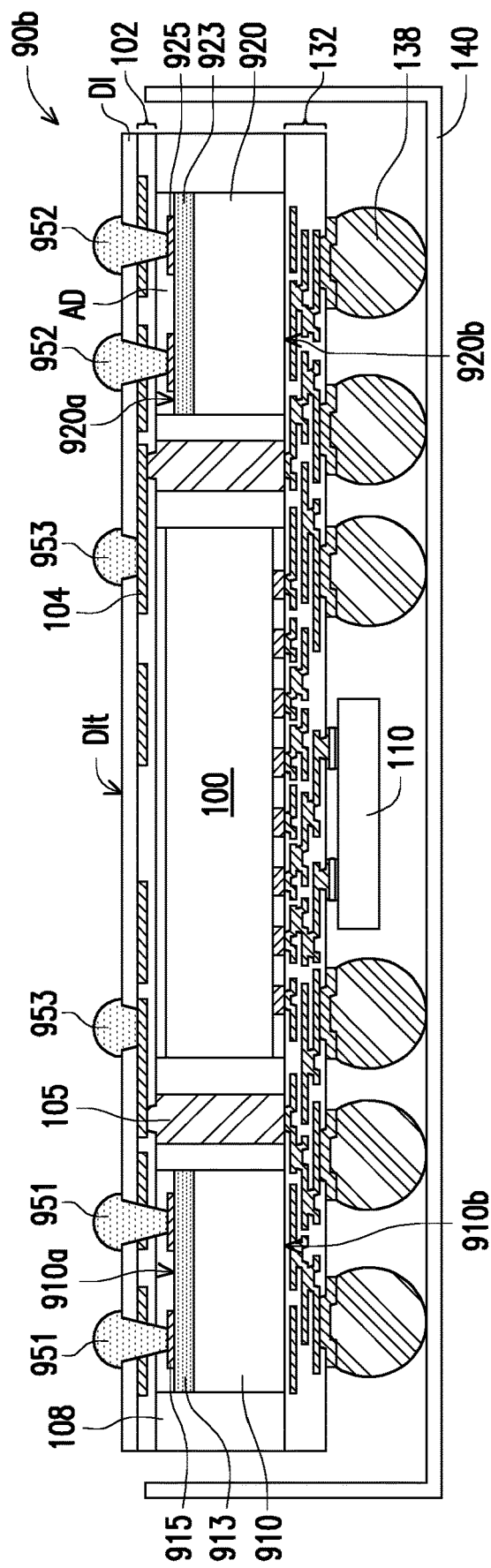

Referring to FIGS. 9G and 9H, a plurality of solders 951 are respectively formed in the openings 941 to connect to the contacts 915 of the passive device 910. A plurality of solders 952 are respectively formed in the openings 942 to connect to the contacts 925 of the passive device 920. A plurality of solders 953 are respectively formed in the openings 943 to connect to one portion of the conductive features 104 exposed by the openings 943. In some embodiments, the solders 951, 952, and 953 are formed by a solder pasting or printing process, but the disclosure is not limited thereto. In some alternative embodiments, widths of the solders 951, 952, and 953 may be the same or different. After the solders 951, 952, and 953 are formed, a package 90b is accomplished, as shown in FIG. 9H.

Figure 9I:
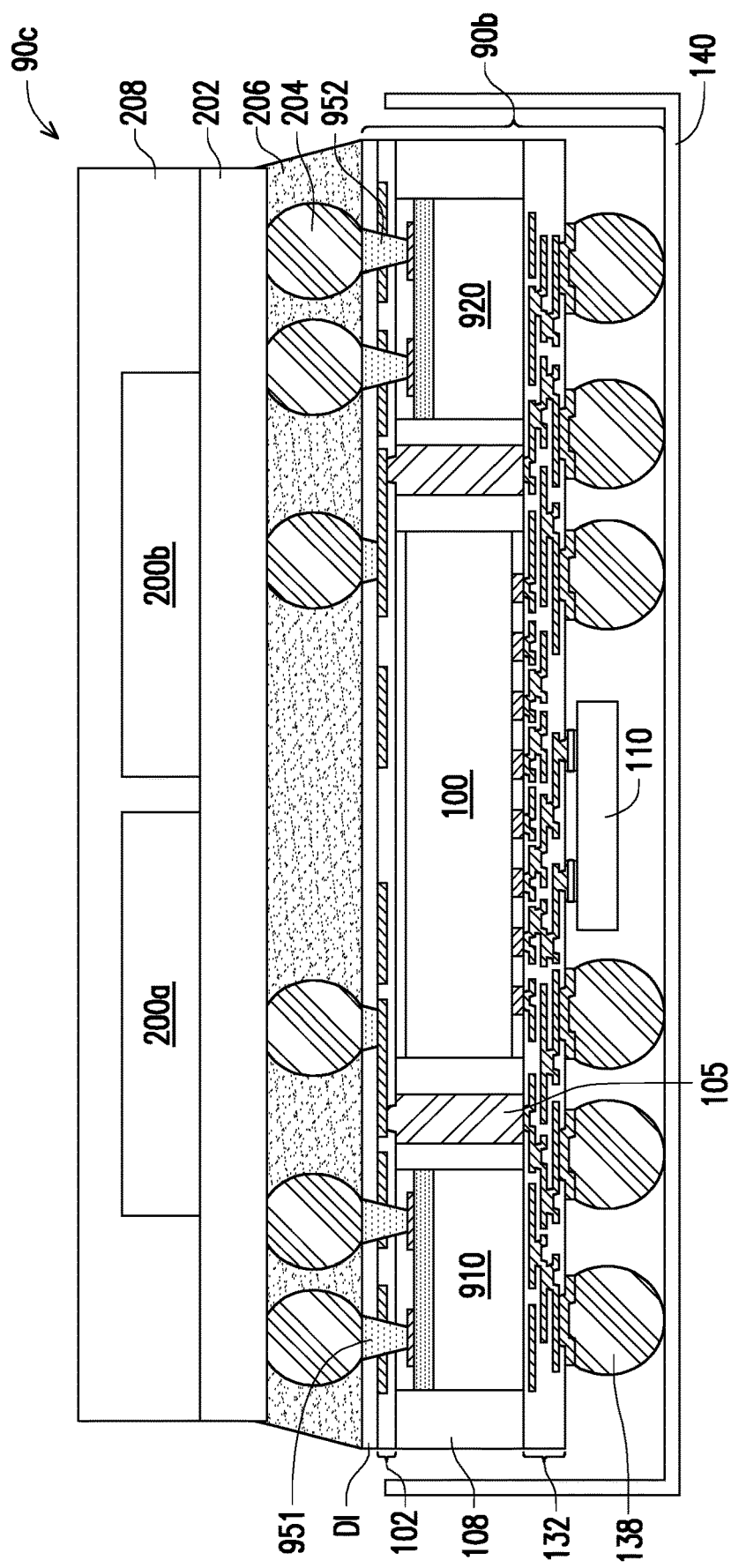

Referring to FIGS. 9H and 9I, another package (or upper package) 90c is bonded to a bottom package 90b through a plurality of conductive connectors 204 and the solders 951, 952, and 953. The arrangement and forming method of the upper package 90c are similar to the arrangement and forming method of the upper package 10c illustrated in above embodiments. Thus, details thereof are omitted here. After the upper package 90c is bonded to the bottom package 90b, an underfill layer 206 is formed to laterally encapsulate the conductive connectors 204. After the frame 140 is removed, a package structure 90 is accomplished, as shown in FIG. 9J.

Figure 9J:
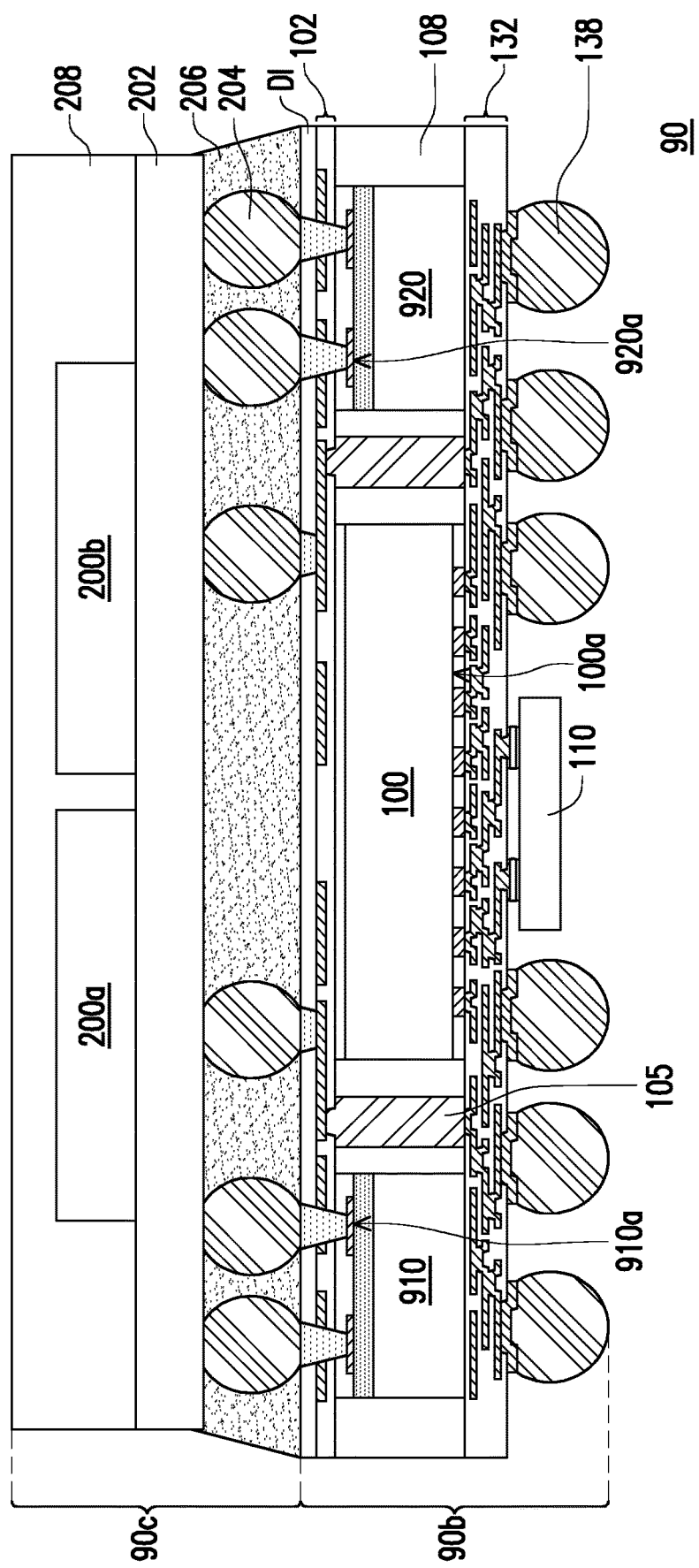

In FIG. 9J, the front side 910a of the passive device 910 and the front side 920a of the passive device 920 both face toward the upper package 90c. In the case, the equivalent series resistance (ESR) and/or the equivalent series inductance (ESL) between the upper package 90c and the passive devices 910 and 920 are decrease. As a result, the passive devices 910 and 920 are able to provide a high quality power distribution network (PDN) and a fast date rate for the high bandwidth memory, such as low power double-data-rate (LPDDR).

Figure 10:
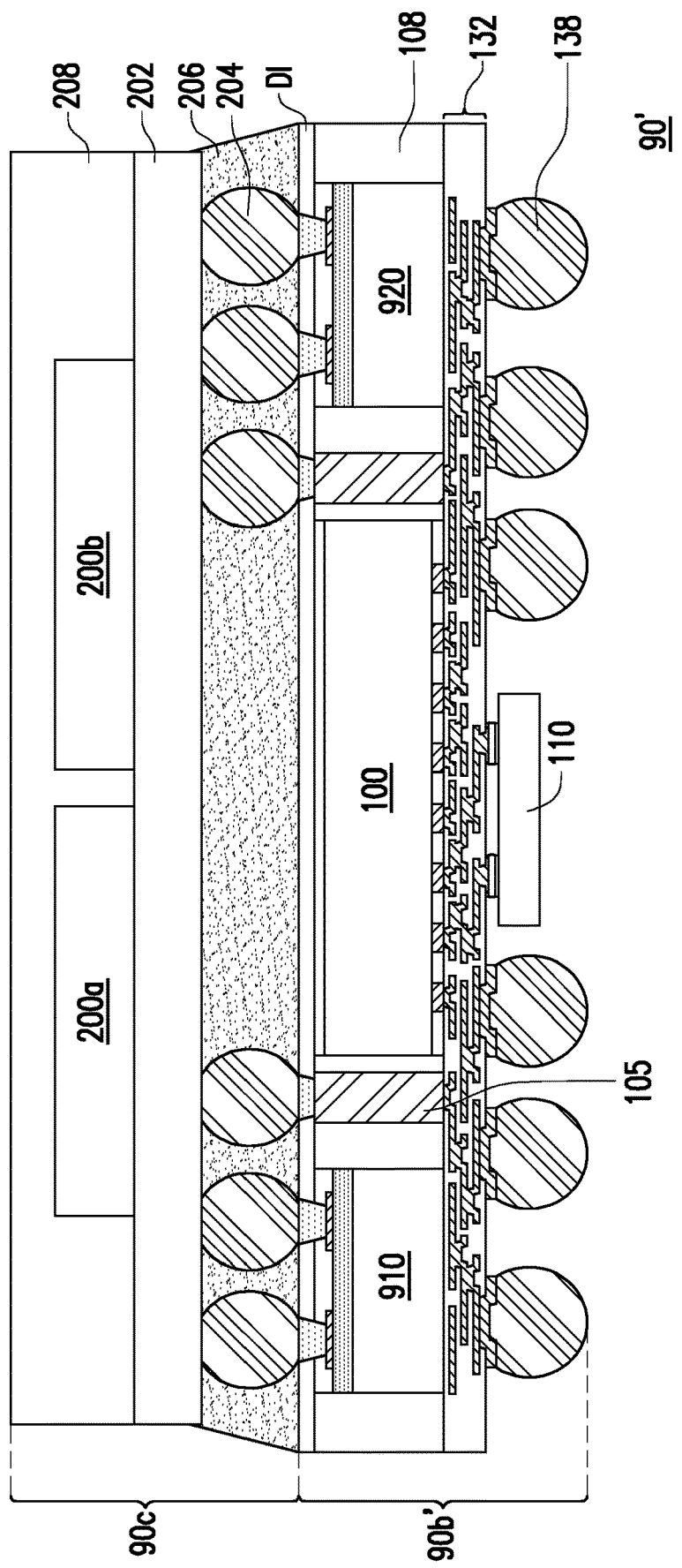
FIG. 10 is schematic cross-sectional view illustrating a package structure according to a tenth embodiment of the disclosure.

FIG. 10 is schematic cross-sectional view illustrating a package structure according to a tenth embodiment of the disclosure.

Referring to FIG. 10, a package structure 90' of the tenth embodiment is similar to the package structure 90 of the ninth embodiment. A difference therebetween lies in that the conductive connectors 204 are directly mounted on and in contact with the TIVs 105. That is, the bottom package 90b' of the tenth embodiment is free of the RDL or BSRDL structure 102. In some embodiments, there is no conductive connector directly over the die 100, as shown in FIG. 10. In some alternative embodiments, some conductive connectors (not shown) may be directly disposed over the die 100.

In accordance with an embodiment, a package structure includes: a die having a front side and a backside opposite to each other; a first passive device disposed aside the die; a plurality of through insulator vias (TIVs) disposed between the die and the first passive device; an encapsulant laterally encapsulating the plurality of TIVs, the first passive device, and the die; and a plurality of conductive connectors disposed on the backside of the die, wherein the plurality of conductive connectors are electrically connected to the die and the first passive device by a plurality of solders.

In accordance with an embodiment, a method of manufacturing a package structure includes: forming a backside RDL structure on a carrier; forming a plurality of through insulator vias (TIVs) on the backside RDL structure; placing a die and a first passive device on the backside RDL structure, so that the plurality of TIVs are disposed between the die and the first passive device; forming an encapsulant laterally encapsulating the die, the plurality of TIVs, and the first passive device; forming a front side RDL structure on a front side of the die and the encapsulant; releasing the backside RDL structure from the carrier; and mounting a package on the backside RDL structure, wherein the package is electrically connected to the first passive device by a plurality of conductive connectors and a plurality of solders.

In accordance with an embodiment, a method of manufacturing a package structure includes: forming a backside RDL structure on a backside of a die; forming a plurality of through insulator vias (TIVs) aside the die to electrically connect to the backside RDL structure; forming an encapsulant laterally encapsulating the die and the plurality of TIVs; forming a front side RDL structure on a front side of the die and the encapsulant; mounting a first passive device on the backside RDL structure; mounting a package on the backside RDL structure, wherein the package is electrically connected to the first passive device by a plurality of first conductive connectors, and electrically connected to the backside RDL structure by a plurality of second conductive connectors.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
a die having a front side and a backside opposite to each other;
a first passive device disposed aside the die;
a plurality of through insulator vias (TIVs) disposed between the die and the first passive device;
an encapsulant laterally encapsulating the plurality of TIVs, the first passive device, and the die; and
a plurality of conductive connectors disposed on the backside of the die, wherein the plurality of conductive connectors are electrically connected to the die and the first passive device by a plurality of solders.

2. The package structure of claim 1, further comprising:
a front side redistribution layer (RDL) structure disposed on the front side of the die and extending to cover the encapsulant; and
a backside redistribution layer (RDL) structure disposed on the backside of the die and extending to cover the encapsulant, wherein the plurality of conductive connectors are disposed on the backside RDL structure and in physical contact with the backside RDL structure.

3. The package structure of claim 2, wherein the plurality of solders comprise a first portion penetrating through the backside RDL structure to connect a plurality of contacts of the first passive device.

4. The package structure of claim 3, wherein the plurality of solders comprise a second portion on the backside RDL structure, the second portion is electrically connected to the die by the backside RDL structure, the plurality of TIVs, and the front side RDL structure, and the second portion has a height less than a height of the first portion.

5. The package structure of claim 2, further comprising:
a second passive device disposed on the front side RDL structure; and
a package disposed on the backside RDL structure, wherein the package is electrically connected to the first passive device by the plurality of conductive connectors and the plurality of solders, and electrically connected to the second passive device by the plurality of conductive connectors, the backside RDL structure, the plurality of TIVs, and the front side RDL structure.

6. The package structure of claim 1, wherein the front side of the die and a front side of the first passive device face toward different directions.

7. The package structure of claim 1, wherein the plurality of solders comprise:
a first portion, being physical contact with a plurality of contacts of the first passive device; and
a second portion, being physical contact with the plurality of TIVs.

8. A method of manufacturing a package structure, comprising:
forming a backside RDL structure on a carrier;
forming a plurality of through insulator vias (TIVs) on the backside RDL structure;
placing a die and a first passive device on the backside RDL structure, so that the plurality of TIVs are disposed between the die and the first passive device;
forming an encapsulant laterally encapsulating the die, the plurality of TIVs, and the first passive device;
forming a front side RDL structure on a front side of the die and the encapsulant;
releasing the backside RDL structure from the carrier; and
mounting a package on the backside RDL structure, wherein the package is electrically connected to the first passive device by a plurality of conductive connectors and a plurality of solders.

9. The method of claim 8, wherein forming the plurality of solders comprises:
forming a dielectric layer on the backside RDL structure;
forming a plurality of first openings penetrating through the dielectric layer and the backside RDL structure, wherein the plurality of first openings expose a plurality of contacts of the first passive device;
forming a plurality of second openings penetrating through the dielectric layer, wherein the plurality of second openings expose a plurality of conductive features of the backside RDL structure; and
forming a solder material in the plurality of first and second openings.

10. The method of claim 9, wherein the plurality of solders comprise:
a first portion, formed in the plurality of first openings to connect the plurality of contacts of the first passive device and the plurality of conductive connectors; and
a second portion, formed in the plurality of second openings to connect the plurality of conductive features of the backside RDL structure and the plurality of conductive connectors.

11. The method of claim 8, further comprising:
forming a second passive device on the front side RDL structure, wherein the forming the second passive device is after the placing the first passive device.

12. The method of claim 8, wherein the forming the backside RDL structure is prior to the forming the front side RDL structure.

13. The method of claim 8, wherein a front side of the die and a front side of the first passive device face toward different directions.

14. A method of manufacturing a package structure, comprising:
forming a backside RDL structure on a backside of a die;
forming a plurality of through insulator vias (TIVs) aside the die to electrically connect to the backside RDL structure;
forming an encapsulant laterally encapsulating the die and the plurality of TIVs;
forming a front side RDL structure on a front side of the die and the encapsulant;
mounting a first passive device on the backside RDL structure;
mounting a package on the backside RDL structure, wherein the package is electrically connected to the first passive device by a plurality of first conductive connectors, and electrically connected to the backside RDL structure by a plurality of second conductive connectors.

15. The method of claim 14, wherein the first passive device has a substrate and a plurality of through semiconductor vias (TSVs) penetrating through the substrate.

16. The method of claim 15, wherein the plurality of first conductive connectors are formed on the first passive device to connect the plurality of TSVs, the plurality of second conductive connectors are formed aside the plurality of first conductive connectors, and a height of the plurality of first conductive connectors is less than a height of the plurality of second conductive connectors.

17. The method of claim 14, wherein the forming the backside RDL structure is prior to the forming the front side RDL structure.

18. The method of claim 14, further comprising:
   forming a second passive device on the front side RDL structure, wherein the forming the second passive device is prior to the forming the first passive device.

19. The method of claim 14, wherein an orthographic projection of the first passive device projected on a backside of the die partially overlaps with a region of the die.

20. The method of claim 14, wherein an orthographic projection of the first passive device projected on a backside of the die is positioned out of a region of the die.

* * * * *